United States Patent [19]

Wong et al.

[11] Patent Number: 4,875,859

[45] Date of Patent: Oct. 24, 1989

[54] METHOD AND APPARATUS FOR GUIDING A USER DURING SETUP OF A SIGNAL MEASUREMENT SYSTEM

[75] Inventors: Roger W. Wong; Hugo Vifian; Michael G. Hart, all of Santa Rosa, Calif.

[73] Assignee: Hewlett-Packard Company, Palo Alto, Calif.

[21] Appl. No.: 143,775

[22] Filed: Jan. 13, 1988

[51] Int. Cl.[4] .............................................. G09B 7/00
[52] U.S. Cl. ...................................... 434/214; 434/224
[58] Field of Search ................................ 434/219, 224

[56] References Cited

U.S. PATENT DOCUMENTS 4,518,361 5/1985 Conway .............................. 434/219

Primary Examiner—Leo P. Picard
Attorney, Agent, or Firm—William C. Milks, III

[57] ABSTRACT

A signal measurement system with softkey menus for guiding a user in selecting a desired test setup, including selection and connection of the device to be tested, as well as selecting calibration measurement and test measurement for the device. In response to a given softkey selection, the signal measurement system prompts the user with a set of displayed textual instructions and pictorial diagrams via a user interface to step the user through setup, calibration, and measurement processes. Preferably, a signal processing unit (or analyzer) included in the signal measurement system incorporates the user interface in firmware to guide and aid the user in connecting the device to be tested to the signal measurement system for the desired test, and leading the user through calibration and measurement processes. The analyzer preferably displays the softkey menus, instructional text displays, and pictorial block diagram displays on a cathode ray tube included in the analyzer to guide the user. The displaying of sequential user instructions and diagrams facilitates proper configuration of connections for calibration of the signal measurement system, as well as connections for measurements of the characteristics of devices to be tested.

20 Claims, 56 Drawing Sheets

GUIDED SETUP

Press GUIDED SETUP softkey for guided measurement setup.
GUIDED SETUP is also under [SYSTEM] key.

NORMAL OPERATION

Press NORMAL OPERATION softkey or any other function key for normal instrument operation.

FIG 2A

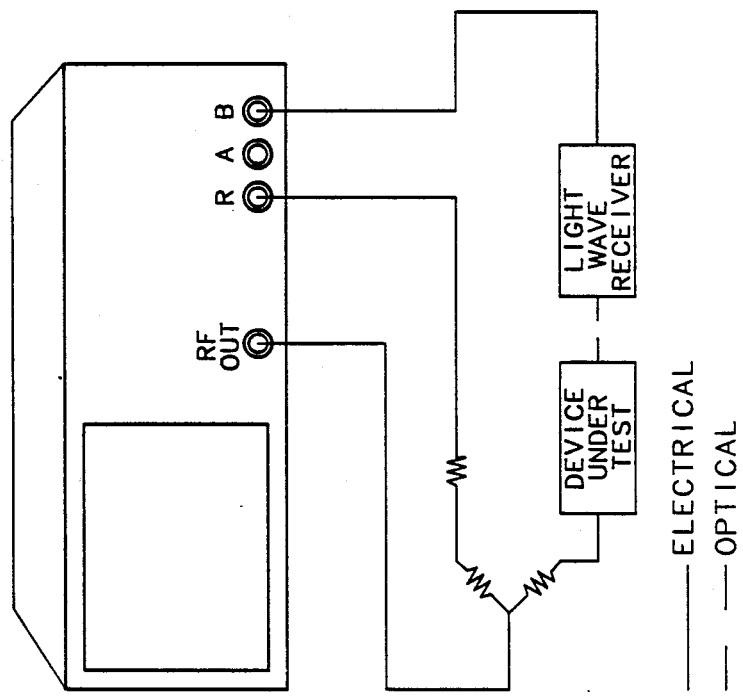

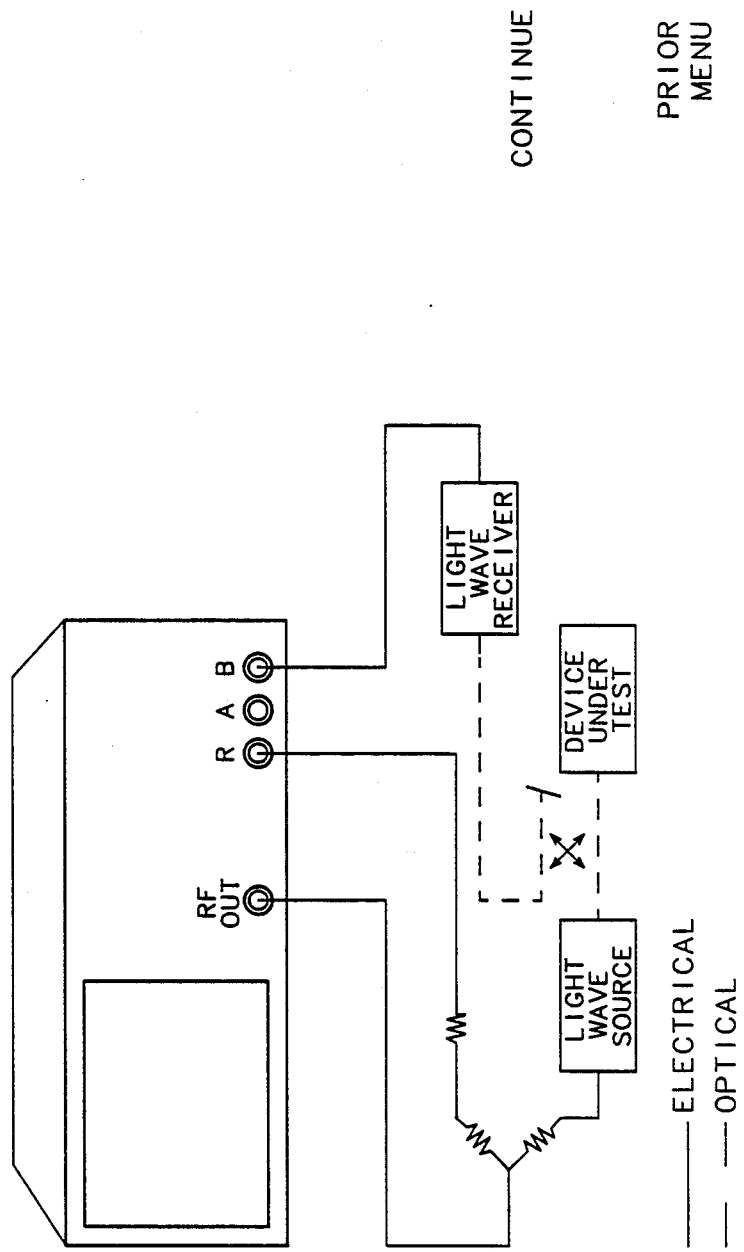

START POWER  STOP POWER  CONTINUE  PRIOR MENU

CH1 B/R log MAG 10 dB/ REF 0 dB

SET START POWER AND STOP POWER

POWER AT R, A, B INPUTS MUST BE LESS THAN 0 dBm

START -5.0 dBm  CW 1 000.000 000 MHz  STOP 0.0 dBm

SWEEP TIME
SOURCE POWER
SWEEP TYPE [LIN FREQ]
CONTINUE
PRIOR MENU

CH1 B/R log MAG 10 dB/ REF 0 dB

SET SWEEP TIME
SET RF SOURCE POWER
POWER AT R, A, B INPUTS MUST BE LESS THAN 0 dBm
SELECT SWEEP TYPE:
LINEAR OR LOGARITHMIC

START .300 000 MHz STOP 3 000.000 000 MHz

| | | | | | | | | | RECEIVER: COEFF A |
|---|---|---|---|---|---|---|---|---|---|
| CH1 B/R | log MAG | | 10 dB/ | | REF | 0 dB | | | COEFF B |
| | | | | ENTER COEFFICIENT VALUES FOR RECEIVER STANDARD | | | | | COEFF C |
| | | | | | | | | | COEFF D |
| | | | | PRESS 'MORE' TO ENTER COEFFICIENTS F,G,H,I | | | | | COEFF E |
| | | | | SAVE RECEIVER COEFFICIENTS IN STANDARD DEFINITION | | | | | MORE (F − I) |
| | | | | | | | | | |
| | | | | PRESS 'PRIOR MENU' | | | | | SAVE RCVR COEFF |
| O/E | | | | | | | | | |
| | | | | | | | | | |
| | | | | | | | | | PRIOR MENU |
| START | | .300 000 MHz | | | | | STOP 3.000.000 000 MHz | | |

FIG 2BB

| CH1 | B/R | log MAG | 10 dB/ | REF | 0 dB | | | | | | CAL STD: SRC DISC |
|---|---|---|---|---|---|---|---|---|---|---|---|
| | | | | | | | | | | | SRC COEFF |
| E/O | | | SELECT DISC OR COEFFICIENT DEFINITION OF CALIBRATED SOURCE | | | | | | | | |
| | | | | | | | | | | | LOAD SRC DISC |
| ← | | | | LOAD DISC FILE OR ENTER COEFFICIENTS | | | | | | | ENTER SRC COEFF |
| △ | | | | | PRESS 'CONTINUE' TO PERFORM CALIBRATION | | | | | | CONTINUE |
| | | | | | | | | | | | |
| | | | | | | | | | | | |
| | | | | | | | | | | | PRIOR MENU |
| START | | | .300 000 MHz | | | | | | STOP 3 000. 000 000 MHz | | |

FIG 2DD

SOURCE:
COEFF F
COEFF G
COEFF H
COEFF I

PRIOR MENU

CH1 B/R    log MAG    10 dB/    REF   0 dB

ENTER COEFFICIENT VALUES
FOR SOURCE STANDARD

PRESS 'PRIOR MENU'

E/O

START    .300 000 MHz    STOP 3 000. 000 000 MHz

FIG 2GG

| CAT KIT: 7mm |
| 3.5 mm |
| N 50Ω |
| N 75Ω |
| USER KIT |
| CONTINUE |
| PRIOR MENU |

CH1 B/R  log MAG  10 dB/  REF  0 dB

SELECT CALIBRATION KIT
PRESS 'CONTINUE' TO PERFORM CALIBRATION

START  .300 000 MHz   STOP 3 000.000 000 MHz

FIG 2HH

REFLECTOR

FRESNEL

DONE:
RESPONSE

PRIOR
MENU

CH1 B/R    log MAG    10 dB/    REF  0 dB

SELECT ONE CAL STANDARD

CONNECT CAL STANDARD
IN PLACE OF TEST DEVICE

PRESS SOFTKEY TO MEASURE
STANDARD

PRESS 'DONE' TO CONTINUE

START    .300 000 MHz    STOP 3 000. 000 000 MHz

FORMAT
SCALE REF
COPY
SAVE
GUIDED SETUP
NORMAL OPERATION
PRIOR MENU

CH1 A/R   log MAG   100 dB/   REF   0 dB

Cor
E

GUIDED SETUP COMPLETE
RECONNECT TEST DEVICE
SET DISPLAY FORMAT AND SCALE
SELECT PRINT OR PLOT COPY
SAVE INSTRUMENT STATE

START   .300 000 MHz   STOP 3 000.000 000 MHz

LOG MAG   LIN MAG   PHASE   DELAY                    PRIOR
                                                     MENU

CH1 B/R   log MAG   10 dB/   REF 0 dB

0/0

SELECT A DISPLAY FORMAT:

LOG MAGNITUDE (dB)
LINEAR MAGNITUDE
PHASE (DEGREES)
GROUP DELAY (SECONDS)

START  .300 000 MHz   STOP 3 000.000 000 MHz

FIG 2QQ

DISPLAY MEASUREMENT CONFIGURATION

METHOD AND APPARATUS FOR GUIDING A USER DURING SETUP OF A SIGNAL MEASUREMENT SYSTEM

BACKGROUND OF THE INVENTION

This invention relates to electronic test instruments and, more particularly, to electronic instrumentation for signal measurement. Specifically, the invention is directed to aiding a user to set up electronic test instruments for performing various signal measurements.

An exemplary use of the invention is i the field of optical and electrical measurements in connection with fiber optic systems. With higher bit rates and wider-band modulations becoming prevalent in fiber optic systems, the designers and manufacturers of these systems and associated components need to be able to characterize performance more thoroughly and more precisely than ha been the case with lower transmission bandwidths. Many new fiber optic systems now operate at speeds of 500 MBPS and higher, which are equivalent to RF and low microwave frequencies. In addition, even though optical fiber cable is correctly classified as a low-loss medium, a fiber optic system can, in fact, have significant losses that must be identified if they are to be minimized. Accordingly, the measurements performed to characterize such a system have proliferated.

Various lightwave component test systems have been developed to meet these measurement needs. However, the complexities of configuring, calibrating, and operating these test systems for performing the desired test measurements have dramatically escalated. This has required periodic retraining of personnel, increased test setup time, and resulted in errors due to improper test setup, calibration, and/or operation by the user.

SUMMARY OF THE INVENTION

One embodiment of the present invention provides a method and apparatus for guiding a user during setup of a signal measurement system, such as a lightwave component measurement system for characterizing performance of fiber optic systems and associated components. System guidance of the user in accordance with the invention facilitates measuring the modulation response of elements used in conjunction with fiber optic systems. These include not only the optical and electrical components, but also electro-optical (E/O) and opto-electrical (O/E) converters; i.e., the transmitters and receivers.

The preferred embodiment of the invention provides a user of the signal measurement system with softkey menus for selecting a desired test setup, including measurement selection and connection of the device to be tested, as well as selecting calibration measurement and test measurement for the device. In response to a given softkey selection, the signal measurement system prompts the user with a set of displayed textual instructions and pictorial diagrams via a user interface to step the user through setup, calibration, and measurement processes. Preferably, a signal processing unit (or analyzer) included in the signal measurement system incorporates the user interface in firmware to guide and aid the user in connecting the device to be tested to the signal measurement system for the desired test, and leading the user through calibration and measurement processes. The analyzer preferably displays the softkey menus, instructional text displays, and pictorial block diagram displays to guide the user on a cathode ray tube included in the analyzer. The displaying of sequential user instructions and diagrams facilitates proper configuration of connections for calibration of the signal measurement system, as well as connections for measurements of the characteristics of devices to be tested.

BRIEF DESCRIPTION OF THE DRAWINGS

The above and other features of the invention and the concomitant advantages will be better understood and appreciated by persons skilled in the field to which the invention pertains in view of the following description given in conjunction with the accompanying drawings. In the drawings.

DETAILED DESCRIPTION OF THE PREFERRED EMBODIMENTS

Figure 1:
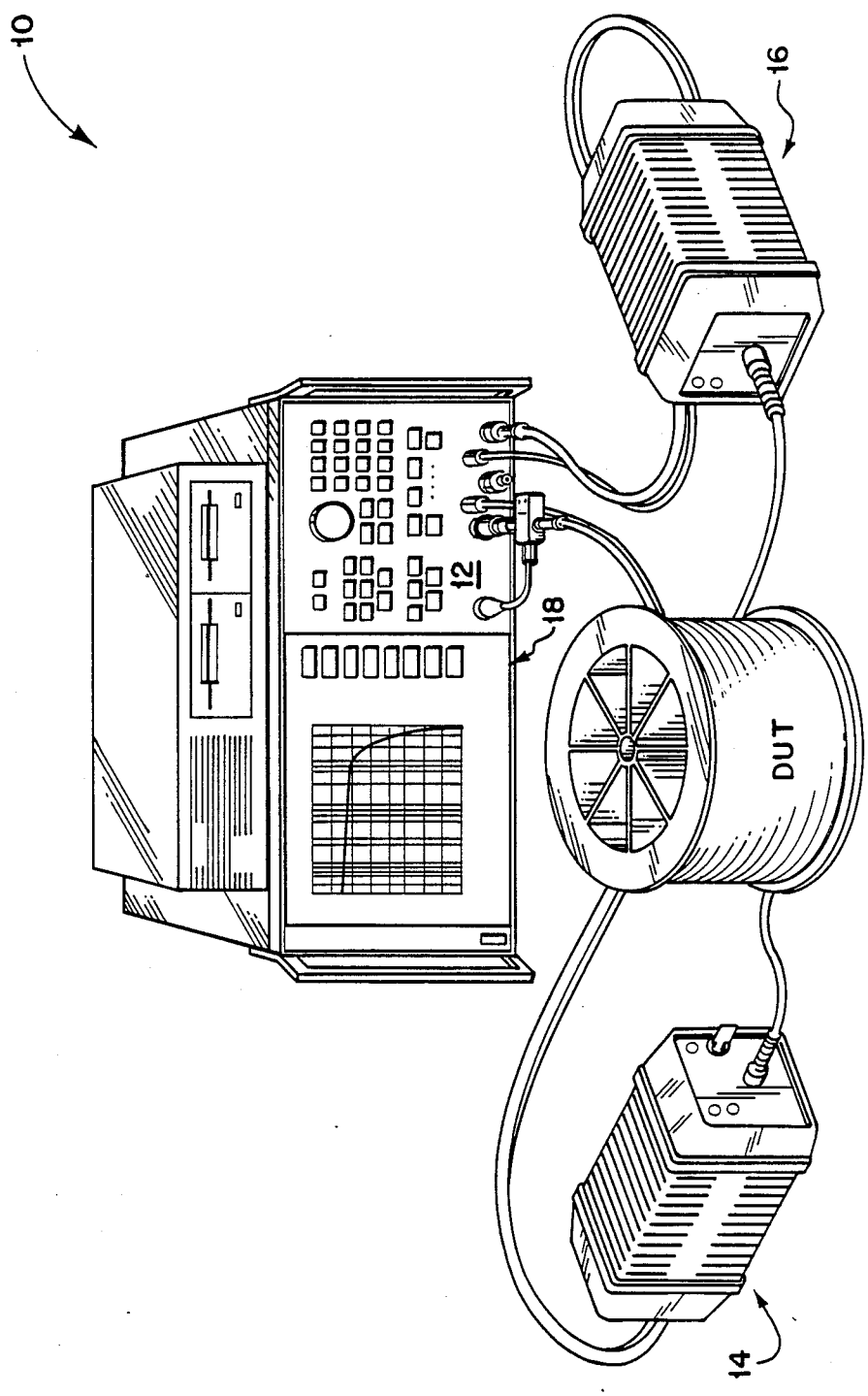
FIG. 1 is a block diagram of a signal measurement system incorporating guidance of the user in accordance with one embodiment of the invention.

FIG. 1 shows an exemplary signal measurement system in the form of a lightwave component measurement system, generally indicated by the numeral 10. Its principal elements are a lightwave component analyzer 12, a lightwave source 14, and a lightwave receiver 16. All of the elements of the lightwave component measurement system 10, including the lightwave source 14 and the receiver 16, are extensively characterized to achieve high levels of precision in lightwave measurements. FIG. 1 also shows a device under test (DUT), for example, a spool of optical fiber cable, connected to the lightwave component measurement system 10.

The lightwave component analyzer 12 preferably comprises essentially a 3 GHz vector network analyzer, for example, an HP 8753 vector network analyzer available from Hewlett-Packard Company, Network Measurements Division, Santa Rosa, Calif., specifically tailored for lightwave measurements. It provides 300 kHz to 3 GHz test signals used to modulate either a single-mode or multi-mode lightwave source 14 preferably operating at 1300 nm.

The electro-optical characteristics of the lightwave source 14 and the lightwave receiver 16 in a test setup have to be sensitive, stable, and repeatable. Also, their modulation bandwidths need to be wider than that of the DUT.

The lightwave source 14 provides a modulation signal source which preferably generates a high-stability, 1 Hz-resolution synthesized signal that can be swept from 300 kHz to 3 GHz. The intensity-modulated light signal from the lightwave source 14 is then applied to the DUT.

The lightwave receiver 16 demodulates the modulated light signal for processing in the lightwave component analyzer 12. The transmission and reflection characteristics of the DUT are then displayed, preferably on a cathode ray tube (CRT) 18 included in the lightwave component analyzer 12, either as a function of the RF modulation frequency or as a function of RF power or distance.

The lightwave receiver 16 is a high-stability, high-resolution precision receiver with 100 dB dynamic range which allows measurements over a wide dynamic range and enables the lightwave component measurement system 10 to operate with an optical sensitivity of −40 dBm. The lightwave receiver 16 operates with both singe-mode and multi-mode optical fiber cables. Its optical detector is preferably a PIN photodiode. The lightwave receiver 16 has a modulation bandwidth that preferably extends to 3 GHz, with ±4 dB flatness to 2 GHz, rolling off to −14 dB at 3 GHz. Minimum detectable optical signal (for modulations up to 2 GHz) is −40 dBm, and the typical optical dynamic range exceeds 40 dB. The 3 GHz modulation bandwidths of the lightwave source 14 and the lightwave receiver 16 provide ample margin for typical tests.

The lightwave component measurement system 10 is operable to perform various measurements. Although the present invention is not directed to these measurements per se, a general understanding of various types of measurements that can be performed will aid an understanding of the operation of guiding the user in accordance with the invention.

Typical optical components are optical fiber cable, modulators, and passive devices, such as switches, splitters, combiners, and attenuators. The input and output signals for testing these devices are light, and the key parameters measured are attenuation versus modulation frequency, modulation bandwidth, delay, modal pulse dispersion, electrical length, and location of discontinuities. For optical components (such as optical fiber cables, couplers, and connectors), the lightwave component measurement system 10 can measure such parameters as optical insertion loss, optical reflections, modulation bandwidth, pulse dispersion, and fiber length. In addition, multiple reflections can be resolved in time and distance with very high resolution.

The modulation transfer characteristics of electro-optical transmitters (E/O) and opto-electrical receivers (O/E) can also be measured. For example, the responsivity of a PIN diode or laser diode can be measured, not only at one modulation frequency, but also as a function of modulation frequency from 300 kHz to 3 GHz. Additionally, modulated input power can be swept up to 25 dB to characterize the sensitivity or compression point of a source or receiver or determine it's optimum operating condition.

Representative E/O devices are optical modulators and sources (such as laser diodes and LEDs). Examples of O/E devices are PIN or avalanche photodiode detectors in optical receivers. The key parameters for these devices are the same for both types, except that the independent and dependent variables are reversed; e.g., for E/O devices, optical power out is measured as a function of electrical (RF) drive, whereas RF power out as a function of optical drive is measured for 0/E devices. When the lightwave component measurement system 10 is used to characterize an E/O or O/E device, the initial calibration reference is established because both the lightwave source 14 and the lightwave receiver 16 are known. The DUT then is measured when it replaces its calibrated counterpart in the measurement setup. Typical measurements for these devices are sensitivity (including the compression point and the noise threshold/floor), as well as responsivity versus power or modulating frequency.

The RF (or electrical) elements of the fiber optic system under test can also be characterized using the lightwave component measurement system 10. Examples of RF devices are amplifiers, filters, and cables used in a fiber optic system. The RF measurements include bandwidth, insertion loss/gain, phase, group delay, and complex impedance.

Electrical measurements can be performed on such RF components as amplifiers, filters, and optical fiber cables, or a complete fiber optic repeater (comprising an optical transmitter, optical fiber cable, and optical receiver). Typical measurements include loss/gain versus modulation frequency or power level, modulation bandwidth, modulation phase shift or phase delay, distortion (e.g., group delay or deviation from linear phase), complex impedance (magnitude and phase), and electrical length (including discontinuity location).

In accordance with the invention, the lightwave component measurement system 10 incorporates guidance of the user to provide operating ease. Firmware resident in memory in the lightwave component measurement system 10 generates displays to provide for guided measurement setups which allow even first-time users to configure the lightwave component measurement system for various types of tests. Displayed textual instructions and graphics lead the user through such measurements as transmission versus frequency, reflection versus frequency, and transmission versus power. There also are menus for formatting, scaling, and plotting measurements.

In accordance with the invention, the signal processing unit (or lightwave component analyzer 12) included in the lightwave component measurement system 10 incorporates in firmware a set of encoded softkey menus, instructional text displays, and pictorial block diagram displays which guide and aid the user while connecting the DUT for a desired test, as well as during the calibration and measurement processes. Code for generating user selections, instructions, and diagrams is embedded as a portion of the instrument mainframe firmware. Hence, the invention provides a user interface where text and graphics are combined and programmed into the firmware of the lightwave component analyzer 12 to allow the user greater ease in setting up and executing the calibration and measurement processes associated with the test protocol.

Considered in more detail, the lightwave component analyzer 12 has programmed into it read only memory (ROM) firmware a combination of text and graphics which are displayed to make the lightwave component measurement system 10 easy to operate and use. The text and graphics show the user how to set up the lightwave component measurement system 10 states and basic measurements easily and quickly. This feature is hereafter referred to as "guided setup."

Guided setup is an instrument user interface feature to assist a user in quickly and easily connecting the DUT for a desired test and making a calibration or measurement. Guided setup is implemented as a series of softkey menus, textual displays, and pictorial displays which guide the user in configuring the lightwave component measurement system 10 and setting basic instrument parameters in order to perform a specified test measurement.

The user is guided through the guided setup procedure by depressing softkeys. A set of softkey labels (softkey menu) is presented on the display of the lightwave component analyzer 12 by the firmware for each step in the guided setup series. Instructions for each menu are also preferably presented on the display of the lightwave component analyzer 12. Once a measurement is performed, the user is also preferably presented with choices for formatting and displaying the measurement, as well as storing the instrument state resulting from the guided setup.

FIG. 2 illustrates various screens that are presented to the user in accordance with the invention. Also shown in FIG. 2 is the flow of the user interface which enhances the ease of use of the lightwave component measurement system 10. FIG. 2 actually depicts various guided measurement CRT displays generated by the lightwave component analyzer 12.

Figure 2B:
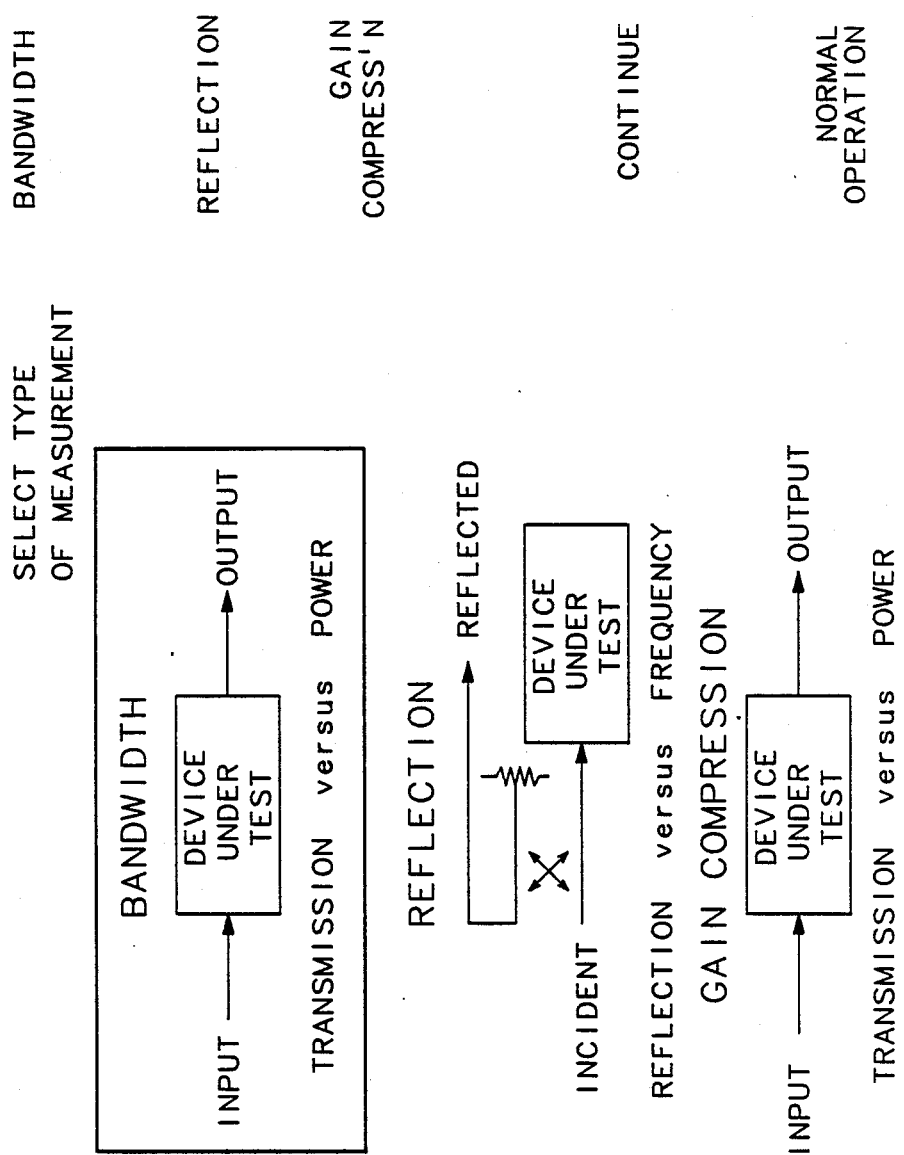
FIG. 2, comprising FIGS. 2A-2TT, illustrates displays provided by the signal measurement system shown in FIG. 1 for guiding the user through the steps for setup of the signal measurement system, including aiding the user in calibration and measurement processes.
Figure 2C:
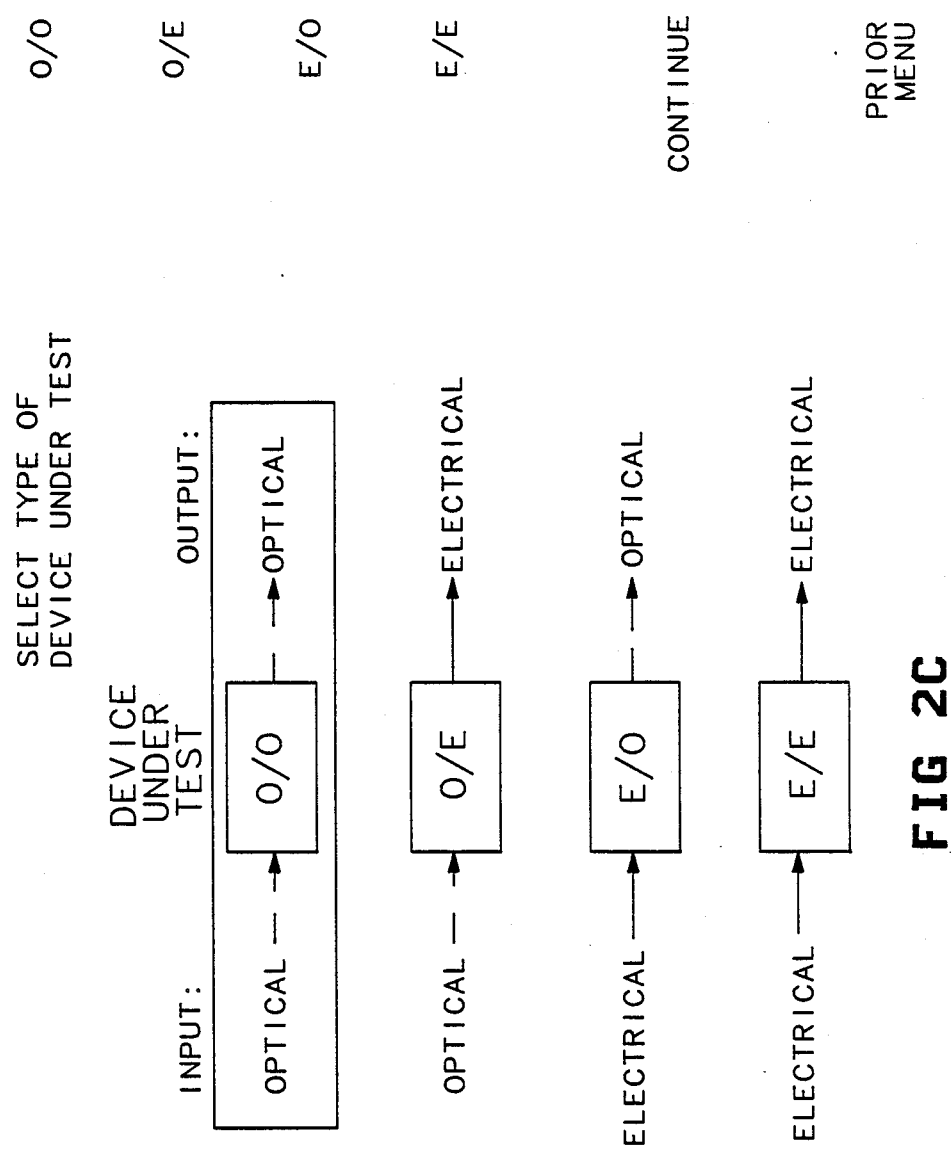
Figure 2D:
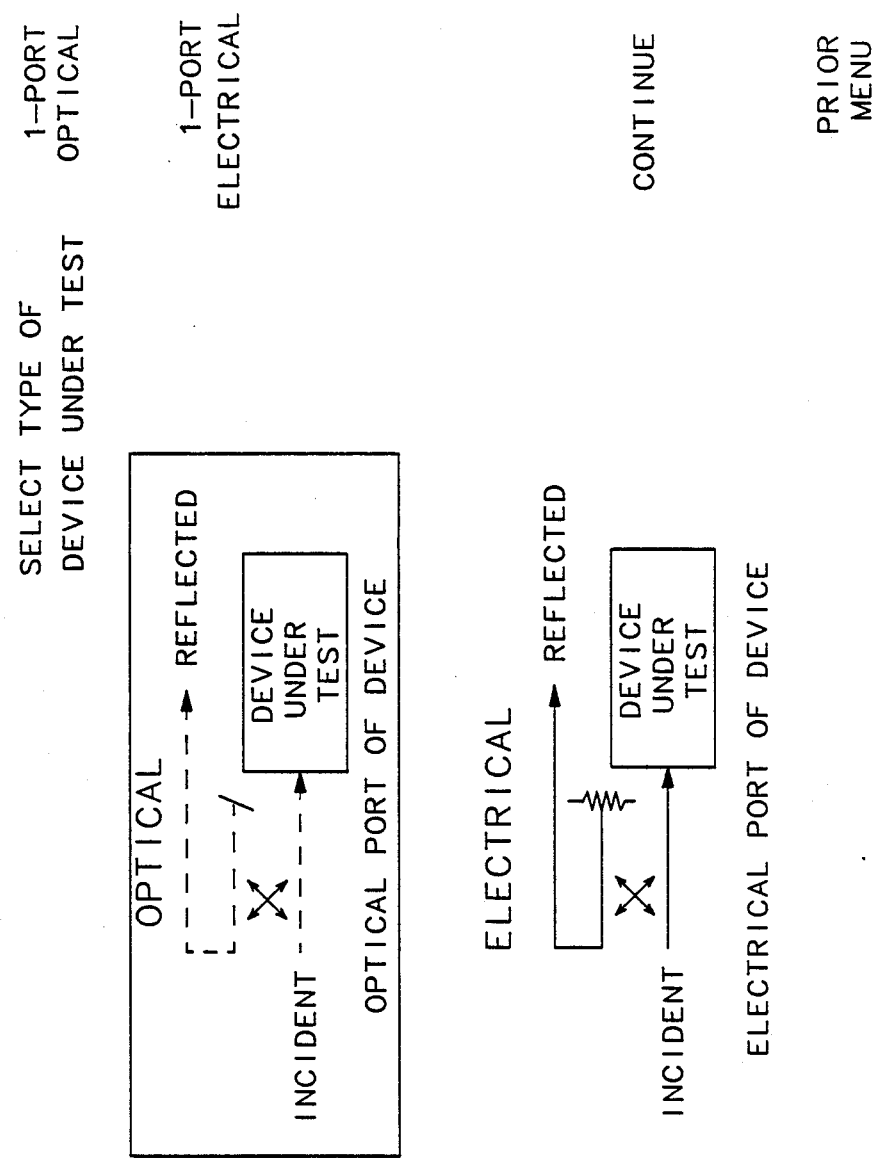
Figure 2E:
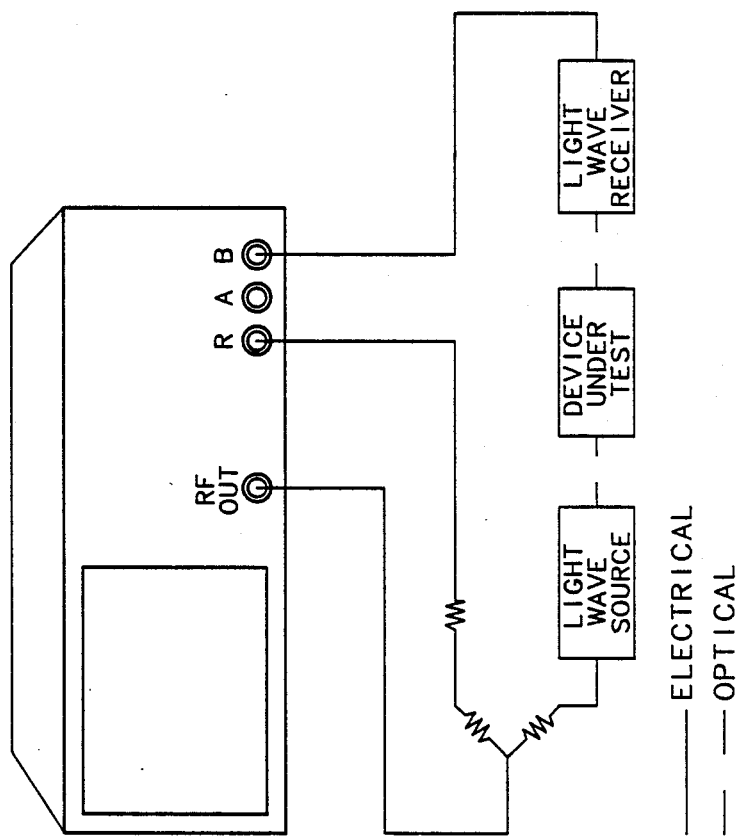
Figure 2F:
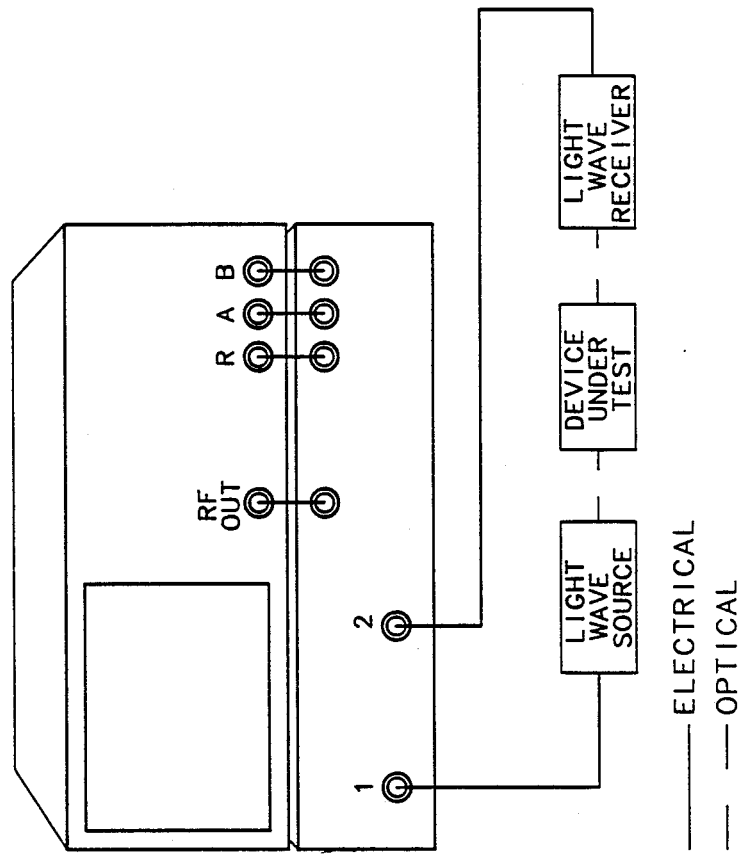
Figure 2G:
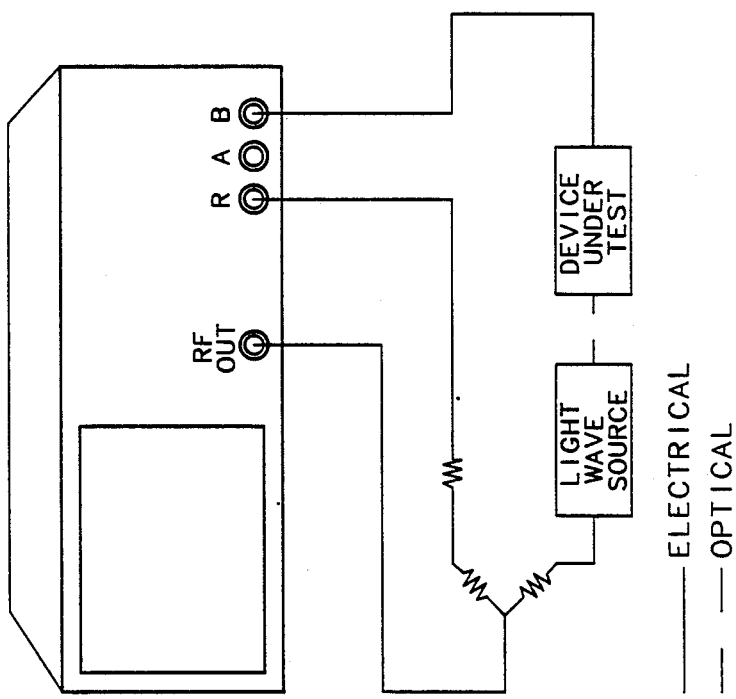
Figure 2H:
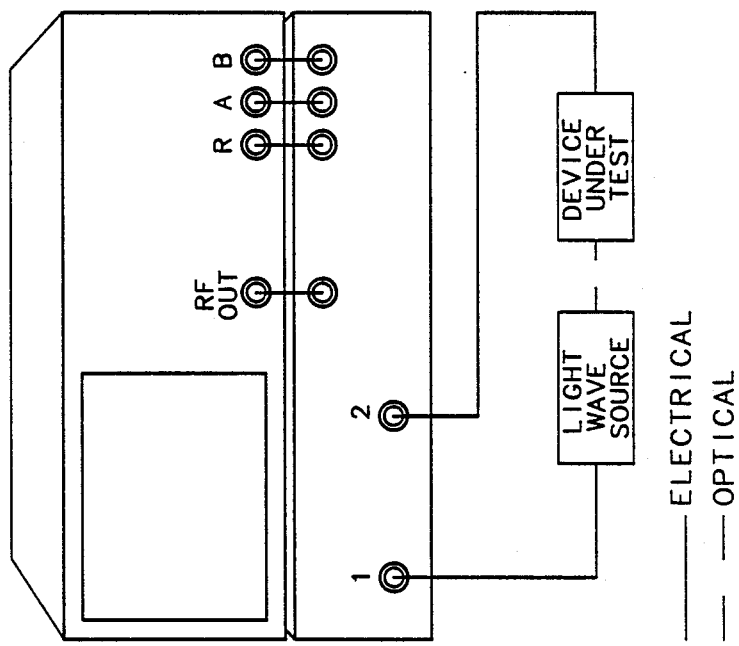
Figure 2J:
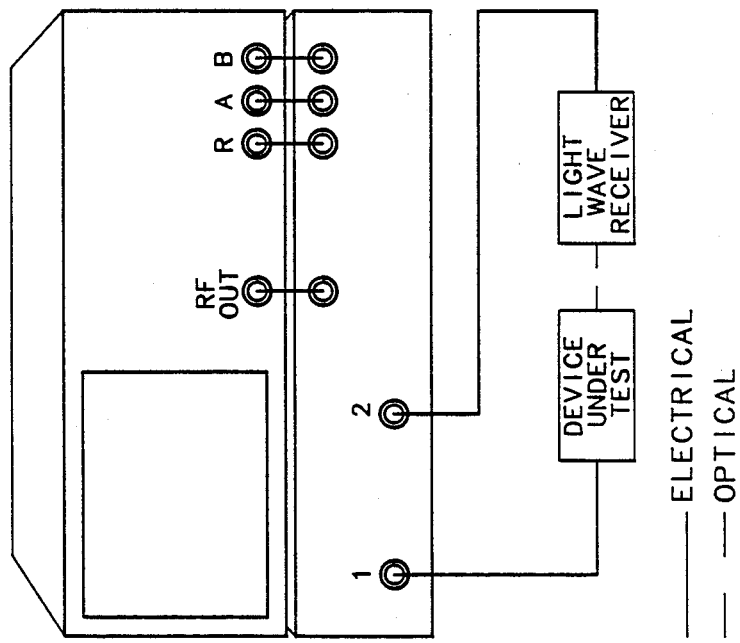
Figure 2K:
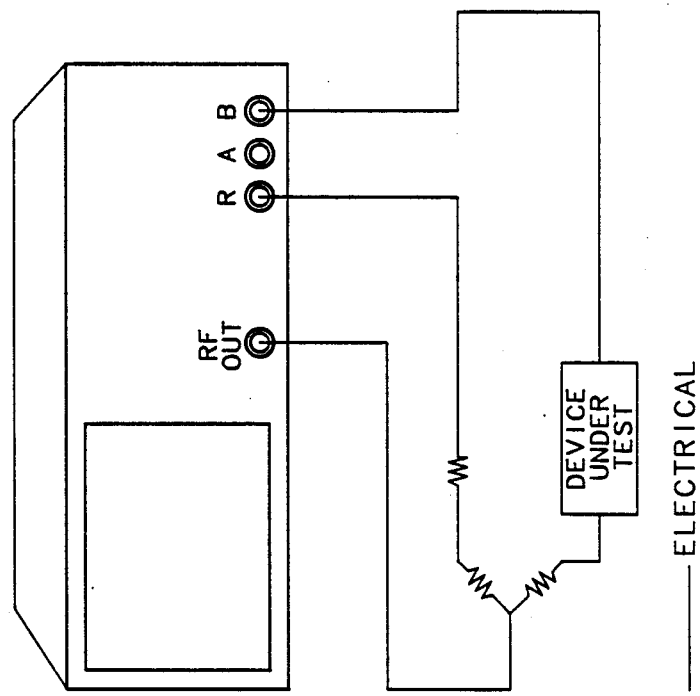
Figure 2L:
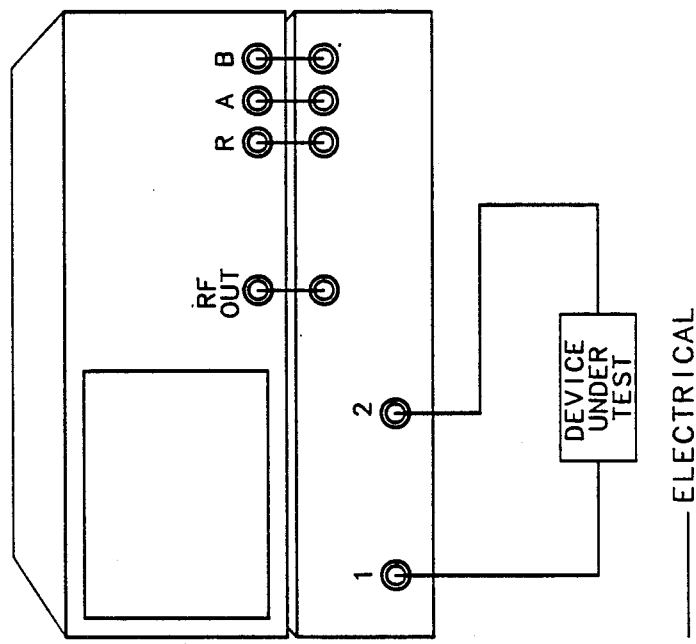
Figure 2N:
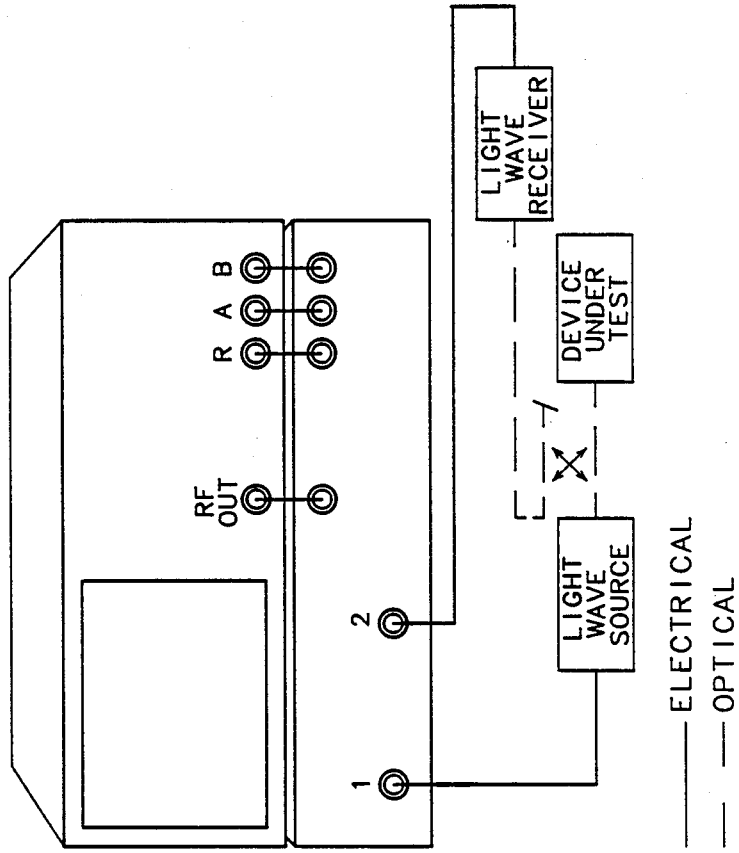
Figure 20:
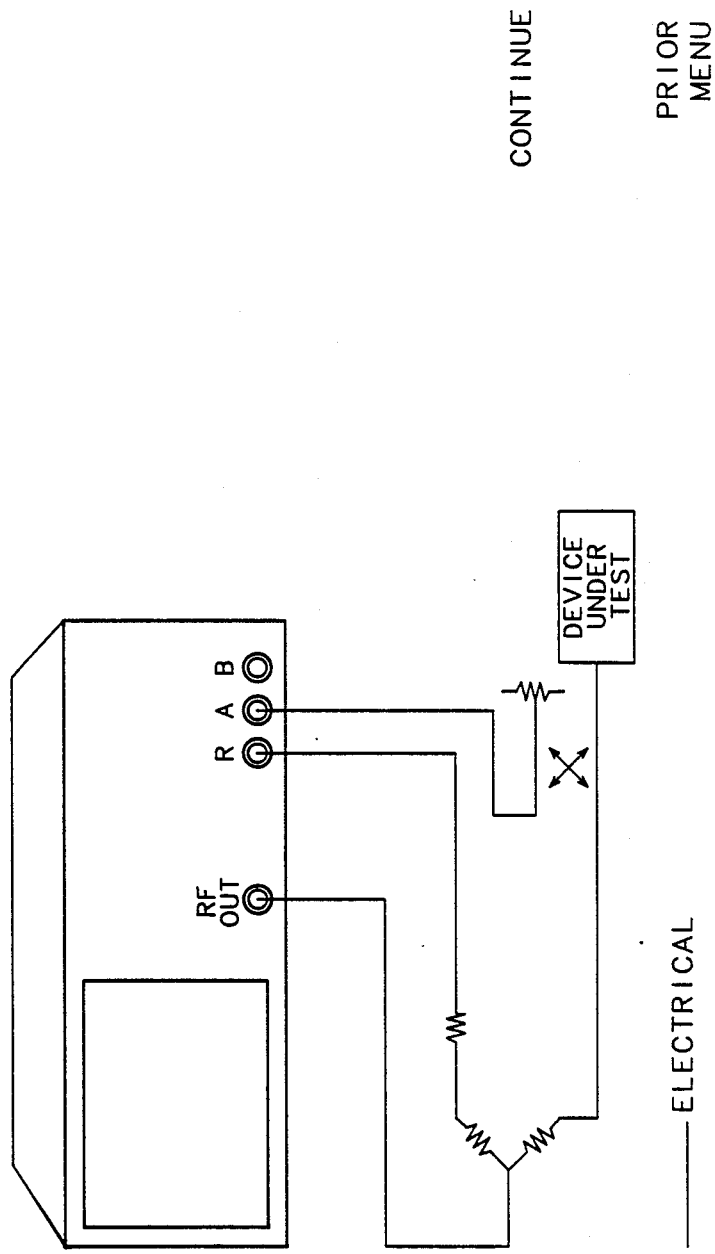
Figure 2P:
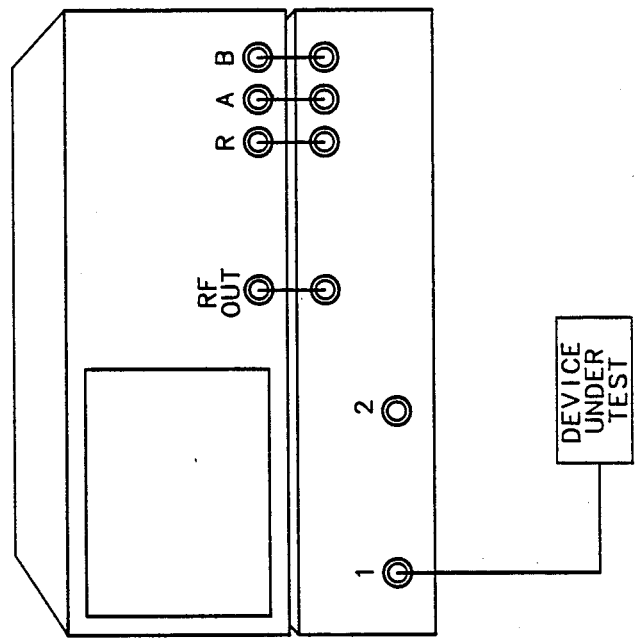
Figure 20:
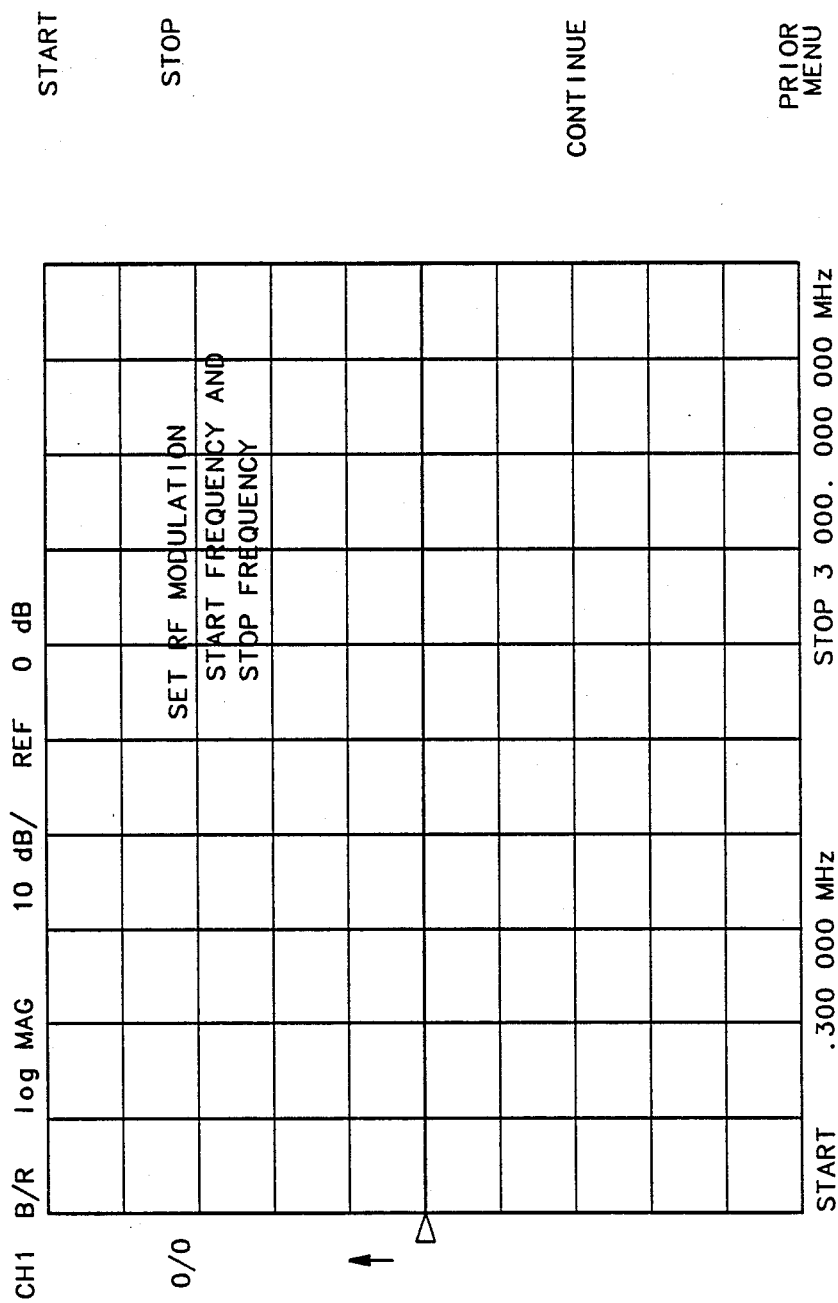
Figure 2R:
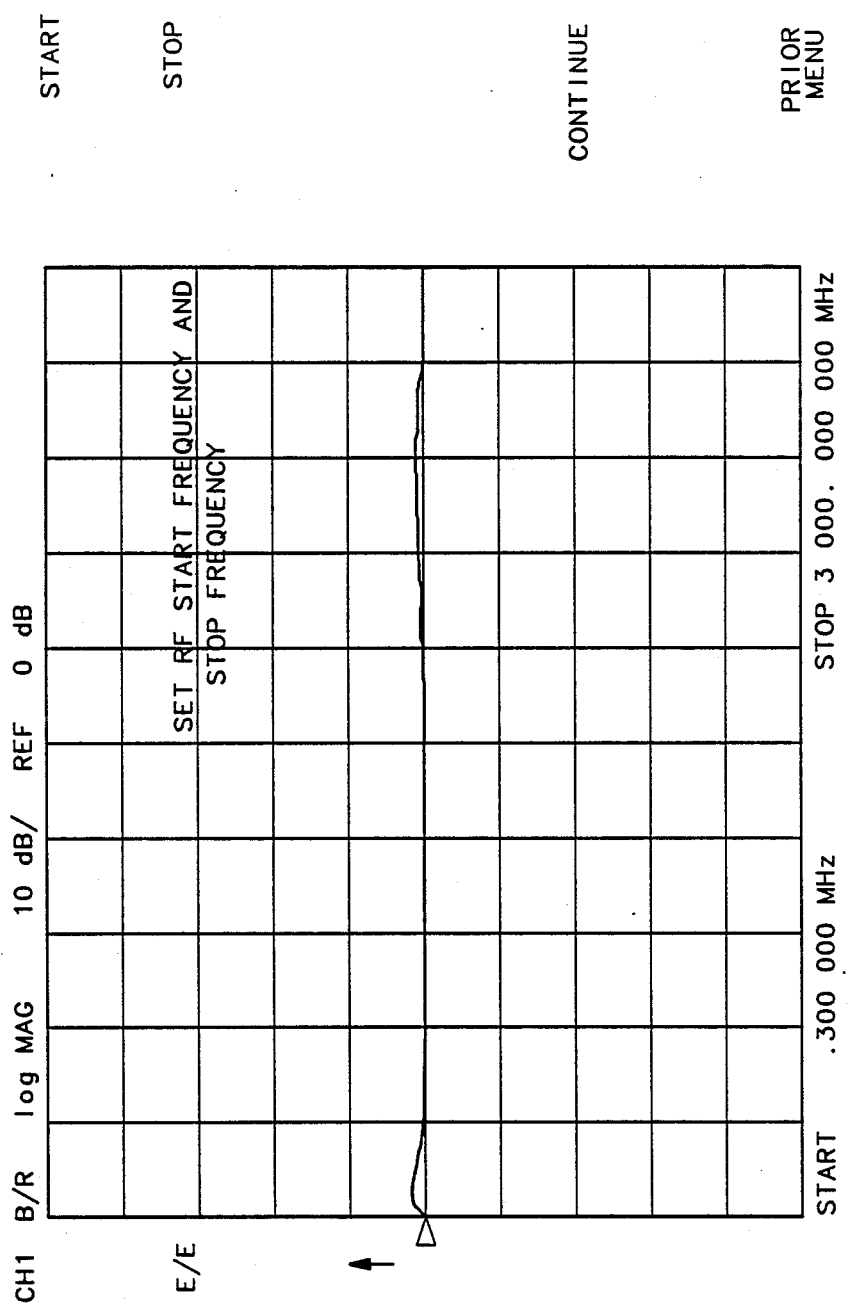
Figure 2U:
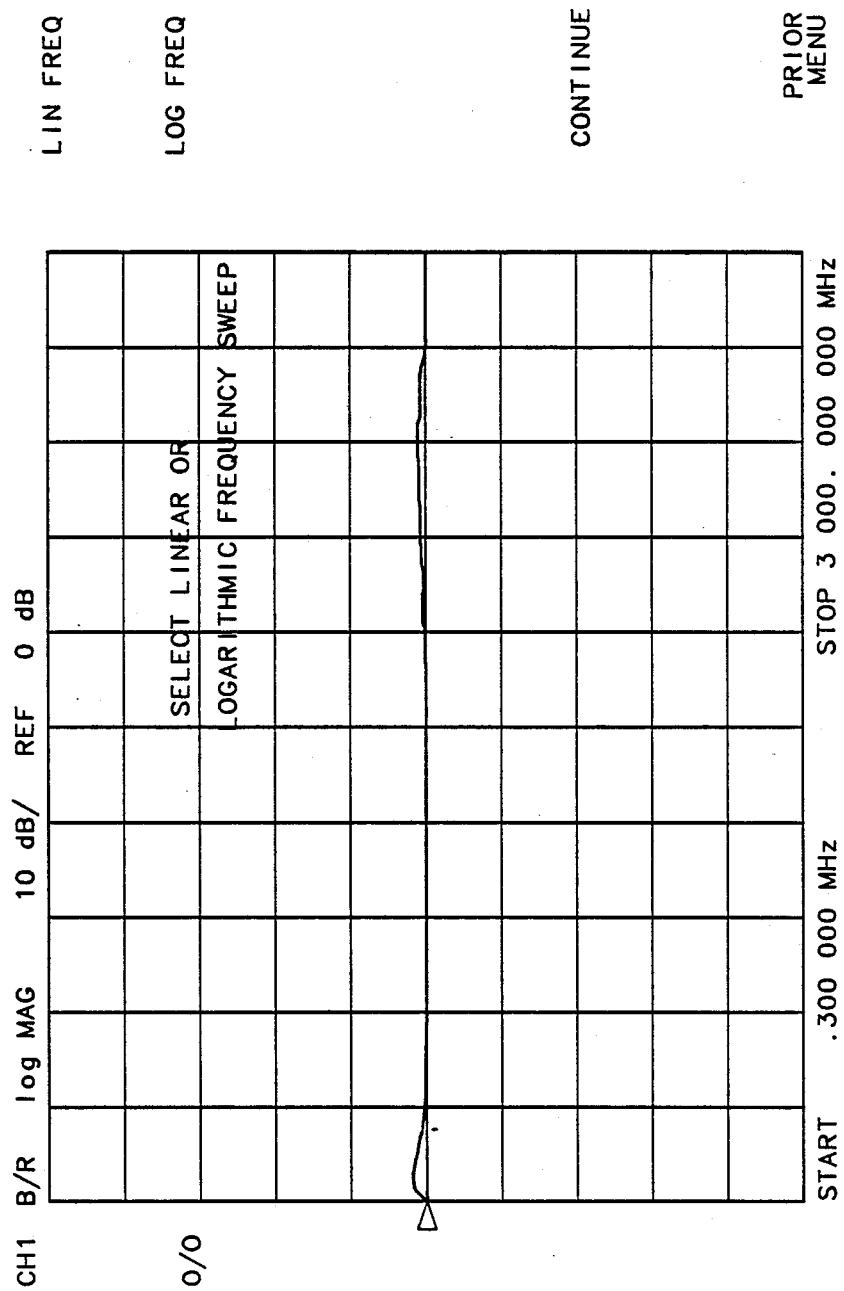
Figure 2V:
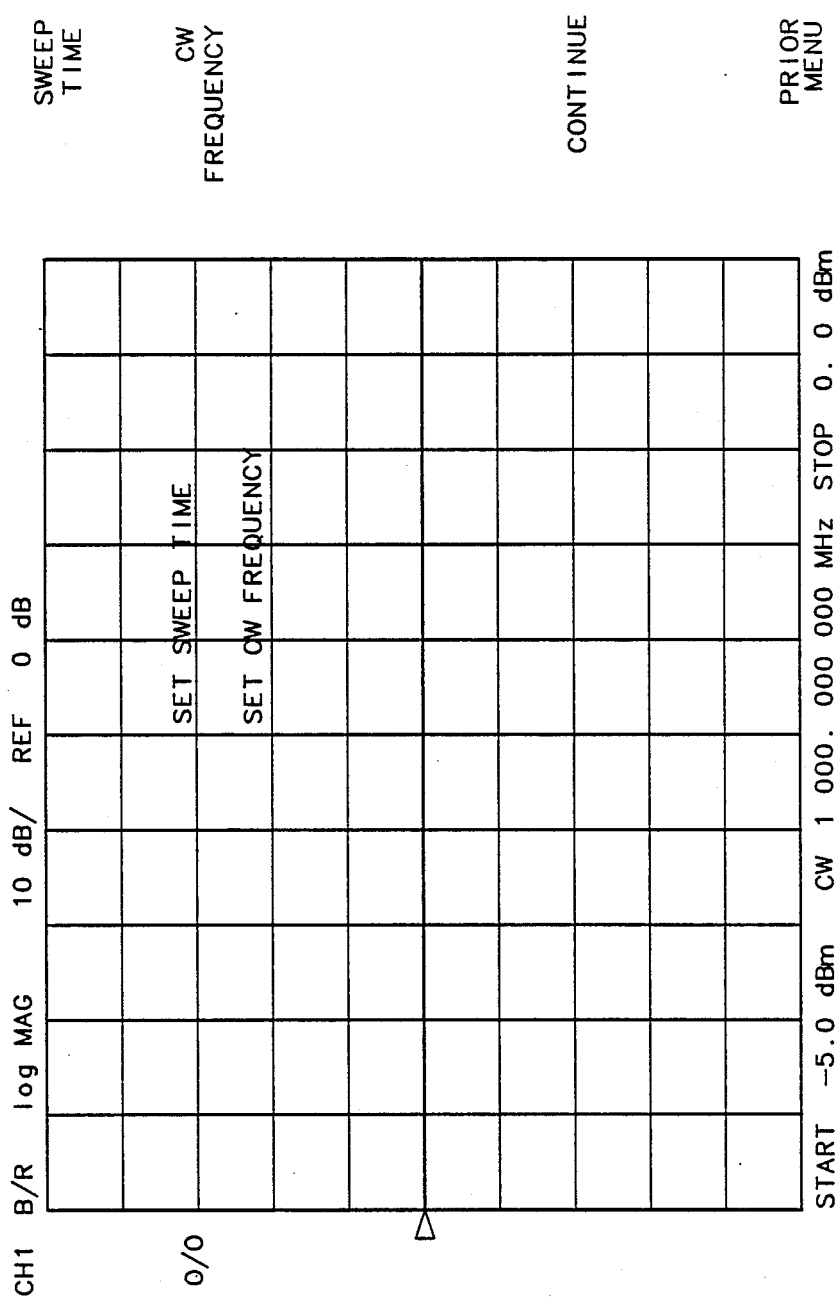
Figure 2W:
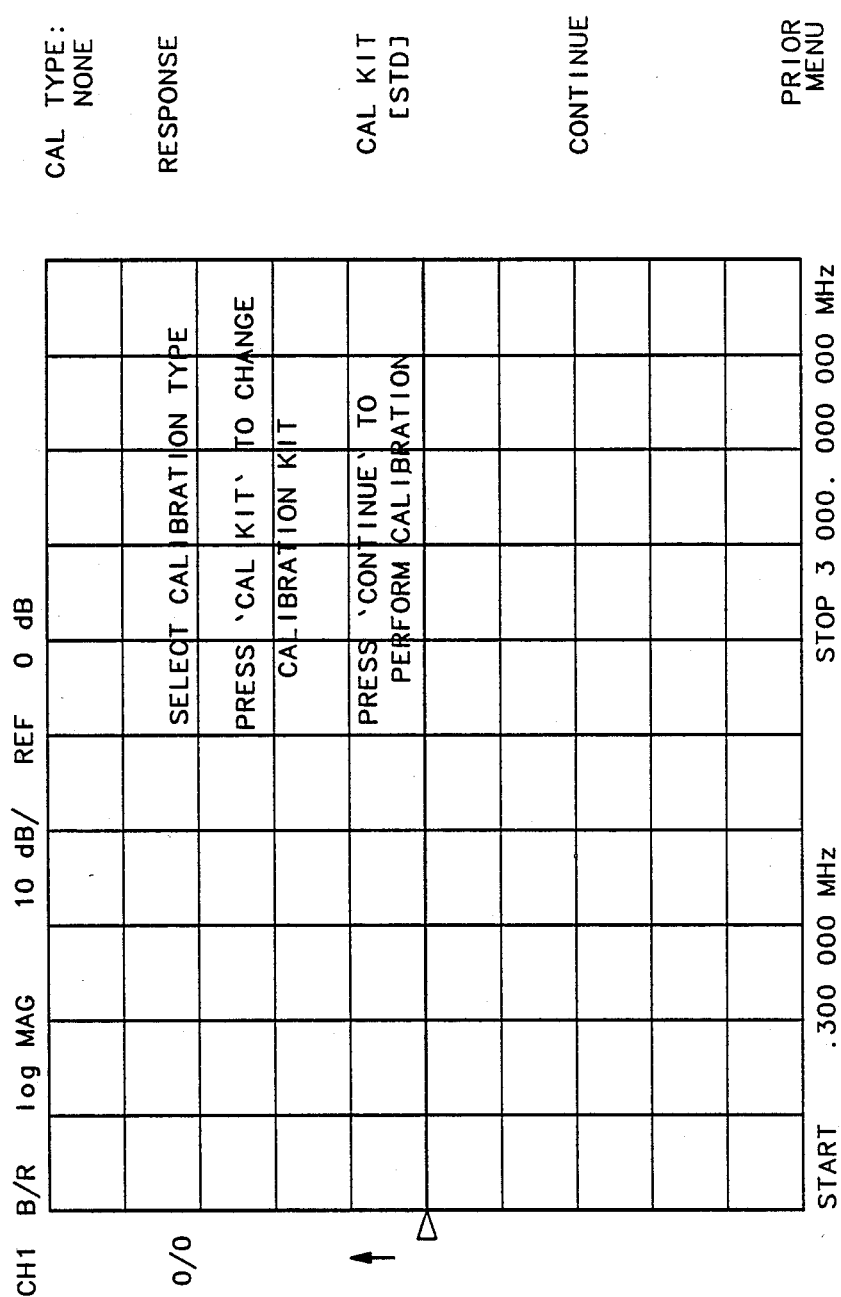
Figure 2X:
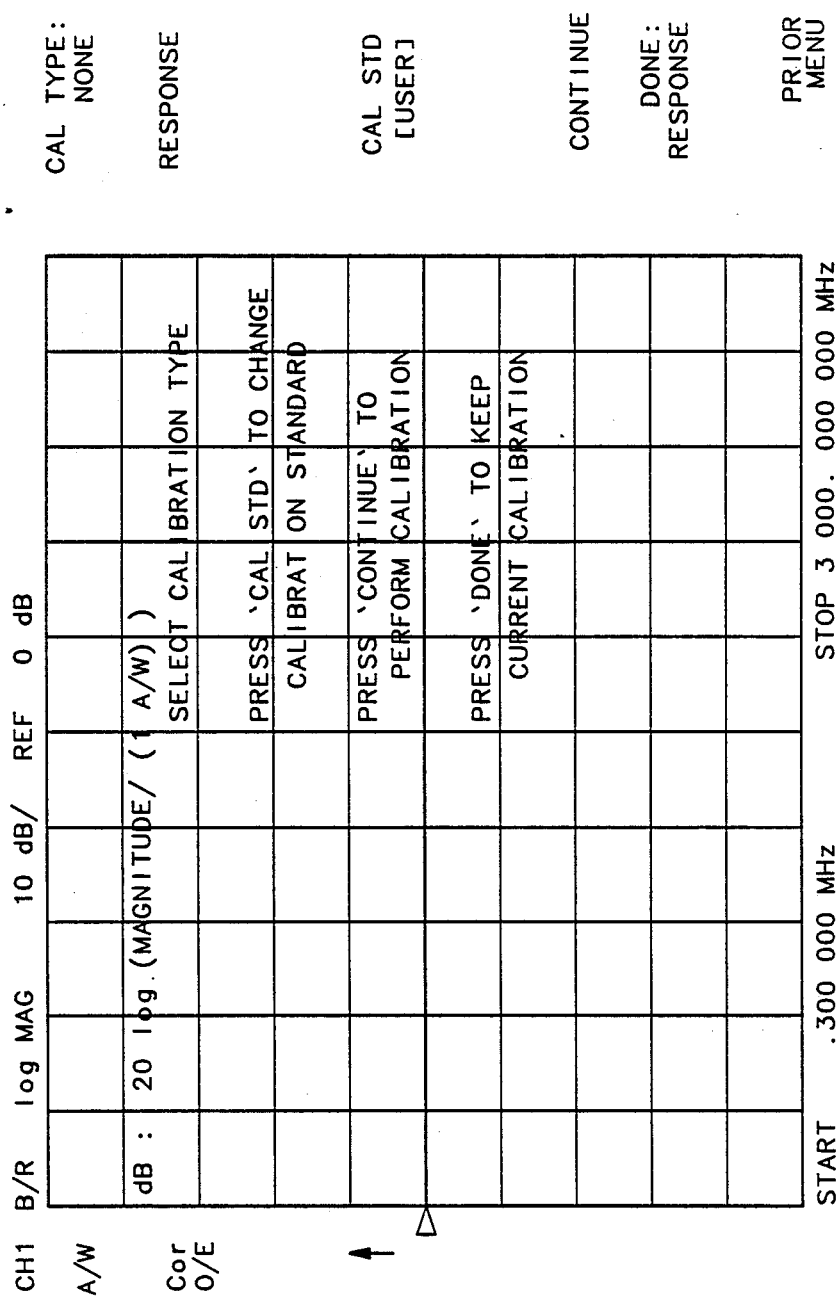
Figure 2Y:
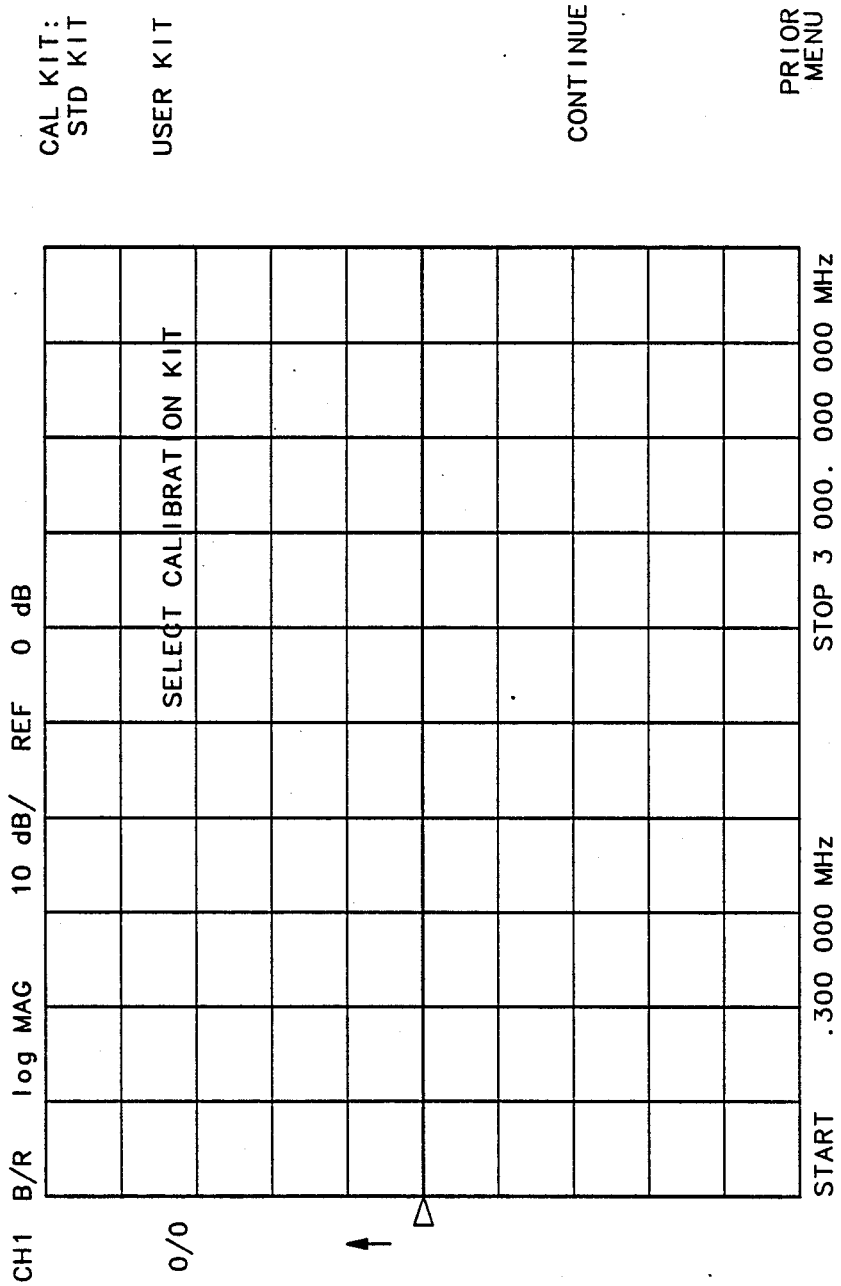
Figure 2Z:
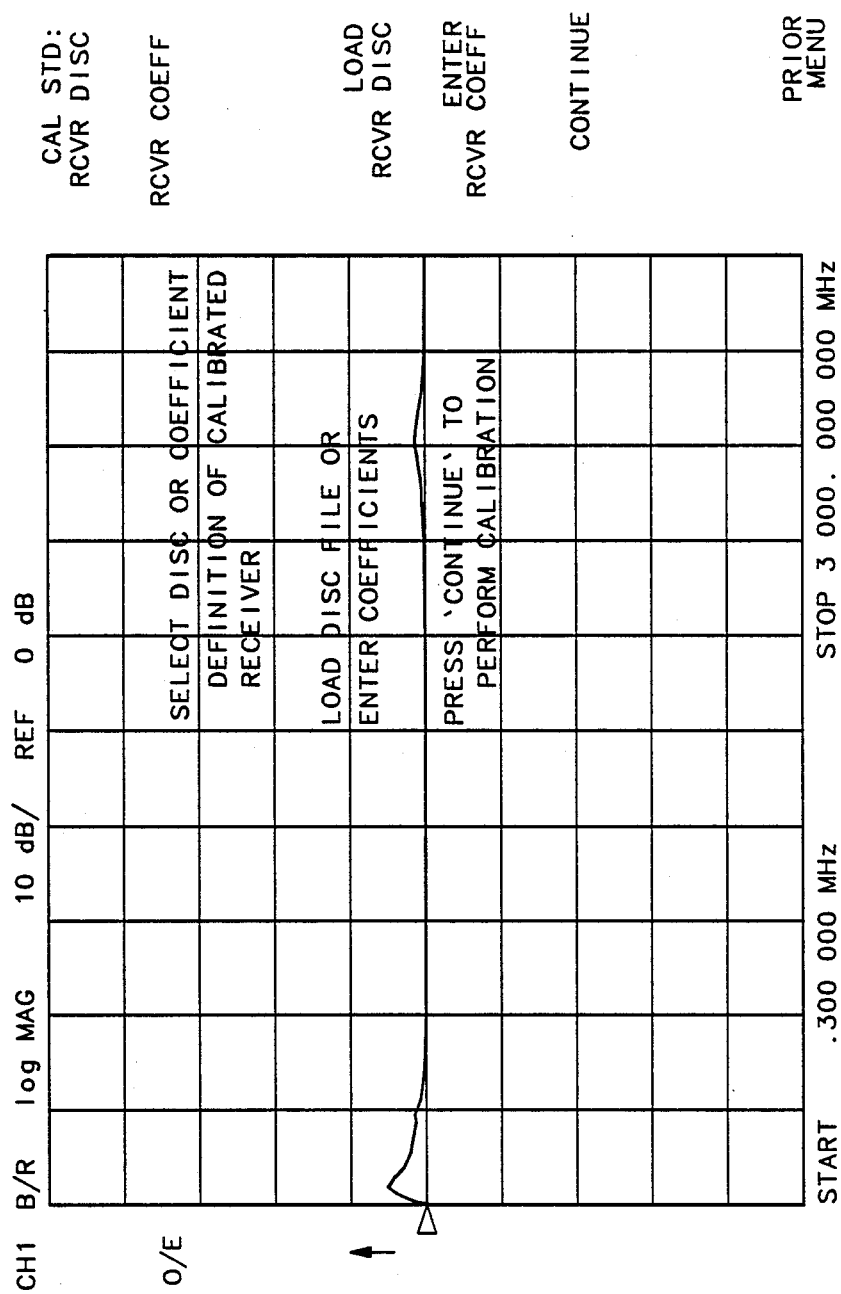
Figure 2A:
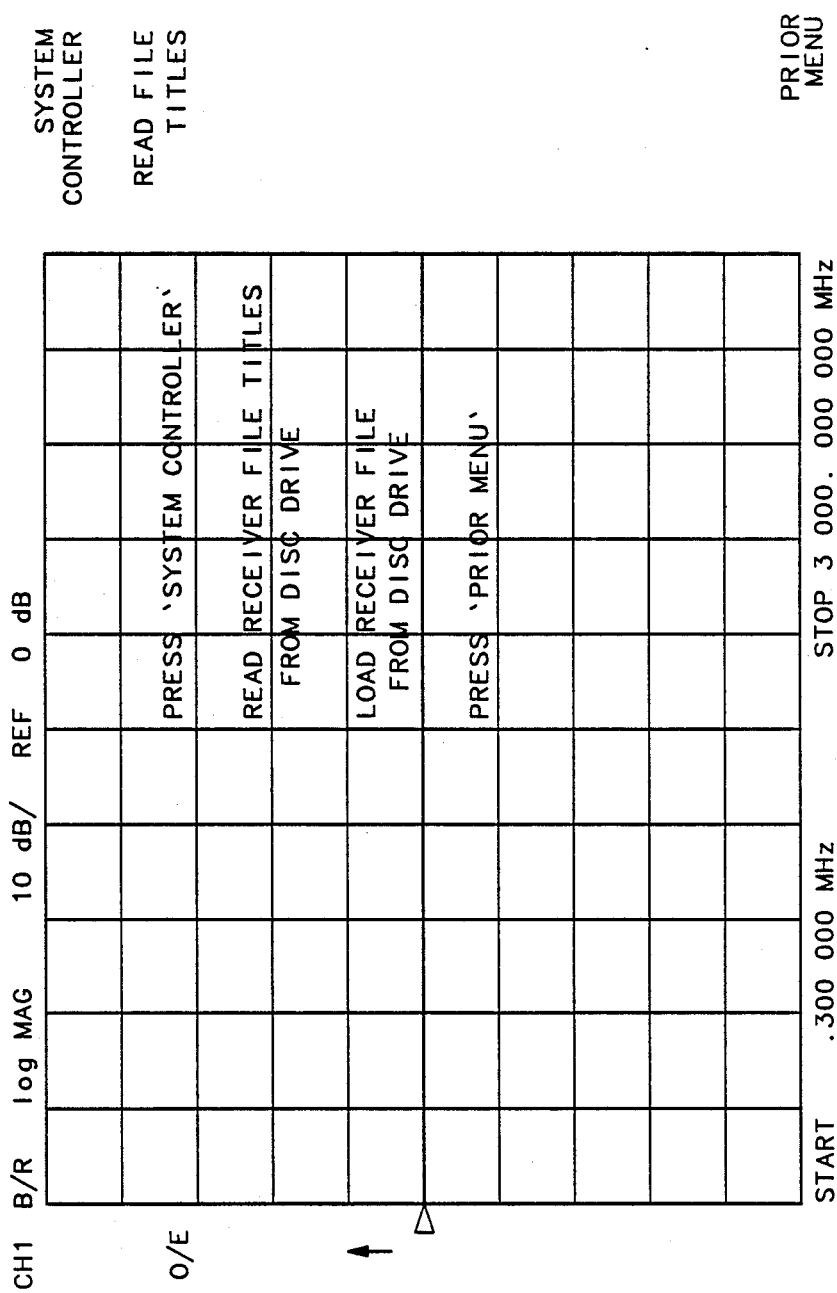
Figure 2C:
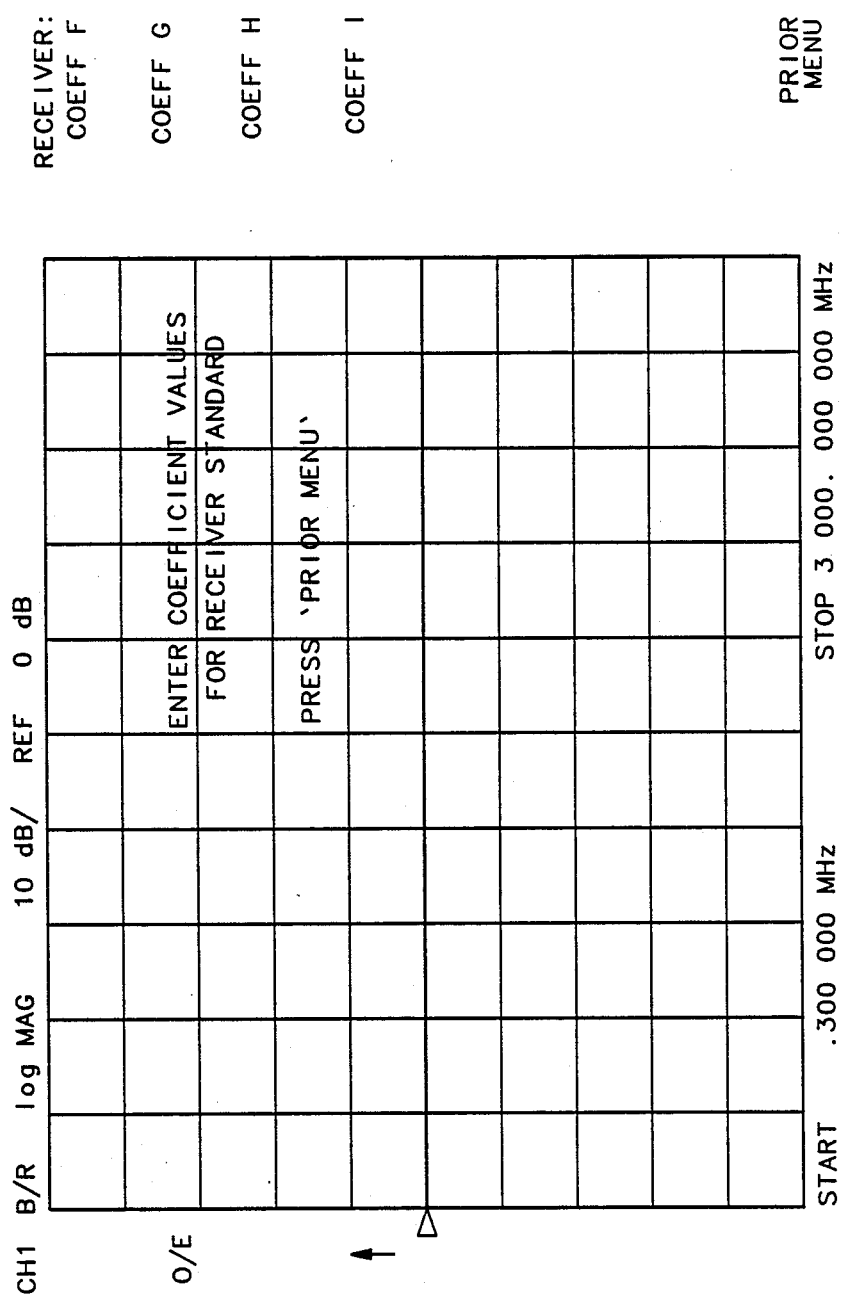
Figure 2E:
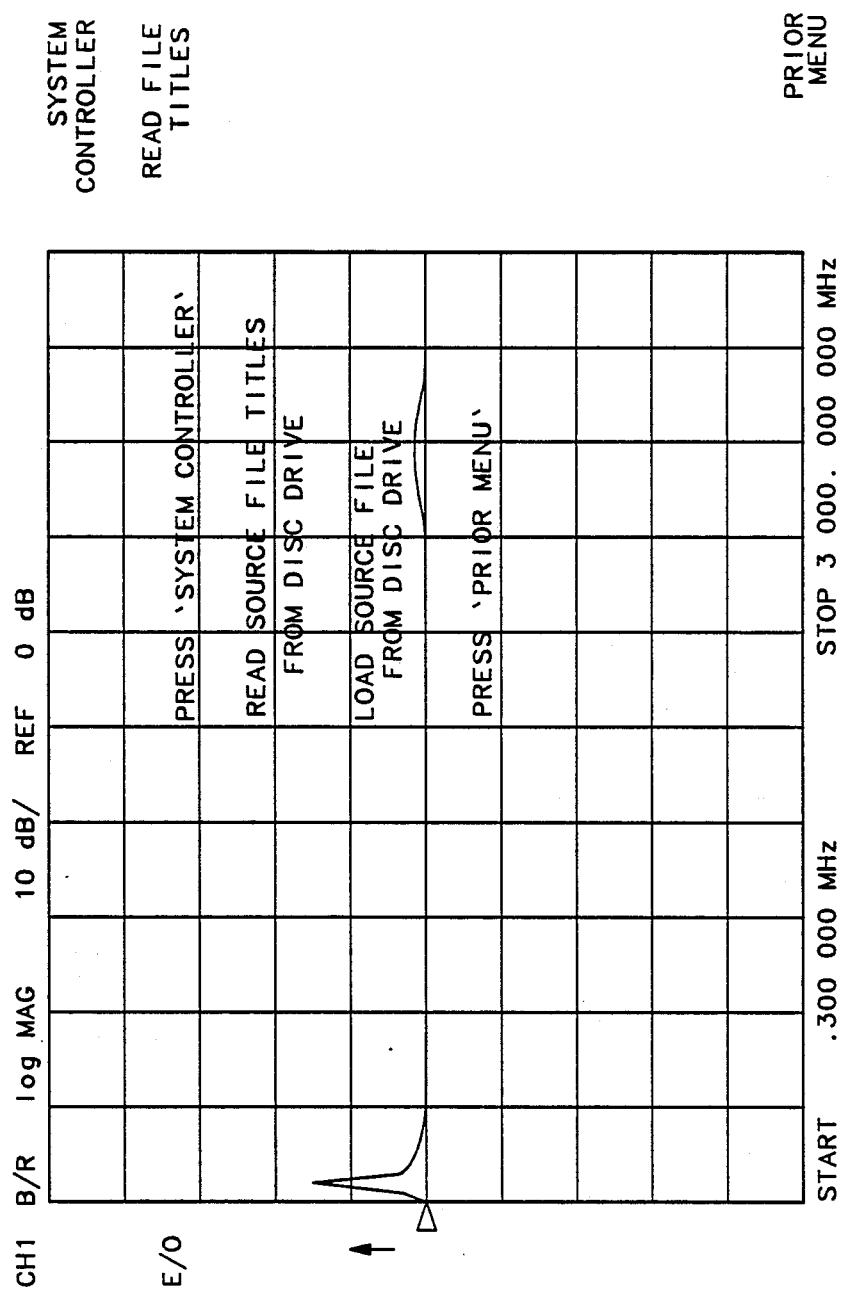
Figure 2F:
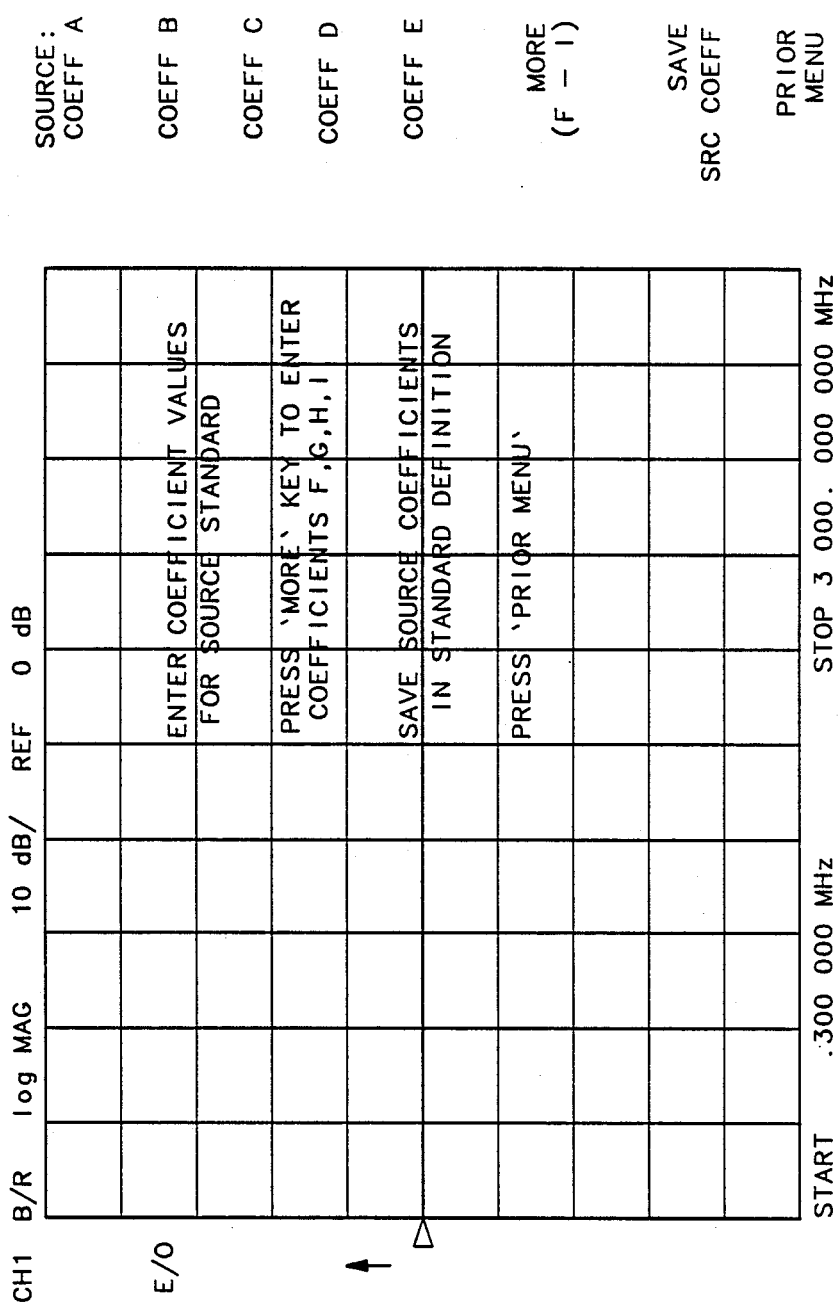

As shown in FIG. 2A, the analyzer 12 displays a softkey menu when the analyzer is turned on. Two softkey selections are available, namely, "GUIDED SETUP" and "NORMAL OPERATION." The user depresses the "NORMAL OPERATION" softkey to have access to all of the features of the lightwave component measurement system 10 in any sequence desired by the user. Conversely, the user depresses the "GUIDED SETUP" softkey for help if he or she wishes to check the connections for the test setup and/or to be led through a series of steps for setting basic parameters for operation of the lightwave component measurement system 10.

Figure 3:
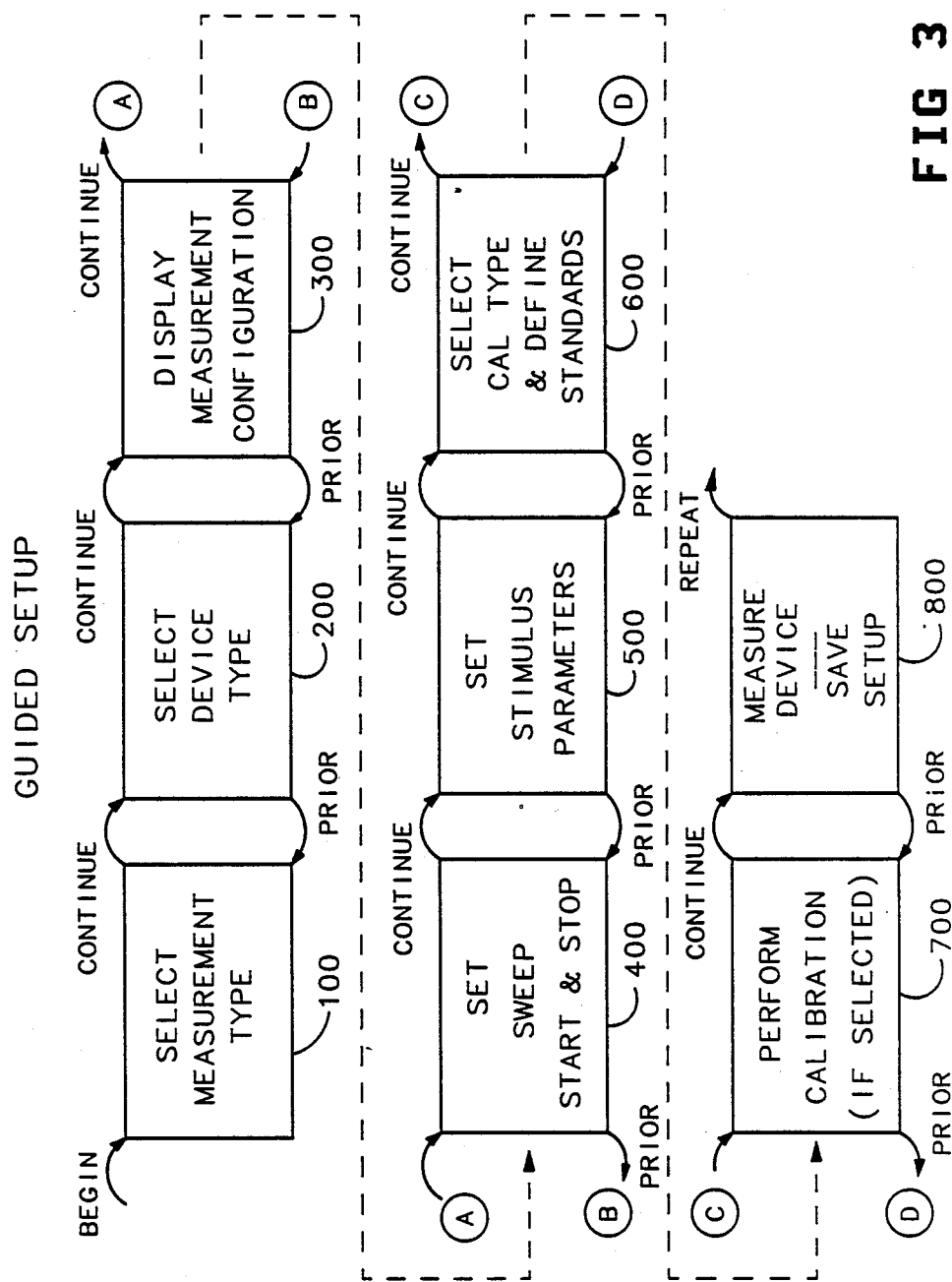
FIG. 3 is a general flow diagram of the user guidance method in accordance with one embodiment of the invention.

When the "GUIDED SETUP" softkey is depressed, the analyzer 12 enters a guided setup mode by calling guided setup routines stored in the ROM of the analyzer. FIG. 3 is a generalized flow diagram of the guided setup method in accordance with one embodiment of the invention.

Considered in more detail, FIGS. 4-11 are flowcharts of the guided setup method in accordance with the invention. The following pages contain a copy of the firmware code. The numerals shown in FIGS. 4-11 are implemented by the correspondingly numbered lines of code which appear on the following pages.

```
#EJECT;
GLOBAL BOOLEAN instruct_on,
                gfigure_on;
INTEGER g_meas_type.L;
INTEGER dg_addr.L;

INTEGER TABLE meas_type_tbl.L := g_trans,
                                  g_refl,
                                  g_power;
INTEGER CONSTANT ins_sz    := 28,    & ins_size+2,   ins_size in iscreen &
         508    ins_power  := 0,
                ins_stimf  := 1,
         408    ins_stimp  := 2,
         508    ins_cw     := 3,
         408    ins_stimmf := 4,
         608    ins_ecal   := 5,
         808    ins_final  := 6,
         518    ins_sweep  := 7,
         708    ins_thru   := 8,
                ins_refl   := 9,
                ins_clear  := 10,
         618    ins_ekit   := 11,
         808    ins_finalc := 12,
                ins_okit   := 13,
                ins_rkit   := 14,
         618    ins_skit   := 15,
                ins_ocal   := 16,
                ins_rcal   := 17,
                ins_scal   := 18,
         708    ins_rcvr   := 19,
                ins_src    := 20,
                ins_format := 21,
         818    ins_scale  := 22,
                ins_copy   := 23,
                ins_save   := 24,
```

```
                    ⎡ ins_rload       := 25,
                    ⎢ ins_sload       := 26,
                    ⎢ ins_rcoeff      := 27,
                    ⎢ ins_scoeff      := 28,
          618       ⎢ ins_rcoeff_more := 29,
                    ⎢ ins_scoeff_more := 30,
                    ⎢ ins_tokit       := 31,
                    ⎣ ins_rocal       := 32,
                    ⎡ ins_rrcal       := 33,
          608       ⎢ ins_rscal       := 34,
                    ⎣ ins_recal       := 35;
ALPHA CONSTANT blankins := "                             ";
ALPHA TABLE ins_set.L :=
                    " ",
          &  1 &   "SET RF START FREQUENCY AND",
          &  2 &   "    STOP FREQUENCY",
          &  3 &   "SET RF MODULATION",
          &  4 &   "    START FREQUENCY AND",
          &  5 &   "SET RF SOURCE POWER",
          &  6 &   "SET SWEEP TIME",
          &  7 &   "SELECT SWEEP TYPE:",
          &  8 &   "SELECT LINEAR OR",
          &  9 &   "LOGARITHMIC FREQUENCY SWEEP",
          & 10 &   "REMOVE DEVICE UNDER TEST",
          & 70 &   "ENTER COEFFICIENT VALUES",
          & 71 &   "   FOR RECEIVER STANDARD",
          & 72 &   "   FOR SOURCE STANDARD",
          & 73 &   "PRESS 'MORE' KEY TO ENTER",
          & 74 &   "   COEFFICIENTS F,G,H,I",
          & 75 &   "SAVE RECEIVER COEFFICIENTS",
          & 76 &   "   IN STANDARD DEFINITION",
          & 77 &   "SAVE SOURCE COEFFICIENTS",
          & 78 &   "    POWER AT R, A, B INPUTS",
          & 79 &   "    MUST BE LESS THAN 0 dBm",
          & 80 &   "   CALIBRATION KIT",
          & 81 &   "   CALIBRATION STANDARD",
          & 82 &   "PRESS 'CONTINUE' TO",
          & 83 &   "   PERFORM CALIBRATION",
          & 84 &   "PRESS 'PRINT' OR 'PLOT'",
          & 85 &   "   THRU",
          & 86 &   "   RECEIVER",
          & 87 &   "   SOURCE",
          & 88 &   "   'RECALL' FUNCTION KEY",
          & 89 &   "   IN NORMAL OPERATION",
          & 90 &   "PRESS 'DONE' TO KEEP",
          & 91 &   "   CURRENT CALIBRATION";

INTEGER TABLE ins_tbl.L :=
508   &      ins_power  & 6,0,5,78,79,0,7,26,0,0,
408 ⎡ &      ins_stimf  & 1,2,0,0,0,0,0,0,0,0,
    ⎣ &      ins_stimp  & 18,19,0,78,79,0,0,0,0,0,
508   &      ins_cw     & 6,0,17,0,0,0,0,0,0,0,
408   &      ins_stimmf & 3,4,2,0,0,0,0,0,0,0,
608   &      ins_ecal   & 13,0,16,80,0,82,83,0,0,0,
808   &      ins_final  & 15,0,29,30,0,31,0,32,0,0,
518   &      ins_sweep  & 8,9,0,0,0,0,0,0,0,0,
708 ⎡ &      ins_thru   & 10,0,11,12,0,23,85,0,24,0,
    ⎣ &      ins_refl   & 20,0,21,22,0,23,27,0,24,0,
      &      ins_clear  & 0,0,0,0,0,0,0,0,0,0,
618   &      ins_ekit   & 14,0,82,83,0,0,0,0,0,0,
808   &      ins_finalc & 15,0,28,0,29,30,0,31,0,32,
    ⎡ &      ins_okit   & 14,0,33,34,0,35,36,0,82,83,
    ⎢ &      ins_rkit   & 37,38,39,0,41,42,0,82,83,0,
618 ⎢ &      ins_skit   & 37,38,40,0,41,42,0,82,83,0,
    ⎣ &      ins_ocal   & 13,0,16,80,0,82,83,0,0,0,
```

```
         &    ins_rcal       &   13,0,25,81,0,82,83,0,0,0,
         &    ins_scal       &   13,0,25,81,0,82,83,0,0,0,
708      &    ins_rcvr       &   10,0,46,47,12,0,23,86,0,24,
         &    ins_src        &   10,0,46,48,12,0,23,87,0,24,
         &    ins_format     &   49,50,51,52,53,0,0,0,0,0,
818      &    ins_scale      &   0,54,55,0,0,0,0,0,0,0,
         &    ins_copy       &   58,0,84,56,57,0,0,0,0,0,
         &    ins_save       &   60,61,0,63,64,0,62,88,89,0,0,
         &    ins_rload      &   58,0,65,66,0,68,66,0,59,0,
         &    ins_sload      &   58,0,67,66,0,69,66,0,59,0,
         &    ins_rcoeff     &   70,71,0,73,74,0,75,76,0,59,
618      &    ins_scoeff     &   70,72,0,73,74,0,77,76,0,59,
         & ins_rcoeff_more   &   70,71,0,59,0,0,0,0,0,0,
         & ins_scoeff_more   &   70,72,0,59,0,0,0,0,0,0,
         &    ins_tokit      &   14,0,0,0,0,0,0,0,0,0,
         &    ins_rocal      &   13,0,16,80,0,82,83,0,90,91,
608      &    ins_rrcal      &   13,0,25,81,0,82,83,0,90,91,
         &    ins_rscal      &   13,0,25,81,0,82,83,0,90,91,
608      &    ins_recal      &   13,0,16,80,0,82,83,0,90,91;

#EJECT;

INTEGER PROCEDURE draw_figure( figure, addr );          ENTRY;
            VALUE figure, addr; INTEGER figure, addr;
100,     BEGIN
104,
106,     INTEGER fig_length;
108,     INTEGER POINTER fig_ptr,
                         dg_ptr;

200,     STPNTR( dg_ptr, ADRS(dgram) + addr*2 );
204      STPNTR( fig_ptr, fig_addr_tbl[figure] );
206      fig_length := fig_len_tbl[figure];

208,     MOVE dg_ptr := fig_ptr, (fig_length);
300,
304      dg_wrt( addr+fig_length, eod );
306      draw_figure := addr + fig_length;

gfigure_on := TRUE;
         END;

SUBROUTINE draw_two_port;                               ENTRY;
            BEGIN
200,     dg_addr := dg_mem_addr[e_aux_id];
         dg_addr := draw_figure( f_two_port_label, dg_addr );
204,     dg_addr := draw_figure( f_dut_ee, dg_addr );
206,     dg_addr := draw_figure( f_dut_eo, dg_addr );
         dg_addr := draw_figure( f_dut_oe, dg_addr );
208,     dg_addr := draw_figure( f_dut_oo, dg_addr );
216
         IF meas_domain = oo_domain THEN
            dg_addr := draw_figure( f_dut_oo_box, dg_addr )
         ELSE IF meas_domain = oe_domain THEN
            dg_addr := draw_figure( f_dut_oe_box, dg_addr )
         ELSE IF meas_domain = eo_domain THEN
            dg_addr := draw_figure( f_dut_eo_box, dg_addr )
         ELSE
            dg_addr := draw_figure( f_dut_ee_box, dg_addr );
         END;

SUBROUTINE draw_one_port;
            BEGIN
200,     dg_addr := dg_mem_addr[e_aux_id];
         dg_addr := draw_figure( f_one_port_label, dg_addr );
```

```
204,   dg_addr := draw_figure( f_dut_lpe, dg_addr );
206,   dg_addr := draw_figure( f_dut_lpo, dg_addr );

208,   IF e_ch_bit( Cglpo ) THEN
216        dg_addr := draw_figure( f_dut_lpo_box, dg_addr )
       ELSE
           dg_addr := draw_figure( f_dut_lpe_box, dg_addr );
       END;

#EJECT;
PROCEDURE draw_meas_type;                                                ENTRY;
    BEGIN
        g_meas_type := e_ch_bitmap( Cgtrans );
        dg_addr := dg_mem_addr[e_aux_id];
100,    dg_addr := draw_figure( f_meas_type, dg_addr );
104,    dg_addr := draw_figure( f_transmission, dg_addr );
        dg_addr := draw_figure( f_reflection, dg_addr );
106,    dg_addr := draw_figure( f_gain_compression, dg_addr );

108,       IF g_meas_type = g_trans THEN
116            dg_addr := draw_figure( f_trans_box, dg_addr )
           ELSE IF g_meas_type = g_refl THEN
               dg_addr := draw_figure( f_refl_box, dg_addr )
           ELSE IF g_meas_type = g_power THEN
               dg_addr := draw_figure( f_gcomp_box, dg_addr );

END;

SUBROUTINE draw_config;
    BEGIN
        dg_addr := dg_mem_addr[ e_aux_id ];
        dg_addr := draw_figure( f_net_anal, dg_addr );
        IF ts_present THEN
            BEGIN
            dg_addr := draw_figure( f_testset, dg_addr );
300,        IF meas_domain = oo_domain THEN
                BEGIN & O/O &
304,            IF g_meas_type = g_refl THEN
                    dg_addr := draw_figure( f_oo_refl_ts, dg_addr )
306             ELSE
                    dg_addr := draw_figure( f_oo_trans_ts, dg_addr );
                END
            ELSE IF meas_domain = oe_domain THEN
                BEGIN  & O/E &
                IF g_meas_type = g_refl THEN
                    dg_addr := draw_figure( f_ee_refl_ts, dg_addr )
                ELSE
                    dg_addr := draw_figure( f_oe_trans_ts, dg_addr );
                END
            ELSE IF meas_domain = eo_domain THEN
                BEGIN  & E/O &
                IF g_meas_type = g_refl THEN
                    dg_addr := draw_figure( f_ee_refl_ts, dg_addr )
                ELSE
                    dg_addr := draw_figure( f_eo_trans_ts, dg_addr );
                END
            ELSE IF meas_domain = ee_domain THEN
                BEGIN  & E/E &
                IF g_meas_type = g_refl THEN
                    dg_addr := draw_figure( f_ee_refl_ts, dg_addr )
                ELSE
                    dg_addr := draw_figure( f_ee_trans_ts, dg_addr );
                END;
            END
        ELSE
            BEGIN  & no test set &
            dg_addr := draw_figure( f_pow_split, dg_addr );
            IF meas_domain = oo_domain THEN
```

```
              BEGIN & O/O &
              IF g_meas_type = g_refl THEN
                  dg_addr := draw_figure( f_oo_refl_nts, dg_addr )
               ELSE
                  dg_addr := draw_figure( f_oo_trans_nts, dg_addr );
               END
           ELSE IF meas_domain = oe_domain THEN
              BEGIN
              IF g_meas_type = g_refl THEN
                  dg_addr := draw_figure( f_ee_refl_nts, dg_addr )
               ELSE
                  dg_addr := draw_figure( f_oe_trans_nts, dg_addr );
               END
           ELSE IF meas_domain = eo_domain THEN
              BEGIN
              IF g_meas_type = g_refl THEN
                  dg_addr := draw_figure( f_ee_refl_nts, dg_addr )
               ELSE
                  dg_addr := draw_figure( f_eo_trans_nts, dg_addr );
               END
           ELSE IF meas_domain = ee_domain THEN
              BEGIN & E/E &
              IF g_meas_type = g_refl THEN
                  dg_addr := draw_figure( f_ee_refl_nts, dg_addr )
               ELSE
                  dg_addr := draw_figure( f_ee_trans_nts, dg_addr );
               END;
           END;
       IF meas_domain <> ee_domain THEN
           dg_addr := draw_figure( f_optical_cable, dg_addr );
       END;

#EJECT;

PROCEDURE lb_instruct(msg1,msg2,msg3,msg4,msg5,msg6,msg7,
                                                 msg8,msg9,msgA);
       VALUE msg1, msg2, msg3, msg4, msg5, msg6, msg7, msg8, msg9, msgA;
400,   ALPHA msg1, msg2, msg3, msg4, msg5, msg6, msg7, msg8, msg9, msgA;
408,   BEGIN setext( %0 );   & size10, rotate0 &
500,
       lb( instruct1_disp, blankins );
508,   lb( instruct2_disp, blankins );
       lb( instruct3_disp, blankins );
600,   lb( instruct4_disp, blankins );
608,   lb( instruct5_disp, blankins );
       lb( instruct6_disp, blankins );
700,   lb( instruct7_disp, blankins );
708,   lb( instruct8_disp, blankins );
       lb( instruct9_disp, blankins );
       lb( instructA_disp, blankins );
800,
808    lb( instruct1_disp, msg1 );
       lb( instruct2_disp, msg2 );
       lb( instruct3_disp, msg3 );
       lb( instruct4_disp, msg4 );
       lb( instruct5_disp, msg5 );
       lb( instruct6_disp, msg6 );
       lb( instruct7_disp, msg7 );
       lb( instruct8_disp, msg8 );
       lb( instruct9_disp, msg9 );
       lb( instructA_disp, msgA );

& rewrite messages to intensify for contrast with grat and data &
```

```
        lb( instruct1_disp+ins_sz, blankins );
        lb( instruct2_disp+ins_sz, blankins );
        lb( instruct3_disp+ins_sz, blankins );
        lb( instruct4_disp+ins_sz, blankins );
        lb( instruct5_disp+ins_sz, blankins );
        lb( instruct6_disp+ins_sz, blankins );
        lb( instruct7_disp+ins_sz, blankins );
        lb( instruct8_disp+ins_sz, blankins );
        lb( instruct9_disp+ins_sz, blankins );
        lb( instructA_disp+ins_sz, blankins );

lb( instruct1_disp+ins_sz, msg1 );
        lb( instruct2_disp+ins_sz, msg2 );
        lb( instruct3_disp+ins_sz, msg3 );
        lb( instruct4_disp+ins_sz, msg4 );
        lb( instruct5_disp+ins_sz, msg5 );
        lb( instruct6_disp+ins_sz, msg6 );
        lb( instruct7_disp+ins_sz, msg7 );
        lb( instruct8_disp+ins_sz, msg8 );
        lb( instruct9_disp+ins_sz, msg9 );
        lb( instructA_disp+ins_sz, msgA );

END;

PROCEDURE guided_instruct( instrct );                                          ENTRY;
        VALUE instrct;
        INTEGER instrct;
400,  BEGIN
408,    INTEGER record;
        ALPHA lin1,lin2,lin3,lin4,lin5,lin6,lin7,lin8,lin9,linA;
500,
508,    record := 10*instrct;
        lin1 := ins_set[ ins_tbl[ record   ]];
600,    lin2 := ins_set[ ins_tbl[ record+1 ]];
608,    lin3 := ins_set[ ins_tbl[ record+2 ]];
        lin4 := ins_set[ ins_tbl[ record+3 ]];
700,    lin5 := ins_set[ ins_tbl[ record+4 ]];
708,    lin6 := ins_set[ ins_tbl[ record+5 ]];
        lin7 := ins_set[ ins_tbl[ record+6 ]];
800,    lin8 := ins_set[ ins_tbl[ record+7 ]];
        lin9 := ins_set[ ins_tbl[ record+8 ]];
808     linA := ins_set[ ins_tbl[ record+9 ]];
        lb_instruct( lin1,lin2,lin3,lin4,lin5,lin6,lin7,lin8,lin9,linA );

instruct_on := TRUE;
        END;

BOOLEAN PROCEDURE g_ins_off;                                                   ENTRY;
        BEGIN
        BOOLEAN bool_temp;
          COMMENT first and last guided tokens for instructions
                  are in the first line after bool_temp := ;
400,    bool_temp :=
414,      ((cmd_token < Cgfstart) OR (cmd_token > Cguided_end) OR
           (cmd_token = Cgfstim_rtn) OR (cmd_token = Cgpstim_rtn))   AND
500,      cmd_token <> Cguided_invalid   AND
          cmd_token <> Clin_freq         AND
514,      cmd_token <> Clog_freq         AND
          cmd_token <> Cck7mm            AND
600,      cmd_token <> Cck35mm           AND
          cmd_token <> CckN50            AND
614,      cmd_token <> CckN75;
        bool_temp := bool_temp           AND
700,      cmd_token <> Cckud             AND
714,      cmd_token <> Cckopt            AND
          cmd_token <> Cckud_opt         AND
          cmd_token <> Cckrcvr           AND
```

```
800,       cmd_token <> Cckud_rcvr;
814     bool_temp := bool_temp          AND
           cmd_token <> Cload_cr1        AND
           cmd_token <> Cload_cr2        AND
           cmd_token <> Cload_cr3        AND
           cmd_token <> Cload_cr4        AND
           cmd_token <> Cload_cr5        AND
           cmd_token <> CIB_control;
        bool_temp := bool_temp          AND
           cmd_token <> Cacoeff          AND
           cmd_token <> Cbcoeff          AND
           cmd_token <> Cccoeff          AND
           cmd_token <> Cdcoeff          AND
           cmd_token <> Cecoeff          AND
           cmd_token <> Cfcoeff          AND
           cmd_token <> Cgcoeff          AND
           cmd_token <> Chcoeff          AND
           cmd_token <> Cicoeff;
        bool_temp := bool_temp          AND
           cmd_token <> Cstrcvruck       AND
           cmd_token <> Ccksrc           AND
           cmd_token <> Cckud_src        AND
           cmd_token <> Cload_cs1        AND
           cmd_token <> Cload_cs2        AND
           cmd_token <> Cload_cs3        AND
           cmd_token <> Cload_cs4        AND
           cmd_token <> Cload_cs5        AND
           cmd_token <> Ccstitl          AND
           cmd_token <> Ccrtitl;
       .bool_temp := bool_temp AND
           cmd_token <> Cstoptuck        AND
           cmd_token <> Cstsrcuck        AND
           cmd_token <> Cmag             AND
           cmd_token <> Clinear_mag      AND
           cmd_token <> Cphase           AND
           cmd_token <> Cdelay           AND
           cmd_token <> Cauto_scale      AND
           cmd_token <> Cref_val;
        bool_temp := bool_temp          AND
           cmd_token <> Cref_pos         AND
           cmd_token <> Cpr_all          AND
           cmd_token <> Cplot_all        AND
           cmd_token <> Csave_1          AND
           cmd_token <> Csave_2          AND
           cmd_token <> Csave_3          AND
           cmd_token <> Csave_4          AND
           cmd_token <> Csave_5;
        bool_temp := bool_temp          AND
           cmd_token <> Cstart           AND
           cmd_token <> Cstop            AND
           cmd_token <> Ccenter          AND
           cmd_token <> Cspan;

IF bool_temp THEN
           g_ins_off := TRUE
        ELSE
           g_ins_off := FALSE;
        END;

SUBROUTINE clr_instruct;                                                    ENTRY;
        BEGIN
        guided_instruct( ins_clear );
        instruct_on := FALSE;
        END;
```

```
#EJECT;
PROCEDURE guided_preset;
    BEGIN
    INTEGER current_swp_type,
300,        current_dut_type;

322 - current_dut_type := e_ch_bitmap( Clpo_dut );

COMMENT single channel;
    IF e_ch_bit( Cdual_chan ) THEN
        BEGIN
        h_off( Cdual_chan , Cdual_chan );
        brk_swp_srce;
        select_trace_mode;
        END;

COMMENT display data trace;
    set_trace_type( trace_data );

COMMENT marker off;
    IF e_ch_bit( Cmarker_off ) = 0 THEN
        BEGIN
        sel_mkr(0);
        h_off(Cmkr_meas_widt,Cmkr_meas_widt);
        h_off(Cmkr_meas_stat,Cmkr_meas_stat);
        h_key(Csearch_off,Csearch_off,Csearch_target);
        h_key(Cmkr_meas_off,Cmkr_meas_off,Cmkr_meas_rise);
        END;

g_meas_type := e_ch_bitmap( Cgtrans );
    IF (g_meas_type = g_refl) AND (meas_domain <> 0) THEN
        IF ts_present THEN
            new_param( Cs11-Cs11 )
        ELSE
            new_param( Car-Car+5 )
    ELSE
        IF ts_present THEN
            new_param( Cs21-Cs11 )
        ELSE
            new_param( Cbr-Car+5 );

COMMENT selecting a new parameter will turn on cal linked to that
    parameter.  Restore device type if restored cal changed device
    type;

IF e_ch_bitmap( Clpo_dut ) <> current_dut_type THEN
        BEGIN
        h_key( Clpo_dut+current_dut_type, Clpo_dut, Cee_dut );
        part_cal_domain;
        END;

current_swp_type := e_ch_bitmap( Clin_freq );
    IF g_meas_type <> g_power THEN
        BEGIN   & frequency sweeps &
        IF current_swp_type > 1 THEN
            set_swp_type( 0 );   & set to lin freq if not lin or log &
        END
        ELSE
        IF current_swp_type <> 3 THEN
            set_swp_type( 3 );   & set to power if not already power &

COMMENT auto scale data trace
    auto_scale;

END;
```

```
     SUBROUTINE set_device_type;
         BEGIN
200,     IF meas_domain = 0 THEN
             i_calkit( e_ch_bitmap( Cckopt )+5 )
220,     ELSE IF meas_domain = 1 THEN
             i_calkit( e_ch_bitmap( Cckrcvr )+7 )
         ELSE IF meas_domain = 2 THEN
             i_calkit( e_ch_bitmap( Ccksrc )+9 )
         ELSE
             i_calkit( e_ch_bitmap( Cck7mm ) );
400,     IF g_meas_type = g_power THEN
             gen_menu( CONFIGgp_MENU )
424,     ELSE
             gen_menu(CONFIGgf_MENU);
         draw_config;
         END;

SUBROUTINE select_meas_type;
         BEGIN
         erase_disp( 3 );
         IF (g_meas_type = g_refl) THEN
100,         BEGIN
             IF meas_domain = 0 THEN h_key( Cglpo, Cglpo, Cglpe )
120,         ELSE IF meas_domain = 3 THEN h_key( Cglpe, Cglpo, Cglpe );
             gen_menu( ONE_PORTg_MENU );
             draw_one_port;
             END
         ELSE
             BEGIN
300,         h_key( Cgoo+meas_domain, Cgoo, Cgee );
318,         gen_menu( TWO_PORTg_MENU );
             draw_two_port;
             END;
         END;

#EJECT;

PROCEDURE select_cal_domain;
         BEGIN
         set_gstd_class;
500,     IF e_ch_bit( Ccorrection ) = 0 THEN
             h_key( Cgcal_none, Cgcal_none, Cgcal_resp )
528,     ELSE IF e_ch_bit( Cresponse_type ) THEN
             h_key( Cgcal_resp, Cgcal_none, Cgcal_resp )
         ELSE h_off( Cgcal_none, Cgcal_resp );
         IF meas_domain = oo_domain THEN
700,         BEGIN
724          IF e_ch_bit( Ccorrection ) = 0 THEN
                 BEGIN
                 gen_menu( CALgoo_MENU );
                 guided_instruct( ins_ocal );
                 END
             ELSE
                 BEGIN
                 gen_menu( CALgroo_MENU );
                 guided_instruct( ins_rocal );
                 END;
             END
         ELSE IF meas_domain = oe_domain THEN
             BEGIN
             IF e_ch_bit( Ccorrection ) = 0 THEN
                 BEGIN
                 gen_menu( CALgoe_MENU );
                 guided_instruct( ins_rcal );
                 END
```

```
              ELSE
                BEGIN
                  gen_menu( CALgroe_MENU );
                  guided_instruct( ins_rrcal );
                END;
            END
        ELSE IF meas_domain = eo_domain THEN
            BEGIN
              IF e_ch_bit( Ccorrection ) = 0 THEN
                BEGIN
                  gen_menu( CALgeo_MENU );
                  guided_instruct( ins_scal );
                END
              ELSE
                BEGIN
                  gen_menu( CALgreo_MENU );
                  guided_instruct( ins_rscal );
                END;
            END
        ELSE
            BEGIN
              IF e_ch_bit( Ccorrection ) = 0 THEN
                BEGIN
                  gen_menu( CALgee_MENU );
                  guided_instruct( ins_ecal );
                END
              ELSE
                BEGIN
                  gen_menu( CALgree_MENU );
                  guided_instruct( ins_recal );
                END;
            END;
      END;

PROCEDURE select_guided_cal;
    BEGIN
      INTEGER gcal_type;
600   gcal_type := e_ch_bitmap( Cgcal_none );
628   IF gcal_type = 0 THEN
        BEGIN
          corr_off( curr_e_ch );
700,      gen_menu( FINALg_MENU );
708,,     guided_instruct( ins_final );
        END
800,  ELSE IF gcal_type = 1 THEN
        BEGIN
802,      set_gcal_type;
          IF g_meas_type = g_refl THEN
808         guided_instruct( ins_refl)
          ELSE
            IF meas_domain = 1 THEN guided_instruct( ins_rcvr )
            ELSE IF meas_domain = 2 THEN guided_instruct( ins_src)
            ELSE guided_instruct( ins_thru );
        END;
    END;

#FILE fguid;

ENDS

COMMENT
    This is a software generated file !!!
```

```
*************** fguid ************************;

SUBROUTINE p14;  ENTRY;
     BEGIN

CASE cmd_token-712 OF
        BEGIN
         & 712 &
100, BEGIN
116  h_key( Cgtrans, Cgtrans, Cgpower );
     draw_meas_type;
     END;
         & 713 &
         BEGIN
116  h_key( Cgrefl, Cgtrans, Cgpower );
     draw_meas_type;
     END;
         & 714 &
         BEGIN
116  h_key( Cgpower, Cgtrans, Cgpower );
     draw_meas_type;
     END;
         & 715 &
124  warn( out_of_range );
         & 716 &
120  select_meas_type;
         & 717 &
         BEGIN
     h_key( Coo_dut, Clpo_dut, Cee_dut );
     h_key( Cgoo, Cgoo, Cgee );
216  erase_disp(3);
     gen_menu( TWO_PORTg_MENU );
     draw_two_port;
     END;
         & 718 &
         BEGIN
     h_key( Coe_dut, Clpo_dut, Cee_dut );
     h_key( Cgoe, Cgoo, Cgee );
216  erase_disp(3);
     gen_menu( TWO_PORTg_MENU );
     draw_two_port;
     END;
         & 719 &
         BEGIN
     h_key( Ceo_dut, Clpo_dut, Cee_dut );
     h_key( Cgeo, Cgoo, Cgee );
216  erase_disp(3);
     gen_menu( TWO_PORTg_MENU );
     draw_two_port;
     END;
         & 720 &
         BEGIN
     h_key( Cee_dut, Clpo_dut, Cee_dut );
216  h_key( Cgee, Cgoo, Cgee );
     erase_disp(3);
     gen_menu( TWO_PORTg_MENU );
     draw_two_port;
     END;
```

```
        & 721 &
218,    BEGIN
220     h_key( Coo_dut+e_ch_bitmap(Cgoo), Clpo_dut, Cee_dut );
        set_device_type;
        END;
        & 722 &
        BEGIN
226     erase_disp(3);
        gen_menu( GUIDED_MENU );
        draw_meas_type;
        END;
        & 723 &
        BEGIN
        h_key( Clpo_dut, Clpo_dut, Cee_dut );
216     h_key( Cglpo, Cglpo, Cglpe );
        erase_disp(3);
        gen_menu( ONE_PORTg_MENU );
        draw_one_port;
        END;
        & 724 &
        BEGIN
        h_key( Clpe_dut, Clpo_dut, Cee_dut );
216     h_key( Cglpe, Cglpo, Cglpe );
        erase_disp(3);
        gen_menu( ONE_PORTg_MENU );
        draw_one_port;
        END;
        & 725 &
218,    BEGIN
220     h_key( Clpo_dut+e_ch_bitmap(Cglpo), Clpo_dut, Cee_dut );
        set_device_type;
        END;
        & 726 &
        BEGIN
226     erase_disp(3);
        gen_menu( GUIDED_MENU );
        draw_meas_type;
        END;
        & 727 &
        BEGIN
        guided_preset;
        gen_menu( STIMgf_MENU );
322,    IF meas_domain = ee_domain THEN
            guided_instruct( ins_stimf )
         ELSE
            guided_instruct( ins_stimmf );
        END;
        & 728 &
318     select_meas_type;
        & 729 &
        BEGIN
418     sel_act_tsw(active_start);
        END;
        & 730 &
        BEGIN
418     sel_act_tsw(active_stop);
```

```
         END;
         & 731 &
         BEGIN
428      gen_menu(POWERgf_MENU);
         guided_instruct( ins_power );
         END;
         & 732 &
         BEGIN
424      erase_disp(3);
         draw_config;
         END;
         & 733 &
         BEGIN
518      select_act_fcn( active_sweep_time );
         END;
         & 734 &
         BEGIN
518      select_act_fcn( active_source_power );
         END;
         & 735 &
518      guided_instruct( ins_sweep );
         & 736 &
         BEGIN
528      select_cal_domain;
         END;
         & 737 &
         BEGIN
518      gen_menu(STIMgf_MENU);
         IF meas_domain = ee_domain THEN
             guided_instruct( ins_stimf )
         ELSE
             guided_instruct( ins_stimmf );
         END;
         & 738 &
518      guided_instruct( ins_power );
         & 739 &
618      h_on( Cgcal_none, Cgcal_resp );
         & 740 &
618      h_on( Cgcal_none, Cgcal_resp );
         & 741 &
         BEGIN
         IF e_ch_bit( Cgrefl ) THEN
             BEGIN
             gen_menu( KITgoo_MENU );
618          guided_instruct( ins_okit );
             END
         ELSE
             BEGIN
             gen_menu( KITgtoo_MENU );
             guided_instruct( ins_tokit );
             END;
         END;
         & 742 &
630      select_guided_cal;
         & 743 &
         BEGIN
```

```
624 | IF g_meas_type = g_power THEN
    |     BEGIN
    |       gen_menu( POWERgp_MENU );
    |       guided_instruct( ins_cw );
    |     END
    |    ELSE
    |     BEGIN
    |       gen_menu( POWERgf_MENU );
    |       guided_instruct( ins_power );
    |     END;
    | END;
      & 744 &
724 select_guided_cal;
      & 745 &
      BEGIN
632   gen_menu( FINALg_MENU );
      guided_instruct( ins_final );
      END;
      & 746 &
      BEGIN
618   gen_menu( KITgee_MENU );
      guided_instruct( ins_ekit );
      END;
      & 747 &
724 select_guided_cal;
      & 748 &
724 select_guided_cal;
      & 749 &
      BEGIN
618   gen_menu( KITgeo_MENU );
      guided_instruct( ins_skit );
      END;
      & 750 &
724 select_guided_cal;
      & 751 &
724 select_guided_cal;
      & 752 &
      BEGIN
618   gen_menu( KITgoe_MENU );
      guided_instruct( ins_rkit );
      END;
      & 753 &
724 select_guided_cal;
      & 754 &
724 select_guided_cal;
      & 755 &
      BEGIN
618   h_key( Cgcal_resp, Cgcal_none, Cgcal_resp );
      select_guided_cal;
      END;
      & 756 &
      BEGIN
618   set_gstd_class;
      guided_instruct( ins_ecal );
      END;
      & 757 &
      BEGIN
```

```
618 | define_std( std_fresnel );
      select_act_fcn( a_refl_power_opt );
      END;
      & 758 &
      BEGIN
      define_std( std_refl );
      select_act_fcn( a_refl_power_opt );
      END;
      & 759 &
      BEGIN
      h_key( Cgcal_resp, Cgcal_none, Cgcal_resp );
      select_guided_cal;
      END;
      & 760 &
      BEGIN
      set_gstd_class;
      guided_instruct( ins_ocal );
      END;
      & 761 &
      BEGIN
      h_key( Cgcal_resp, Cgcal_none, Cgcal_resp );
      select_guided_cal;
      END;
      & 762 &
      BEGIN
      set_gstd_class;
      guided_instruct( ins_ocal );
      END;
      & 763 &
      guided_instruct( ins_rload );
      & 764 &
      BEGIN
      define_std( std_u_rcvr );
      guided_instruct( ins_rcoeff );
      END;
618 | & 765 &
      BEGIN
      h_key( Cgcal_resp, Cgcal_none, Cgcal_resp );
      select_guided_cal;
      END;
      & 766 &
      BEGIN
      set_gstd_class;
      guided_instruct( ins_rcal );
      END;
      & 767 &
      guided_instruct( ins_rkit );
      & 768 &
      guided_instruct( ins_rcoeff_more );
      & 769 &
      guided_instruct( ins_rkit );
      & 770 &
      guided_instruct( ins_rcoeff );
      & 771 &
      guided_instruct( ins_sload );
      & 772 &
      BEGIN
```

```
             define_std( std_u_src );
             guided_instruct( ins_scoeff );
             END;
             & 773 &
             BEGIN
             h_key( Cgcal_resp, Cgcal_none, Cgcal_resp );
             select_guided_cal;
             END;
    618      & 774 &
             BEGIN
             set_gstd_class;
             guided_instruct( ins_scal );
             END;
             & 775 &
             guided_instruct( ins_skit );
    618      & 776 &
             guided_instruct( ins_scoeff_more );
             & 777 &
             guided_instruct( ins_skit );
             & 778 &
             guided_instruct( ins_scoeff );
             & 779 &
             set_gelement( 1 );
             & 780 &
    718      set_gelement( 2 );
             & 781 &
             set_gelement( 3 );
             & 782 &
             set_gelement( 4 );
             & 783 &
             set_gelement( 5 );
             & 784 &
             BEGIN
    730      gcal_done;
             END;
             & 785 &
    724      select_cal_domain;
             & 786 &
             BEGIN
    322      guided_preset;
             gen_menu( STIMgp_MENU );
             guided_instruct( ins_stimp );
             END;
             & 787 &
    318      select_meas_type;
             & 788 &
             BEGIN
    418      sel_act_tsw(active_start);
             END;
             & 789 &
             BEGIN
    418      sel_act_tsw(active_stop);
             END;
             & 790 &
             BEGIN
    428      gen_menu(POWERgp_MENU);
             guided_instruct( ins_cw );
             END;
```

```
        & 791 &
        BEGIN
424     erase_disp(3);
        draw_config;
        END;
        & 792 &
518     BEGIN
        sel_act_tsw( active_cw );
        END;
        & 793 &
        BEGIN
528     select_cal_domain;
        END;
        & 794 &
        BEGIN
524     gen_menu(STIMgp_MENU);
        guided_instruct( ins_stimp );
        END;
        & 795 &
818     guided_instruct( ins_format );
        & 796 &
        guided_instruct( ins_scale );
        & 797 &
        guided_instruct( ins_copy );
        & 798 &
        guided_instruct( ins_save );
        & 799 &
        BEGIN
        erase_disp(3);
828     gen_menu( GUIDED_MENU );
        draw_meas_type;
        END;
        & 800 &
        BEGIN
824     select_cal_domain;
        END;
        & 801 &
        guided_instruct( ins_final );
        & 802 &
818        select_act_fcn(active_scale);
        & 803 &
        guided_instruct( ins_final );
        & 804 &
        guided_instruct( ins_final );
        & 805 &
        guided_instruct( ins_final );
        END;
        END p14;

Eguid.zork.L
100     .GUIDED_MENU
        --------
102     "BANDWIDTH"
        \011
```

```
      ┌[Cgtrans
      │,BEGIN
116   │,h_key( Cgtrans, Cgtrans, Cgpower );
      │,draw_meas_type;
      │,END;
      └|
      ─────────
102   "REFLECTION"
      \000
      ┌[Cgrefl
      │,BEGIN
116   │,h_key( Cgrefl, Cgtrans, Cgpower );
      │,draw_meas_type;
      │,END;
      └|
      ─────────
      ┌"GAIN"
102   │"COMPRESS'N"
      \000
      ┌[Cgpower
      │,BEGIN
116   │,h_key( Cgpower, Cgtrans, Cgpower );
      │,draw_meas_type;
      │,END;
      ─────────
      " "
124   ┌[Cguided_invalid
      └,warn( out_of_range );
      ─────────
      " "
124   ]Cguided_invalid
      ─────────
102   "CONTINUE"
      ┌[Cgmeas_done
120   └,select_meas_type;
      ─────────
      " "
124   ]Cguided_invalid
      ─────────
      ┌"NORMAL"
102   └"OPERATION"
126   ]Cnorm_oper
      ─────────
      *EJECT*******
200   .TWO_PORTg_MENU
      ─────────
202   " O/O "
      ┌[Cgoo
      │\011
      │,BEGIN
      │,h_key( Coo_dut, C1po_dut, Cee_dut );
      │,h_key( Cgoo, Cgoo, Cgee );
216   │,erase_disp(3);
      │,gen_menu( TWO_PORTg_MENU );
      │,draw_two_port;
      │,END;
      └|
      ─────────
```

```
202 " O/E "
    [Cgoe
    \000
    ,BEGIN
    ,h_key( Coe_dut, Clpo_dut, Cee_dut );
    ,h_key( Cgoe, Cgoo, Cgee );
216 ,erase_disp(3);
    ,gen_menu( TWO_PORTg_MENU );
    ,draw_two_port;
    ,END;

202 " E/O "
    [Cgeo
    \000
    ,BEGIN
    ,h_key( Ceo_dut, Clpo_dut, Cee_dut );
    ,h_key( Cgeo, Cgoo, Cgee );
216 ,erase_disp(3);
    ,gen_menu( TWO_PORTg_MENU );
    ,draw_two_port;
    ,END;

202 " E/E "
    [Cgee
    \000
    ,BEGIN
    ,h_key( Cee_dut, Clpo_dut, Cee_dut );
    ,h_key( Cgee, Cgoo, Cgee );
216 ,erase_disp(3);
    ,gen_menu( TWO_PORTg_MENU );
    ,draw_two_port;
    ,END;

" "
224 ]Cguided_invalid

202 "CONTINUE"
    [Ctwo_port_done
    ,BEGIN
220 ,h_key( Coo_dut+e_ch_bitmap(Cgoo), Clpo_dut, Cee_dut );
    ,set_device_type;

,END;

" "
224 ]Cguided_invalid

"PRIOR"
202 "MENU"
```

```
      [Cg2p_rtn
      ,BEGIN
      ,erase_disp(3);
226   ,gen_menu( GUIDED_MENU );
      ,draw_meas_type;
      ,END;
      --------

*EJECT*******
200   .ONE_PORTg_MENU
      --------
202   ["1-PORT"
      ."OPTICAL"
      [Cg1po
      \011
      ,BEGIN
      ,h_key( C1po_dut, C1po_dut, Cee_dut );
      ,h_key( Cg1po, Cg1po, Cg1pe );
216   ,erase_disp(3);
      ,gen_menu( ONE_PORTg_MENU );
      ,draw_one_port;
      ,END;
      |
      --------

["1-PORT"
202   ."ELECTRICAL"
      [Cg1pe
      \000
      ,BEGIN
      ,h_key( C1pe_dut, C1po_dut, Cee_dut );
      ,h_key( Cg1pe, Cg1po, Cg1pe );
216   ,erase_disp(3);
      ,gen_menu( ONE_PORTg_MENU );
      ,draw_one_port;
      ,END;
      --------
      " "
224   ]Cguided_invalid
      --------
      " "
224   ]Cguided_invalid
      --------
      " "
224   ]Cguided_invalid
      --------
202   "CONTINUE"
      [Cone_port_done
      ,BEGIN
220   ,h_key( C1po_dut+e_ch_bitmap(Cg1po), C1po_dut, Cee_dut );
      ,set_device_type;
      ,END;
      --------
      " "
224   ]Cguided_invalid
```

```
       _____
      |"PRIOR"
  202 |"MENU"
      |[Cglp_rtn
      |,BEGIN
  226 |,erase_disp(3);
      |,gen_menu( GUIDED_MENU );
      |,draw_meas_type;
      |,END;
       _____
       *EJECT*******
  300 .CONFIGgf_MENU
       _____
       " "
  320 ]Cguided_invalid
       _____
       " "
  320 ]Cguided_invalid
       _____
       " "
  320 ]Cguided_invalid
       _____
       " "
  320 ]Cguided_invalid
       _____
       " "
  320 ]Cguided_invalid
       _____
  302 "CONTINUE"
      |[Cgfconfig
      |,BEGIN
  322 |,guided_preset;
      |,gen_menu( STIMgf_MENU );
      |,IF meas_domain = ee_domain THEN
      |,    guided_instruct( ins_stimf )
  324 |, ELSE
      |,    guided_instruct( ins_stimmf );
      |,END;
       _____
       " "
  320 ]Cguided_invalid
       _____
  302 "PRIOR"
      "MENU"
      |,select_meas_type;
  318 |[Cgfconf_rtn
       _____
       *EJECT*******
  400 .STIMgf_MENU
       _____
  402 "START"
      |[Cgfstart
      |,BEGIN
  418 |,sel_act_tsw(active_start);
      |,END;
       _____
```

```
402 "STOP"
     [Cgfstop
418  ,BEGIN
     ,sel_act_tsw(active_stop);
     ,END;
     --------
     ""

426 ]Cguided_invalid
     --------
     ""

426 ]Cguided_invalid
     --------
     ""

426 ]Cguided_invalid
     --------
402 "CONTINUE"
     [Cstimgf
     ,BEGIN
     ,gen_menu(POWERgf_MENU);
428  ,guided_instruct( ins_power );
     ,END;
     --------
     ""

426 ]Cguided_invalid
     --------
402 ["PRIOR"
    ["MENU"
     [^CONFIGgf_MENU
     ,BEGIN
     ,erase_disp(3);
424  ,draw_config;
     ,END;
     [Cgfstim_rtn
     --------
     *EJECT*******
500  .POWERgf_MENU
     --------
502 ["SWEEP"
    ["TIME"
     [Cgsweep_time
518  ,BEGIN
     ,select_act_fcn( active_sweep_time );
     ,END;
     --------
502 ["SOURCE"
    ["POWER"
     [Cgf_power
     ,BEGIN
518  ,select_act_fcn( active_source_power );
     ,END;
     --------
502 ["SWEEP TYPE"
     sk_sweep_type
     ?
     [^SWEEPgf_8702_MENU
518  ,guided_instruct( ins_sweep );
     --------
     ""
```

```
526 ]Cguided_invalid
    --------
    ""
526 ]Cguided_invalid
    --------
502 "CONTINUE"
    [Cpowergf
    ,BEGIN
528 ,select_cal_domain;
    ,END;
    --------
    ""
526 ]Cguided_invalid
    --------
502 "PRIOR"
    "MENU"
    ,BEGIN
    ,gen_menu(STIMgf_MENU);
    ,IF meas_domain = ee_domain THEN
    ,    guided_instruct( ins_stimf )
524 , ELSE
    ,    guided_instruct( ins_stimmf );
    ,END;
    --------

*EJECT*******
    .SWEEPgf_8702_MENU
    --------
    "LIN FREQ"
    ]Clin_freq
    |
    --------
    "LOG FREQ"
    ]Clog_freq
    --------
    ""
    ]Cguided_invalid
    --------
    ""
    ]Cguided_invalid
518 --------
    ""
    ]Cguided_invalid
    --------
    "CONTINUE"
    ]Cpowergf
    --------
    ""
    ]Cguided_invalid
    --------
    "PRIOR"
    "MENU"
    ^POWERgf_MENU
    ,guided_instruct( ins_power );
    --------
```

```
       *EJECT******
600    .CALgoo_MENU
       --------
602   ┌"CAL TYPE:"
      │"NONE"
  -   │\011
      │[Cgcal_none
618   │,h_on( Cgcal_none, Cgcal_resp );
      └|
       --------
602    "RESPONSE"
         \000
      ┌[Cgcal_resp
618   │,h_on( Cgcal_none, Cgcal_resp );
      └
       ""
626    ]Cguided_invalid
       --------
602   ┌"CAL KIT"
      │sk_opt_kit
      │?
      │[Cckgoo
      │,BEGIN
      │,IF e_ch_bit( Cgrefl ) THEN
      │,    BEGIN
      │,    gen_menu( KITgoo_MENU );
618   │,    guided_instruct( ins_okit );
      │,    END
      │,ELSE
      │,    BEGIN
      │,    gen_menu( KITgtoo_MENU );
      │,    guided_instruct( ins_tokit );
      │,    END;
      │,END;
      └
       --------
       ""
626    ]Cguided_invalid
       --------
602    "CONTINUE"
620    ,,select_guided_cal;
628    --------
       ""
626    ]Cguided_invalid
       --------
602   ┌"PRIOR"
      └"MENU"
      ┌[Cgcal_prior
      │,BEGIN
      │,IF g_meas_type = g_power THEN
      │,    BEGIN
      │,    gen_menu( POWERgp_MENU );
      │,    guided_instruct( ins_cw );
      │,    END
624   │,ELSE
      │,    BEGIN
      │,    gen_menu( POWERgf_MENU );
      │,    guided_instruct( ins_power );
      │,    END;
      │,END;
      └
```

```
       *EJECT*******
600  .CALgroo_MENU
     --------
602 ⎡"CAL TYPE:"
    ⎣"NONE"
618 ⎤Cgcal_none
    ⎦
    --------
602  "RESPONSE"
618 ]Cgcal_resp
    --------
     " "
626 ]Cguided_invalid
    --------
602 ⎡"CAL KIT"
    ⎢sk_opt_kit
    ⎣?
618 ]Cckgoo
    --------
     " "
626 ]Cguided_invalid
    --------
602  "CONTINUE"
628 ,select_guided_cal;
    --------
602 ⎡"DONE:"
    ⎢sk_cal_type
    ⎣?
    ⎡Cgcal_keep
    ⎢,BEGIN
634 ⎢,gen_menu( FINALg_MENU );
    ⎢,guided_instruct( ins_final );
    ⎣,END;
    --------
602 ⎡"PRIOR"
    ⎣"MENU"
624 ]Cgcal_prior
    --------

*EJECT*******
600  .CALgee_MENU
     --------
602 ⎡"CAL TYPE:"
    ⎣"NONE"
618 ]Cgcal_none --------
602  "RESPONSE"
618 ]Cgcal_resp
    --------
     " "
626 ]Cguided_invalid
    --------
602 ⎡"CAL KIT"
    ⎢sk_cal_kit
    ⎣?
```

```
      [Cckgee
      ,BEGIN
618   ,gen_menu( KITgee_MENU );
      ,guided_instruct( ins_ekit );
      ,END;
      --------
      " "
626   ]Cguided_invalid
      --------
      "CONTINUE"
      ,select_guided_cal;
      --------
      " "
626   ]Cguided_invalid
      --------
602   "PRIOR"
      "MENU"
624   ]Cgcal_prior
      --------

*EJECT*******
600   .CALgree_MENU
      --------
602   "CAL TYPE:"
      "NONE"
618   ]Cgcal_none --------
602   "RESPONSE"
618   ]Cgcal_resp
      --------
      " "
626   ]Cguided_invalid
      --------
602   "CAL KIT"
      sk_cal_kit
618   ?
      ]Cckgee
      --------
      " "
626   ]Cguided_invalid
      --------
602   "CONTINUE"
628   ,select_guided_cal;
      --------
602   "DONE:"
      sk_cal_type
      ?
634   ]Cgcal_keep
      --------
602   "PRIOR"
      "MENU"
624   ]Cgcal_prior
      --------
```

```
     *EJECT*******
600  .CALgeo_MENU
     --------
602 ["CAL TYPE:"
    |"NONE"
618 ]Cgcal_none
    |
    |--------
602  "RESPONSE"
618  ]Cgcal_resp
     --------
     " "
626  ]Cguided_invalid
     --------
602 ["CAL STD"
    |sk_src_kit
    |?
    [Cckgeo
    ,BEGIN
618 ,gen_menu( KITgeo_MENU );
    ,guided_instruct( ins_skit );
    ,END;
     --------
     " "
626  ]Cguided_invalid
     --------
602  "CONTINUE"
     ,select_guided_cal;
628  --------
     " "
626  ]Cguided_invalid
     --------
602 ["PRIOR"
    |"MENU"
624 ]Cgcal_prior
    --------

*EJECT*******
600  .CALgreo_MENU
     --------
602 ["CAL TYPE:"
    |"NONE"
618  ]Cgcal_none
     |
     --------
602  "RESPONSE"
618  ]Cgcal_resp
     --------
     " "
626  ]Cguided_invalid
     --------
602 ["CAL STD"
    |sk_src_kit
    |?
618  ]Cckgeo
     --------
     " "
626  ]Cguided_invalid
     --------
```

```
602  "CONTINUE"
628  ,select_guided_cal;
     --------
602 ┌"DONE:"
    │sk_cal_type
    │?
634 ┘Cgcal_keep
     --------
    ┌"PRIOR"
602 │"MENU"
624 ┘Cgcal_prior
     --------
     *EJECT*******
600  .CALgoe_MENU
     --------
602 ┌"CAL TYPE:"
    └"NONE"
618 ┘Cgcal_none
     │
     --------
602  "RESPONSE"
618 ┘Cgcal_resp
     --------
     ""
626 ]Cguided_invalid
     --------
602 ┌"CAL STD"
    │sk_rcvr_kit
    │?
    ┌Cckgoe
    │,BEGIN
618 │,gen_menu( KITgoe_MENU );
    │,guided_instruct( ins_rkit );
    └,END;
     --------
     ""
626 ]Cguided_invalid
     --------
602  "CONTINUE"
628  ,select_guided_cal;
     --------
     ""
626 ]Cguided_invalid
     --------
602 ┌"PRIOR"
602 │"MENU"
624 ┘Cgcal_prior
     --------
     *EJECT*******
600  .CALgroe_MENU
     --------
602 ┌"CAL TYPE:"
    └"NONE"
618  ]Cgcal_none
     │
     --------
602  "RESPONSE"
618  ]Cgcal_resp
     --------
```

```
       " "
626   ]Cguided_invalid
      --------
602  ┌"CAL STD"
     │sk_rcvr_kit
     │?
618   ]Cckgoe
      --------
      " "
626   ]Cguided_invalid
      --------
602   "CONTINUE"
628   ,select_guided_cal;
      --------
602  ┌"DONE:"
     │sk_cal_type.
     │?
634   ]Cgcal_keep
      --------
602  ┌"PRIOR"
     │"MENU"
624   ]Cgcal_prior
      --------
    *EJECT*******
    .KITgee_MENU
    --------
    "CAL KIT:"
    "7mm"
    ]Cck7mm
    |
    --------
    "3.5mm"
    ]Cck35mm
    |
    --------
    "N 50"+oh
    ]CckN50
    |
    --------
    "N 75"+oh
    ]CckN75
    |
    --------
618 "USER KIT"
    ]Cckud
    --------
    "CONTINUE"
    ,BEGIN
    ,h_key( Cgcal_resp, Cgcal_none, Cgcal_resp );
    ,select_guided_cal;
    ,END;
    --------
    " "
    ]Cguided_invalid
    --------
    "PRIOR"
    "MENU"
    ^CALgee_MENU
```

```
,BEGIN
,set_gstd_class;
,guided_instruct( ins_ecal );
,END;
--------
*EJECT*******
.KITgoo_MENU
--------
"CAL KIT:"
"STD KIT"
]Cckopt
|
--------
"USER KIT"
]Cckud_opt
--------
"DEFINE STD"
"FRESNEL"
[Cgdef_fresnel
,BEGIN
,define_std( std_fresnel );
,select_act_fcn( a_refl_power_opt );
,END;
--------
"DEFINE STD"
"REFELCTOR"
[Cgdef_refl
,BEGIN
,define_std( std_refl );
,select_act_fcn( a_refl_power_opt );
,END;
--------
"SAVE"
"USER KIT"
]Cstoptuck
--------
"CONTINUE"
,BEGIN
,h_key( Cgcal_resp, Cgcal_none, Cgcal_resp );
,select_guided_cal;
,END;
--------
""
]Cguided_invalid
--------
"PRIOR"
"MENU"
^CALgoo_MENU
,BEGIN
,set_gstd_class;
,guided_instruct( ins_ocal );
,END;
--------
*EJECT*******
.KITgtoo_MENU
--------
"CAL KIT:"
"STD KIT"
```

618

```
]Cckopt
|
--------
"USER KIT"
]Cckud_opt
--------
""
]Cguided_invalid
--------
""
]Cguided_invalid
--------
""
]Cguided_invalid
--------
"CONTINUE"
,BEGIN
,h_key( Cgcal_resp, Cgcal_none, Cgcal_resp );
,select_guided_cal;
,END;
--------
""
]Cguided_invalid
--------
"PRIOR"
"MENU"
^CALgoo_MENU
,BEGIN
,set_gstd_class;
,guided_instruct( ins_ocal );
,END;
--------
*EJECT*******
.KITgoe_MENU
--------
"CAL STD:"
"RCVR DISC"
]Cckrcvr
|
--------
"RCVR COEFF"
]Cckud_rcvr
--------
""
]Cguided_invalid
--------
"LOAD"
"RCVR DISC"
[Cgload_rcvr
^LOADg_RCVR_MENU
,guided_instruct( ins_rload );
--------
"ENTER"
"RCVR COEFF"
[Cgdef_rcvr
^DEFg_RCVR_MENU
,BEGIN
,define_std( std_u_rcvr );
```

```
,guided_instruct( ins_rcoeff );
,END;
--------
"CONTINUE"
,BEGIN
,h_key( Cgcal_resp, Cgcal_none, Cgcal_resp );
,select_guided_cal;
,END;
--------
" "
]Cguided_invalid
--------
"PRIOR"
"MENU"
^CALgoe_MENU
,BEGIN
,set_gstd_class;
,guided_instruct( ins_rcal );
,END;
--------
*EJECT*******
.LOADg_RCVR_MENU
--------
"SYSTEM"
"CONTROLLER"
]CIB_control
--------
"READ FILE"
"TITLES"
]Ccrtitl
--------
"LOAD"
sk_regext1
?
]Cload_cr1
--------
"LOAD"
sk_regext2
?
]Cload_cr2
--------
"LOAD"
sk_regext3
?
]Cload_cr3
--------
"LOAD"
sk_regext4
?
]Cload_cr4
--------
"LOAD"
sk_regext5
?
]Cload_cr5
--------
"PRIOR"
"MENU"
```

```
[Cloadg_rtn
^KITgoe_MENU
,guided_instruct( ins_rkit );
--------
*EJECT*******
.DEFg_RCVR_MENU
--------
"RECEIVER:"
"COEFF A"
]Cacoeff
--------
"COEFF B"
]Cbcoeff
--------
"COEFF C"
]Cccoeff
--------
"COEFF D"
]Cdcoeff
--------
"COEFF E"
]Cecoeff
--------
"MORE"
"(F - I)"
^DEFg_RCVR_MORE_MENU
,guided_instruct( ins_rcoeff_more );
--------
"SAVE"
"RCVR COEFF"
]Cstrcvruck
--------
"PRIOR"
"MENU"
^KITgoe_MENU
,guided_instruct( ins_rkit );
--------
*EJECT*******
.DEFg_RCVR_MORE_MENU
--------
"RECEIVER:"
"COEFF F"
]Cfcoeff
--------
"COEFF G"
]Cgcoeff
--------
"COEFF H"
]Chcoeff
--------
"COEFF I"
]Cicoeff
--------
" "
]Cguided_invalid
--------
" "
]Cguided_invalid
--------
```

618 (appears twice in left margin)

```
" "
]Cguided_invalid
--------
"PRIOR"
"MENU"
^DEFg_RCVR_MENU
,guided_instruct( ins_rcoeff );
--------
*EJECT*******
.KITgeo_MENU
--------
"CAL STD:"
"SRC DISC"
]Ccksrc
|
--------
"SRC COEFF"
]Cckud_src
--------
" "
]Cguided_invalid
--------
"LOAD"
"SRC DISC"
^LOADg_SRC_MENU
,guided_instruct( ins_sload );
--------
"ENTER"
"SRC COEFF"
[Cgdef_source
^DEFg_SRC_MENU
,BEGIN
,define_std( std_u_src );
,guided_instruct( ins_scoeff );
,END;
--------
"CONTINUE"
,BEGIN
,h_key( Cgcal_resp, Cgcal_none, Cgcal_resp );
,select_guided_cal;
,END;
--------
" "
]Cguided_invalid
--------
"PRIOR"
"MENU"
^CALgeo_MENU
,BEGIN
,set_gstd_class;
,guided_instruct( ins_scal );
,END;
--------
*EJECT******
.LOADg_SRC_MENU
--------
"SYSTEM"
```

618

```
|"CONTROLLER"
]CIB_control
--------
"READ FILE"
"TITLES"
]Ccstitl
--------
"LOAD"
sk_regext1
?
]Cload_cs1
--------
"LOAD"
sk_regext2
?
]Cload_cs2
--------
"LOAD"
sk_regext3
?
]Cload_cs3
--------
"LOAD"
sk_regext4
?
]Cload_cs4
--------
"LOAD"
sk_regext5
?
]Cload_cs5
--------
"PRIOR"
"MENU"
^KITgeo_MENU
,guided_instruct( ins_skit );
--------
*EJECT*******
.DEFg_SRC_MENU
--------
"SOURCE:"
"COEFF A"
]Cacoeff
--------
"COEFF B"
]Cbcoeff
--------
"COEFF C"
]Cccoeff
--------
"COEFF D"
]Cdcoeff
--------
"COEFF E"
]Cecoeff
--------
"MORE"
"(F - I)"
```

```
^DEFg_SRC_MORE_MENU
,guided_instruct( ins_scoeff_more );
--------
"SAVE"
"SRC COEFF"
]Cstsrcuck
--------
"PRIOR"
"MENU"
^KITgeo_MENU
,guided_instruct( ins_skit );
--------
*EJECT*******
.DEFg_SRC_MORE_MENU
--------
"SOURCE:"
"COEFF F"
]Cfcoeff
--------
"COEFF G"
]Cgcoeff
--------
"COEFF H"
]Chcoeff
--------
618  "COEFF I"
]Cicoeff
--------
" "
]Cguided_invalid
--------
" "
]Cguided_invalid
--------
" "
]Cguided_invalid
--------
"PRIOR"
"MENU"
^DEFg_SRC_MENU
,guided_instruct( ins_scoeff );
--------
    *EJECT*******
700  .STDg_MENU
--------
     " "
702  sk_gstd1
     \000
     ?
     [Cgstd1
718  ,set_gelement( 1 );
--------
     " "
702  sk_gstd2
     \000
     ?
     [Cgstd2
718  ,set_gelement( 2 );
--------
```

```
       ┌" "
       │sk_gstd3
702    │\000
       │?
       └
       ┌[Cgstd3
718    │,set_gelement( 3 );
       └
       --------
       ┌" "
       │sk_gstd4
702    │\000
       │?
       └
       ┌[Cgstd4
718    │,set_gelement( 4 );
       └
       --------
       ┌" "
       │sk_gstd5
702    │\000
       │?
       └
       ┌[Cgstd5
718    │,set_gelement( 5 );
       └
       --------
702    ┌"DONE:"
       │"RESPONSE"
       └
       ┌[Cgcal_done
       │,BEGIN
720    │,gcal_done;
       │,END;
       └
       --------
       " "
726    ]Cguided_invalid
       --------
702    ┌"PRIOR"
       │"MENU"
       └
724    ,select_cal_domain;
       --------
       *EJECT*******
300    .CONFIGgp_MENU
       --------
       " "
320    ]Cguided_invalid
       --------
       " "
320    ]Cguided_invalid
       --------
       " "
320    ]Cguided_invalid
       --------
       " "
320    ]Cguided_invalid
       --------
       " "
320    ]Cguided_invalid
       --------
302    "CONTINUE"
       ┌[Cgpconfig
       │,BEGIN
322    │,guided_preset;
```

```
     ,gen_menu( STIMgp_MENU );
 324 ,guided_instruct( ins_stimp );
     ,END;

""
 320 ]Cguided_invalid

302 "PRIOR"
     "MENU"
     ,select_meas_type;
 318 [Cgpconf_rtn

*EJECT*******
 400 .STIMgp_MENU

402 "START"
     "POWER"
     [Cgp_start
     ,BEGIN
 418 ,sel_act_tsw(active_start);
     ,END;

402 "STOP"
     "POWER"
     [Cgp_stop
     ,BEGIN
 418 ,sel_act_tsw(active_stop);
     ,END;

""
 426 ]Cguided_invalid

""
 426 ]Cguided_invalid

""
 426 ]Cguided_invalid

402 "CONTINUE"
     [Cstimgp
     ,BEGIN
     ,gen_menu(POWERgp_MENU);
 428 ,guided_instruct( ins_cw );
     ,END;

""
 426 ]Cguided_invalid

402 "PRIOR"
     "MENU"
     [CONFIGgp_MENU
     ,BEGIN
     ,erase_disp(3);
 424 ,draw_config;
     ,END;
     [Cgpstim_rtn
```

```
500  .POWERgp_MENU
     --------
502 ["SWEEP"
    ["TIME"
518 ]Cgsweep_time
     --------
502 ["CW"
    ["FREQUENCY"
    [Cgp_cw_freq
    ,BEGIN
518 ,sel_act_tsw( active_cw );
    ,END;
     --------
    ""
526 ]Cguided_invalid
     --------
    ""
526 ]Cguided_invalid
     --------
    ""
526 ]Cguided_invalid
     --------
502 "CONTINUE"
    [Cpowergp
    ,BEGIN
    ,select_cal_domain;
528 ,END;
     --------
    ""
526 ]Cguided_invalid
     --------
502 ["PRIOR"
    ["MENU"
    [,BEGIN
    ,gen_menu(STIMgp_MENU);
524 ,guided_instruct( ins_stimp );
    ,END;
     --------
*EJECT******
800  .FINALg_MENU
     --------
802 ."FORMAT"
    [^FORMATg_MENU
818 ,guided_instruct( ins_format );
     --------
802 ["SCALE"
    ["REF "
    ^SCALEg_MENU
818 ,guided_instruct( ins_scale );
     --------
802 "COPY"
    [^COPYg_MENU
818 ,guided_instruct( ins_copy );
     --------
802 "SAVE"
    [^SAVEg_MENU
818 ,guided_instruct( ins_save );
     --------
```

```
826  ]Cguided_invalid
     ─────────
802  "GUIDED"
     "SETUP"
     ,BEGIN
     ,erase_disp(3);
828  ,gen_menu( GUIDED_MENU );
     ,draw_meas_type;
     ,END;
     ─────────
802  "NORMAL"
     "OPERATION"
814  ]Cnorm_oper
     ─────────
802  "PRIOR"
     "MENU"
824  ,BEGIN
     ,select_cal_domain;
     ,END;
     ─────────
     *EJECT*******
     .FORMATg_MENU
     ─────────
     "LOG MAG"
     ]Cmag ─────────
     "LIN MAG"
     ]Clinear_mag ─────────
     "PHASE"
     ]Cphase ─────────
818  "DELAY"
     ]Cdelay
     ─────────
     " "
     ]Cguided_invalid
     ─────────
     " "
     ]Cguided_invalid
     ─────────
     " "
     ]Cguided_invalid
     ─────────
     "PRIOR"
     "MENU"
     ^FINALg_MENU
     ,guided_instruct( ins_final );
     ─────────
     *EJECT*******
     .SCALEg_MENU
     ─────────
     "AUTO SCALE"
     ]Cauto_scale
     ─────────
```

```
     "SCALE/DIV"
     [Cscaleg
    ,   select_act_fcn(active_scale);
     --------
     "REFERENCE"
     "POSITION"
     ]Cref_pos
     --------
     "REFERENCE"
818  "VALUE"
     ]Cref_val
     --------
     " "
     ]Cguided_invalid
     --------
     " "
     ]Cguided_invalid
     --------
     " "
     ]Cguided_invalid
     --------
     "PRIOR"
     "MENU"
     ^FINALg_MENU
     ,guided_instruct( ins_final );
     --------
     *EJECT********
     .COPYg_MENU
     --------
     "SYSTEM"
     "CONTROLLER"
     ]CIB_control
     --------
     " "
     ]Cguided_invalid
     --------
     "PRINT"
     ]Cpr_all
     --------
     "PLOT"
818  ]Cplot_all
     --------
     " "
     ]Cguided_invalid
     --------
     " "
     ]Cguided_invalid
     --------
     " "
     ]Cguided_invalid
     --------
     "PRIOR"
     "MENU"
     ^FINALg_MENU
     ,guided_instruct( ins_final );
     --------
```

```
*EJECT********
.SAVEg_MENU
--------
"SAVE"
sk_reg1
?
]Csave_1
--------
"SAVE"
sk_reg2
?
]Csave_2
--------
"SAVE"
sk_reg3
?
]Csave_3
--------
"SAVE"
sk_reg4
?
]Csave_4
--------
"SAVE"
sk_reg5
?
]Csave_5
--------
" "
]Cguided_invalid
--------
" "
]Cguided_invalid
--------
"PRIOR"
"MENU"
[Cguided_end
^FINALg_MENU
,guided_instruct( ins_final );
--------
```

818

As shown in FIG. 3, when the "GUIDED SETUP" softkey is depressed, the guided setup mode begins by directing the user to select the type of measurement desired, as indicated by the numeral 100. The analyzer 12 directs the user to select the type of measurement desired by calling and executing a select measurement type subroutine 100, as shown in more detail in FIG. 4.

The select measurement type subroutine 100 causes the analyzer 12 to display a new softkey menu and labels the softkeys, as indicated by the numeral 102. These softkey labels can be "BANDWIDTH," "REFLECTION," and "GAIN COMPRESS'N," as shown in FIG. 2B. "CONTINUE" and "NORMAL OPERATION" softkeys are also preferably displayed in order to enable the user to proceed with the guided setup mode or exit to normal operation, respectively.

Figure 4:
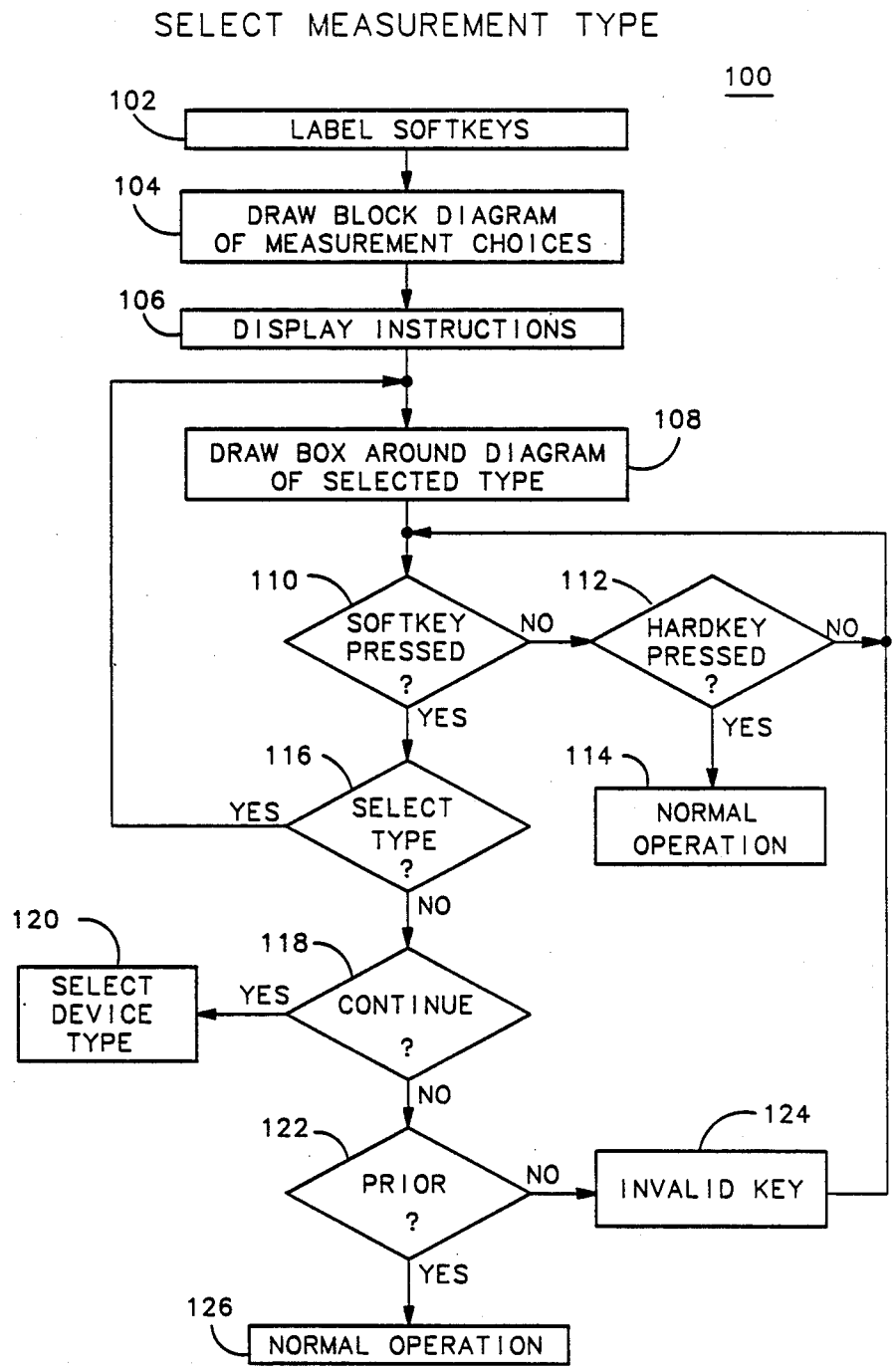
FIG. 4 is a detailed flowchart for selecting a measurement type in accordance with the flow diagram shown in FIG. 3.

Also, the analyzer 12 displays a block diagram of each of the measurement choices, as indicated by the numeral 104 shown in FIG. 4. Representative block diagrams for bandwidth, reflection, and gain compression measurements are shown in FIG. 2B.

The analyzer 12 additionally displays textual instructions to the user, as indicated by the numeral 106 shown in FIG. 4. For example, the instruction in connection with selecting the measurement type can be "SELECT TYPE OF MEASUREMENT," as shown in FIG. 2B.

Preferably, the analyzer 12 is given a predetermined set of default conditions, including a measurement type default condition. Accordingly, when the select measurement type subroutine 100 is executed, the analyzer 12 preferably defaults to the bandwidth measurement, and draws a box around the diagram of this measurement type, as indicated by the numeral 108, to show the default measurement.

The analyzer 12 determines whether or not a softkey is depressed, as indicated by the numeral 110, or, alternatively, whether or not a hardkey is depressed, as indicated by the numeral 112. On the one hand, if the user has depressed a hardkey, the analyzer 12 exits the guided setup mode and proceeds to normal operation, as indicated by the numeral 114.

On the other hand, if the user has depressed a softkey, as indicated by the step 110, the analyzer 12 determines whether or not the user has depressed a measurement selection softkey, as indicated by the numeral 116. If so, the analyzer 12 draws a box around the diagram of the selected measurement type, as indicated by the step 108.

If the user has depressed a softkey other than a measurement selection softkey, the analyzer 12 determines whether or not to continue with the guided setup mode, as indicated by the numeral 118. On the one hand, if the user depresses the "CONTINUE" softkey, as indicated by the step 118, the analyzer 12 calls a select device type subroutine, as indicated by the numeral 120.

On the other hand, if the user depresses the "NORMAL OPERATION" softkey, the analyzer 12 exits the guided setup mode and proceeds to normal operation, as indicated by the numeral 126. Any softkey actuation other than a specifically mentioned one causes the analyzer 12 to inform the user that an invalid key has been depressed, as indicated by the numeral 124, and await depression of an allowed softkey.

If the user completes the select measurement type subroutine 100 by depressing the "CONTINUE" softkey after selecting a measurement type, as indicated by the step 118 shown in FIG. 4, the analyzer 12 directs the user to designate the type of device under test by calling and executing the select device type subroutine 200, as indicated by the numeral 200 shown in FIG. 3. The select device type subroutine 200 is shown in more detail in FIG. 5.

The select device type subroutine 200 causes the analyzer 12 to display a new softkey menu and labels the softkeys, as indicated by the numeral 202. These softkey labels can be "O/O," "O/E," "E/O," "E/E," "1-PORT OPTICAL," and "1-PORT ELECTRICAL," as shown in FIGS. 2C and 2D. "CONTINUE" and "PRIOR MENU" softkeys are also preferably displayed in order to enable the user to proceed with the guided setup mode or return to the previous menu for the select measurement type subroutine 100, respectively.

Figure 5:
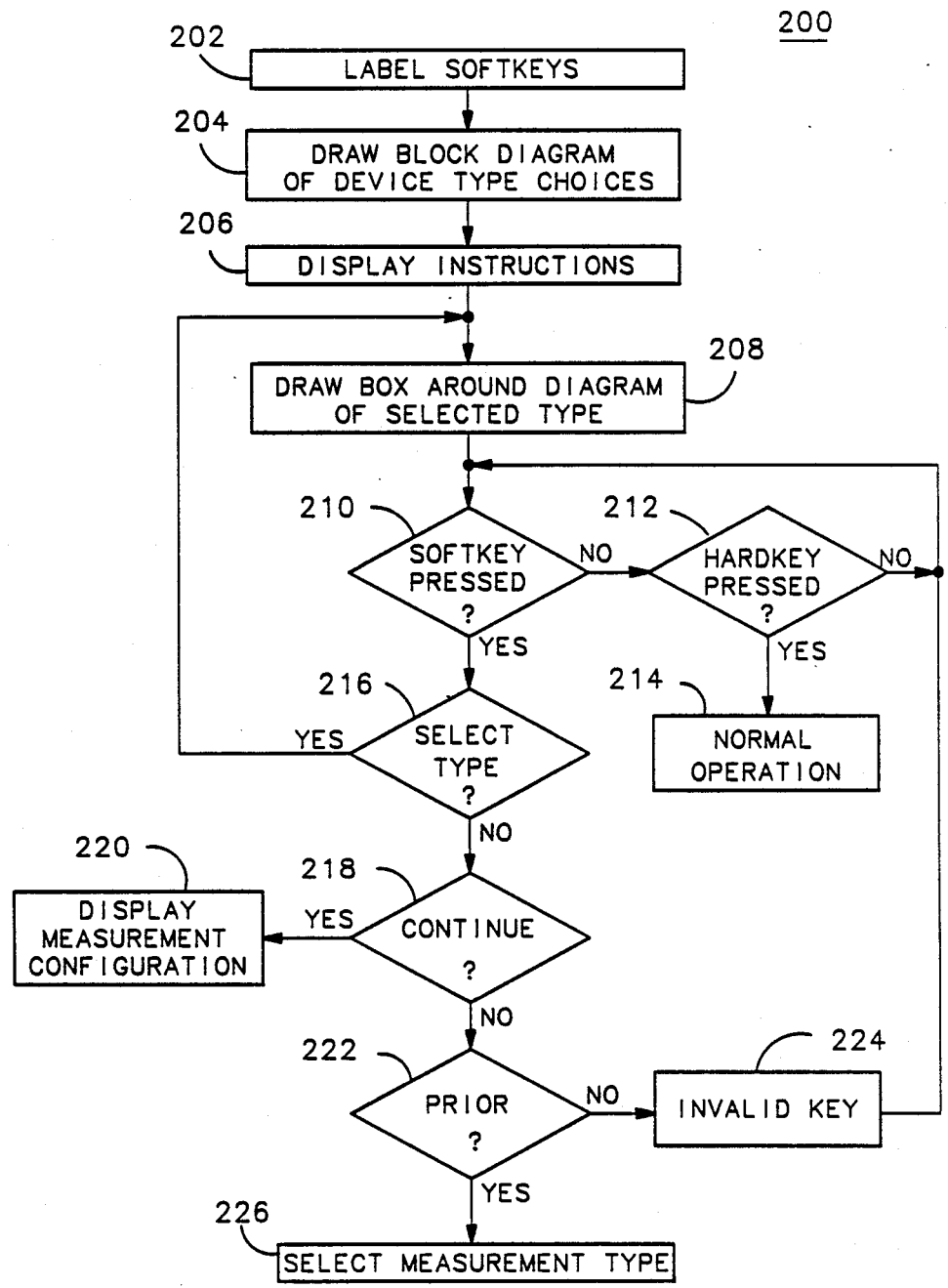
FIG. 5 is a detailed flowchart for designating a device type in accordance with the flow diagram shown in FIG. 3.

Also, the analyzer 12 displays a block diagram of each of the device type choices, as indicated by the numeral 204 shown in FIG. 5. Representative block diagrams for O/O, O/E, E/O, E/E, one-port optical, and one-port electrical devices are shown in FIGS. 2C and 2D.

The analyzer 12 additionally displays textual instructions to the user, as indicated by the numeral 206 shown in FIG. 5. For example, the instruction in connection with selecting the device type can be "SELECT TYPE OF DEVICE UNDER TEST," as shown in FIGS. 2C and 2D.

Preferably, the analyzer 12 is given a predetermined set of default conditions, including a device type default condition. Accordingly, when the select device type subroutine 200 is executed, the analyzer 12 preferably defaults to an O/O type device measurement, and draws a box around the diagram of the O/O device type, as indicated by the numeral 208, to show the default device type.

The analyzer 12 determines whether or not a softkey is depressed, as indicated by the numeral 210, or, alternatively, whether or not a hardkey is depressed, as indicated by the numeral 212. On the one hand, if the user has depressed a hardkey, the analyzer 12 exits the guided setup mode and proceeds to normal operation, as indicated by the numeral 214.

On the other hand, if the user has depressed a softkey, as indicated by the step 210, the analyzer 12 determines whether or not the user has depressed a device type selection softkey, as indicated by the numeral 216. If so, the analyzer 12 draws a box around the diagram of selected device type, as indicated by the step 208.

If the user has depressed a softkey other than a device type selection softkey, the analyzer 12 determines whether or not to continue with the guided setup mode, as indicated by the numeral 218. On the one hand, if the user depresses the "CONTINUE" softkey, as indicated by the step 218, the analyzer 12 calls a display measurement configuration subroutine, as indicated by the numeral 220.

On the other hand, if the user depresses the "PRIOR MENU" softkey, the analyzer 12 recalls the select measurement type subroutine 100, as indicated by the numeral 226. Any softkey actuation other than a specifically mentioned one causes the analyzer 12 to inform the user that an invalid key has been depressed, as indicated by the numeral 224, and await depression of an allowed softkey.

If the user completes the select device type subroutine 200 by depressing the "CONTINUE" softkey after selecting a device type, as indicated by the step 218 shown in FIG. 5, the analyzer 12 directs the user to make various optical and/or electrical connections for performing the selected measurement on the specified DUT by calling and executing the display measurement configuration subroutine 300, as indicated by the numeral 300 shown in FIG. 3. The display measurement configuration subroutine 300 is shown in more detail in FIG. 6.

The display measurement configuration subroutine 300 causes the analyzer 12 to display a new softkey menu and labels the softkeys, as indicated by the numeral 302. "CONTINUE" and "PRIOR MENU" softkeys are preferably displayed in order to enable the user to proceed with the guided setup mode or return to the previous menu for the select device type subroutine 200, respectively.

Figure 6:
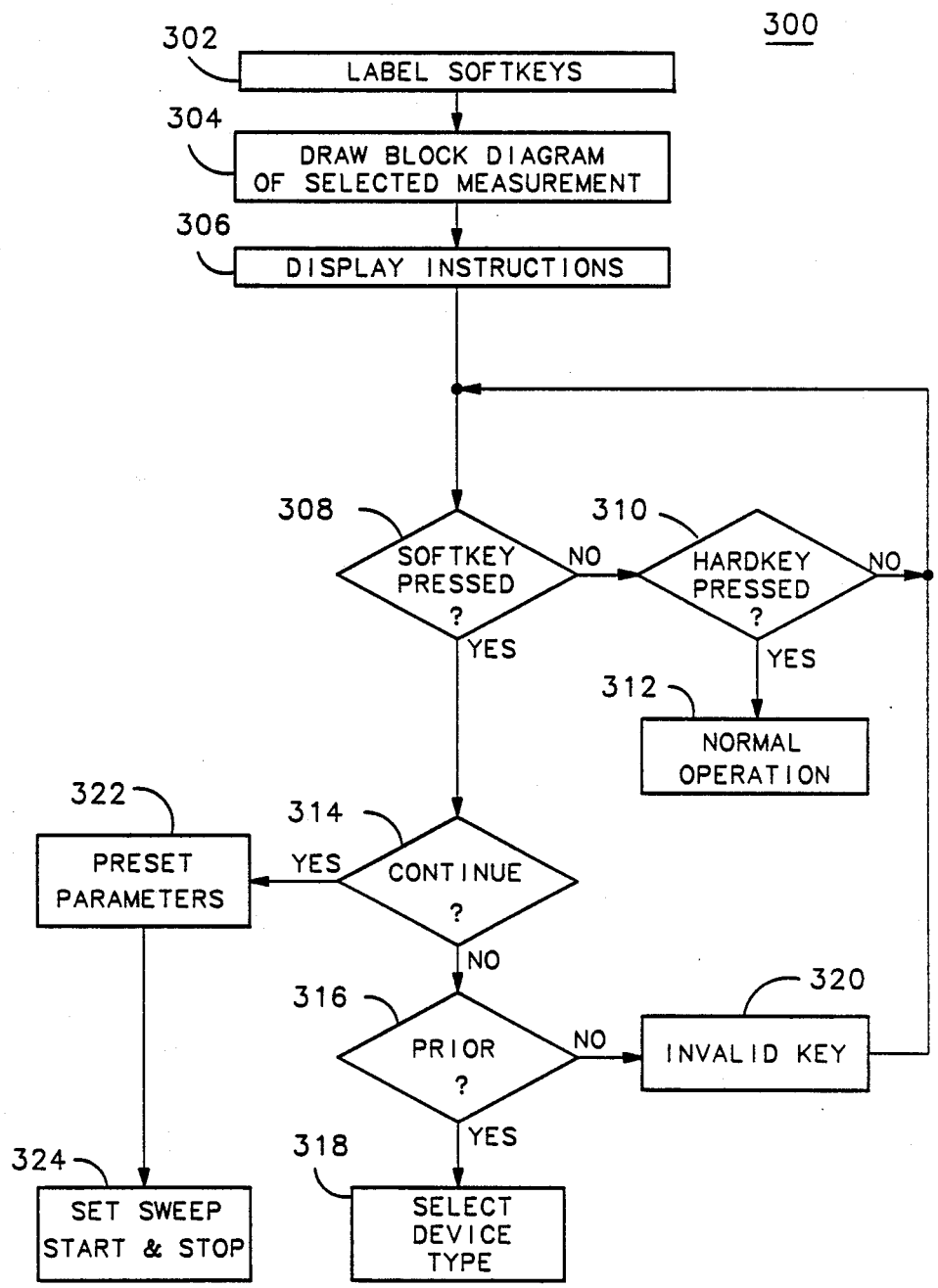
FIG. 6 is a detailed flowchart for displaying a measurement configuration in accordance with the flow diagram shown in FIG. 3.

Also, the analyzer 12 displays a block diagram of the optical and/or electrical connections to effect the selected measurement for the specified device type, as indicated by the numeral 304 shown in FIG. 6. Representative block diagrams for the respective selectable measurements for the various device types appear in FIGS. 2E–2P.

The analyzer 12 additionally displays textual instructions to the user, as indicated by the numeral 306 shown in FIG. 6. For example, the instruction in conjunction with exhibiting the connections for performing a selected measurement on a specified device type can be "CONFIGURE MEASUREMENT AS SHOWN BELOW" and "MAKE NECESSARY DC CONNECTIONS," as shown in FIGS. 2E-2P.

The analyzer 12 determines whether or not a softkey is depressed, as indicated by the numeral 308, or, alternatively, whether or not a hardkey is depressed, as indicated by the numeral 310. On the one hand, if the user has depressed a hardkey, the analyzer 12 exits the guided setup mode and proceeds to normal operation, as indicated by the numeral 312.

On the other hand, if the user has depressed a softkey, as indicated by the step 308, the analyzer 12 determines whether or not the user has depressed the "CONTINUE" softkey, as indicated by the numeral 314. On the one hand, if the user depresses the "CONTINUE" softkey, as indicated by the step 314, the analyzer 12 calls and automatically executes a preset parameters subroutine, as indicated by the numeral 322, and then calls a set sweep start and stop subroutine, as indicated by the numeral 324.

On the other hand, if the user depresses the "PRIOR MENU" softkey, the analyzer 12 recalls the select device type subroutine 200, as indicated by the numeral 318. Any softkey actuation other than a specifically mentioned one causes the analyzer 12 to inform the user that an invalid key has been depressed, as indicated by the numeral 320, and await depression of an allowed softkey.

The preset parameters subroutine called and executed at the step 322 shown in FIG. 6 enters various default values for the parameters associated with the selected measurement on the specified device type. These are the parametric values used by the analyzer 12 during actual testing, unless the user intervenes.

When the user depresses the "CONTINUE" softkey, as indicated by the step 314 shown in FIG. 6, the analyzer 12 calls the set sweep start and stop subroutine 400, as indicated by the numeral 400 shown in FIG. 3. The set sweep start and stop subroutine 400 is shown in more detail in FIG. 7.

The set sweep start and stop subroutine 400 causes the analyzer 12 to display a new softkey menu and labels the softkeys, as indicated by the numeral 402. These softkey labels can be "START" and "STOP," as shown in FIG. 2Q for O/O, O/E, E/O, and one-port optical swept frequency type measurements and FIG. 2R for E/E and one-port electrical swept frequency type measurements, or "START POWER" and "STOP POWER," as shown in FIG. 2S for swept power type measurements. "CONTINUE" and "PRIOR MENU" softkeys are also preferably displayed in order to enable the user to proceed with the guided setup mode or return to the previous menu for the display measurement configuration subroutine 300, respectively.

Representative screens displayed at the beginning of the set sweep start and stop subroutine 400 appear in FIGS. 2Q-2S. The analyzer 12 then sweeps and takes data using the respective default values for the sweep start and stop parameters, as indicated by the numeral 404 shown in FIG. 7, and displays the data trace and graticule, as indicated by the numeral 406.

Figure 7:
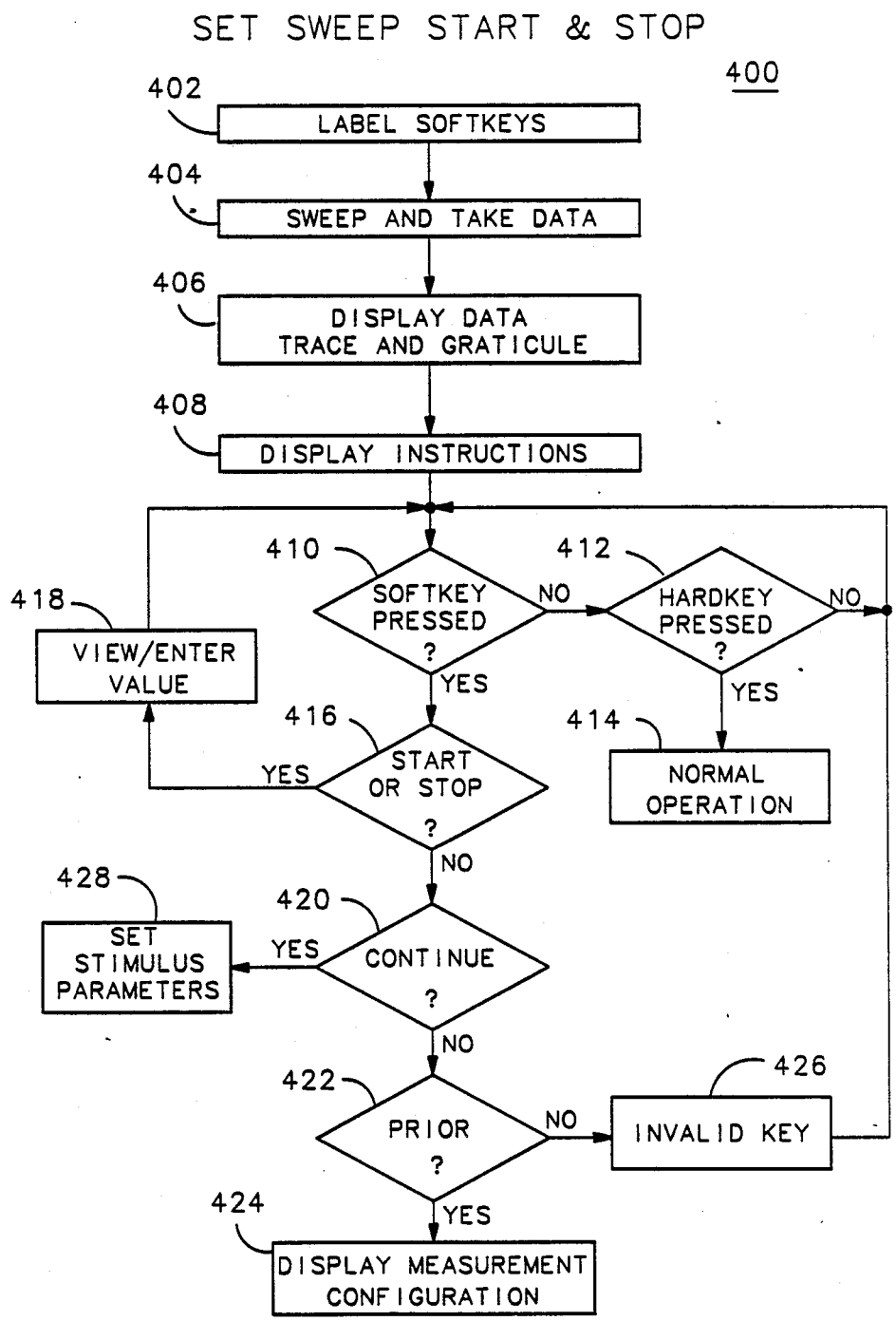
FIG. 7 is a detailed flowchart for setting sweep start and stop values in accordance with the flow diagram shown in FIG. 3.

The analyzer 12 additionally displays textual instructions to the user, as indicated by the numeral 408 shown in FIG. 7. For example, the instruction in connection with selecting the sweep start and stop parameters can be "SET RF MODULATION START FREQUENCY AND STOP FREQUENCY," as shown in FIG. 2Q; "SET RF START FREQUENCY AND STOP FREQUENCY," as shown in FIG. 2R; or "SET START POWER AND STOP POWER" and "POWER AT R, A, B INPUTS MUST BE LESS THAN 0 dBm," as shown in FIG. 2S.

The analyzer 12 determines whether or not a softkey is depressed, as indicated by the numeral 410, or, alternatively, whether or not a hardkey is depressed, as indicated by the numeral 412. On the one hand, if the user has depressed a hardkey, the analyzer 12 exits the guided setup mode and proceeds to normal operation, as indicated by the numeral 414.

On the other hand, if the user has depressed a softkey, as indicated by the step 410, the analyzer 12 determines whether or not the user has depressed the "START" or "STOP" softkey, or the "START POWER" or "STOP POWER" softkey, as the case may be, as indicated by the numeral 416. If so, the analyzer 12 enables the user to enter a substitute sweep start and/or stop parametric value, and displays the entered value(s), as indicated by the numeral 418.

If the user has depressed a softkey other than the "START" or "STOP" softkey, or the "START POWER" or "STOP POWER" softkey, as the case may be, the analyzer 12 determines whether or not to continue with the guided setup mode, as indicated by the numeral 420. On the one hand, if the user depresses the "CONTINUE" softkey, as indicated by the step 420, the analyzer 12 calls a set stimulus parameters subroutine, as indicated by the numeral 428.

On the other hand, if the user depresses the "PRIOR MENU" softkey, the analyzer 12 recalls the display measurement configuration subroutine 300, as indicated by the numeral 424. Any softkey actuation other than a specifically mentioned one causes the analyzer 12 to inform the user that an invalid key has been depressed, as indicated by the numeral 426, and await depression of an allowed softkey.

When the user depresses the "CONTINUE" softkey, as indicated by the step 420 shown in FIG. 7, the analyzer 12 calls the set stimulus parameters subroutine 500, as indicated by the numeral 500 shown in FIG. 3. The set stimulus parameters subroutine 500 is shown in more detail in FIG. 8.

The set stimulus parameters subroutine 500 causes the analyzer 12 to display a new softkey menu and labels the softkeys, as indicated by the numeral 502. These softkey labels can be "SWEEP TIME," "SOURCE POWER," and "SWEEP TYPE," as shown in FIG. 2T for swept frequency type measurements. Depression of the "SWEEP TYPE" softkey provides an additional softkey menu, as shown in FIG. 2U, which includes "LIN FREQ" and "LOG FREQ" softkeys. In the case of swept power type measurements, the softkey labels can alternatively be "SWEEP TIME" and "CW FREQUENCY," as shown in FIG. 2V. "CONTINUE" and "PRIOR MENU" softkeys are also preferably displayed in order to enable the user to proceed with the guided setup mode or return to the previous menu for the set sweep start and stop subroutine 400, respectively.

Representative screens displayed at the beginning of the set stimulus parameters subroutine appear in FIGS. 2T-2V. The analyzer 12 then sweeps and takes data using the respective default values for the stimulus parameters, as indicated by the numeral 504 shown in FIG. 8, and displays the data trace and graticule, as indicated by the numeral 506.

Figure 8:
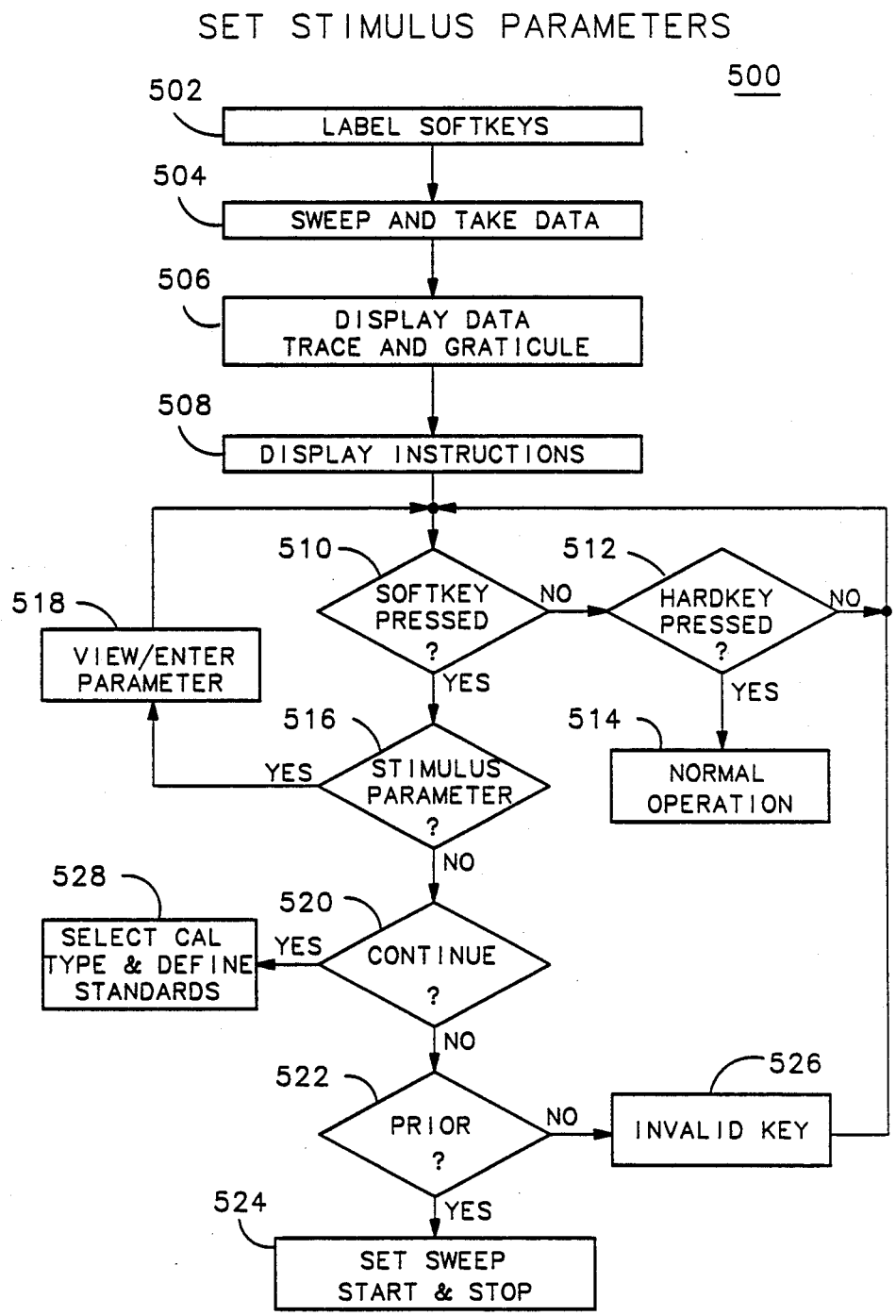
FIG. 8 is a detailed flowchart for setting stimulus parameters in accordance with the flow diagram shown in FIG. 3.

The analyzer 12 additionally displays textual instructions to the user, as indicated by the numeral 508 shown in FIG. 8. For example, the instruction in connection with selecting the sweep time can be "SET SWEEP TIME," as shown in FIGS. 2T and 2V. Other instructions displayed in connection with directing the user to set the remaining stimulus parameters appear in FIGS. 2T–2V.

The analyzer 12 determines whether or not a softkey is depressed, as indicated by the numeral 510, or, alternatively, whether or not a hardkey is depressed, as indicated by the numeral 512. On the one hand, if the user has depressed a hardkey, the analyzer 12 exits the guided setup mode and proceeds to normal operation, as indicated by the numeral 514.

On the other hand, if the user has depressed a softkey, as indicated by the step 510, the analyzer 12 determines whether or not the user has depressed one of the stimulus parameter softkeys, as indicated by the numeral 516. If so, the analyzer 12 enables the user to enter a substitute stimulus parametric value, and displays the entered value(s), as indicated by the numeral 518.

If the user has depressed a softkey other than one of the stimulus parameter softkeys, the analyzer 12 determines whether or not to continue with the guided setup mode, as indicated by the numeral 520. On the one hand, if the user depresses the "CONTINUE" softkey, as indicated by the step 520, the analyzer 12 calls a select calibration type and define standards subroutine, as indicated by the numeral 528.

On the other hand, if the user depresses the "PRIOR MENU" softkey, the analyzer 12 recalls the set sweep start and stop subroutine 400, as indicated by the numeral 524. Any softkey actuation other than a specifically mentioned one causes the analyzer 12 to inform the user that an invalid key has been depressed, as indicated by the numeral 526, and await depression of an allowed softkey.

When the user depresses the "CONTINUE" softkey, as indicated by the step 520 shown in FIG. 8, the analyzer 12 calls the set calibration type and define standards subroutine 600, as indicated by the numeral 600 shown in FIG. 3. The set calibration type and define standards subroutine 600 is shown in more detail in FIG. 9.

The set calibration type and define standards subroutine 600 causes the analyzer 12 to display a new softkey menu and labels the softkeys, as indicated by the numeral 602. In the case of O/O, E/E, one-port optical, and one-port electrical devices, these softkey labels can be "CAL TYPE: NONE," "RESPONSE," and "CAL KIT," as shown in FIG. 2W. In the case of O/E and E/O devices, the softkey labels can alternatively be "CAL TYPE: NONE," "RESPONSE," and "CAL STD," as shown in FIG. 2X. If a previous calibration has been performed, an additional "DONE: RESPONSE" softkey appears, as shown in FIG. 2X. Depression of the "CAL KIT" softkey shown in FIG. 2W, or the "CAL STD" softkey shown in FIG. 2X, provides an additional softkey menu, as shown in one of the FIGS. 2Y–2II. The particular softkey menu that is displayed is automatically determined by the analyzer 12 based on the selected type of measurement and the type of DUT. The softkey menus shown in FIGS. 2Y–2II enable selection and/or definition of a calibration standard. The softkey menu shown in FIG. 2Y enables selection of a calibration standard for an O/O device. The softkey menus shown in FIGS. 2Z–2CC enable selection and definition of a calibration standard for an O/E device. The softkey menus shown in FIGS. 2DD–2GG enable selection and definition of a calibration standard for an E/O device. The softkey menu shown in FIG. 2HH enables selection of a calibration standard for an E/E device, and a similar softkey menu enables selection of a calibration standard for a one-port electrical device. Finally, the softkey menu shown in FIG. 2II enables selection and definition of a calibration standard for a one-port optical device. "CONTINUE" and "PRIOR MENU" softkeys are also preferably displayed in order to enable the user to proceed with the guided setup mode or return to the previous menu for the set stimulus parameters subroutine 500, respectively.

Figure 2I:
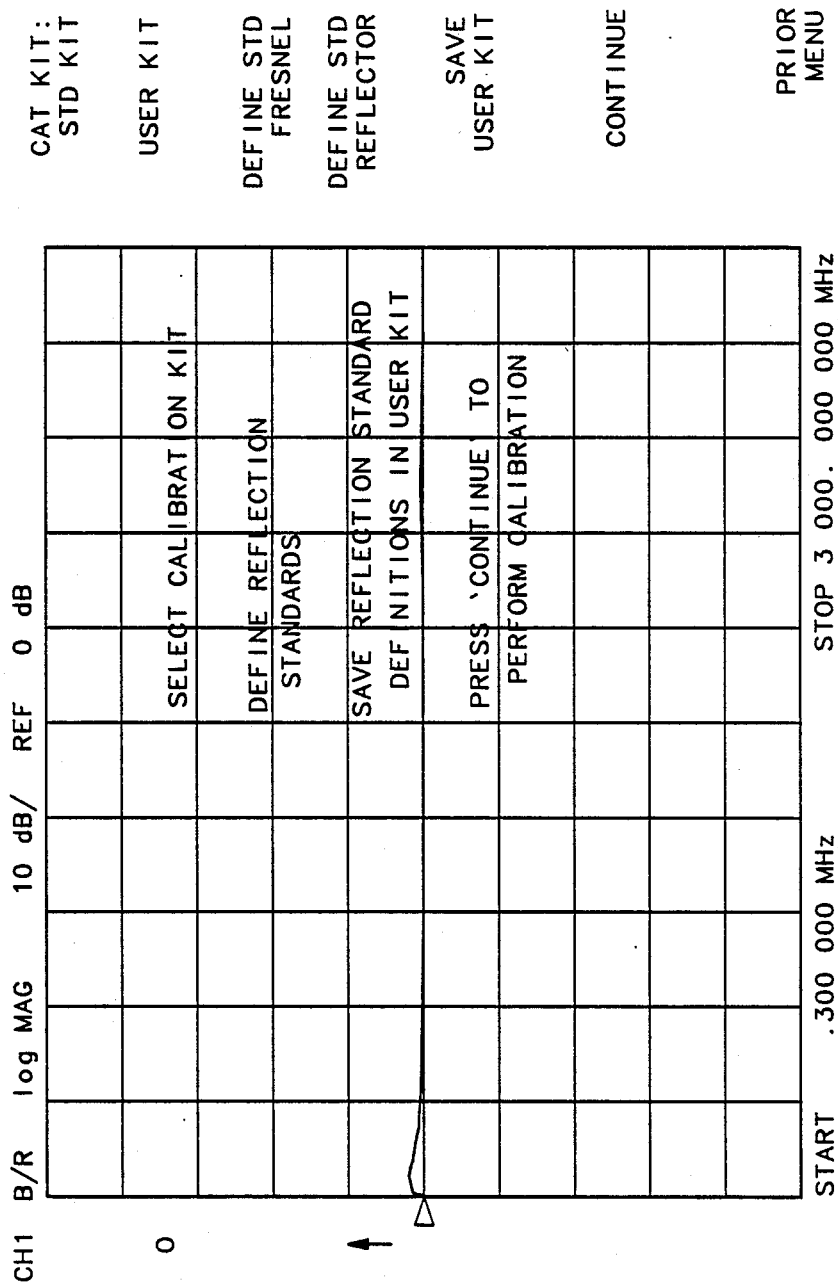
Figure 2J:
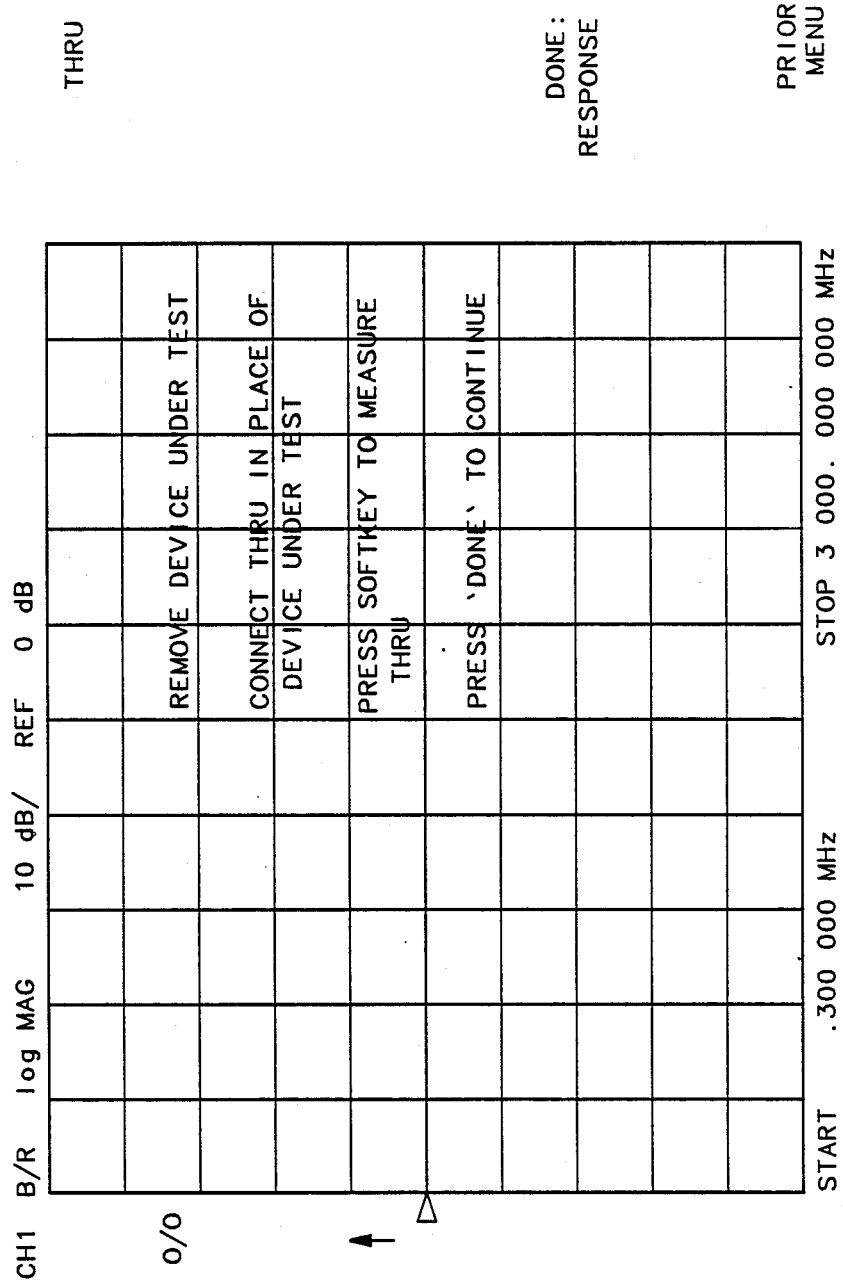
Figure 2K:
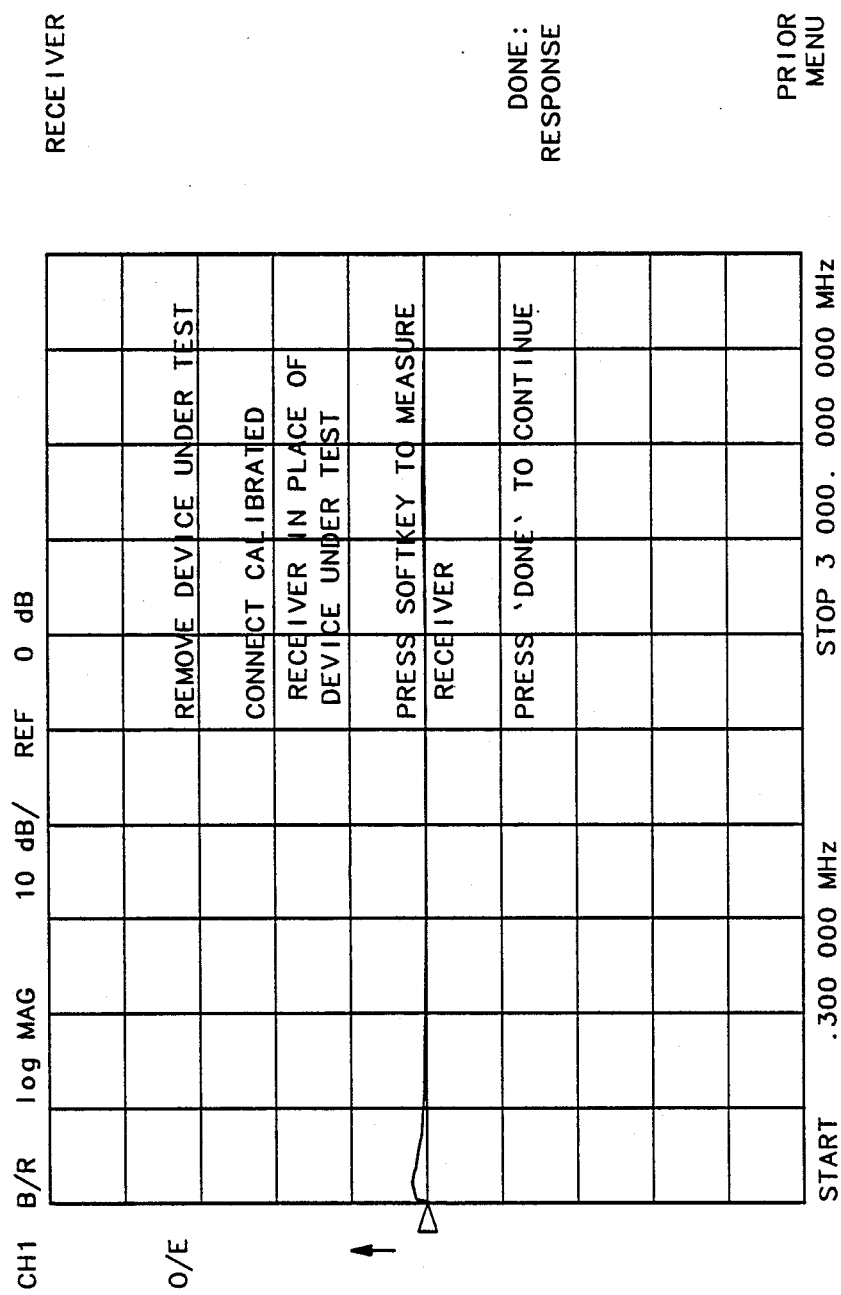
Figure 2L:
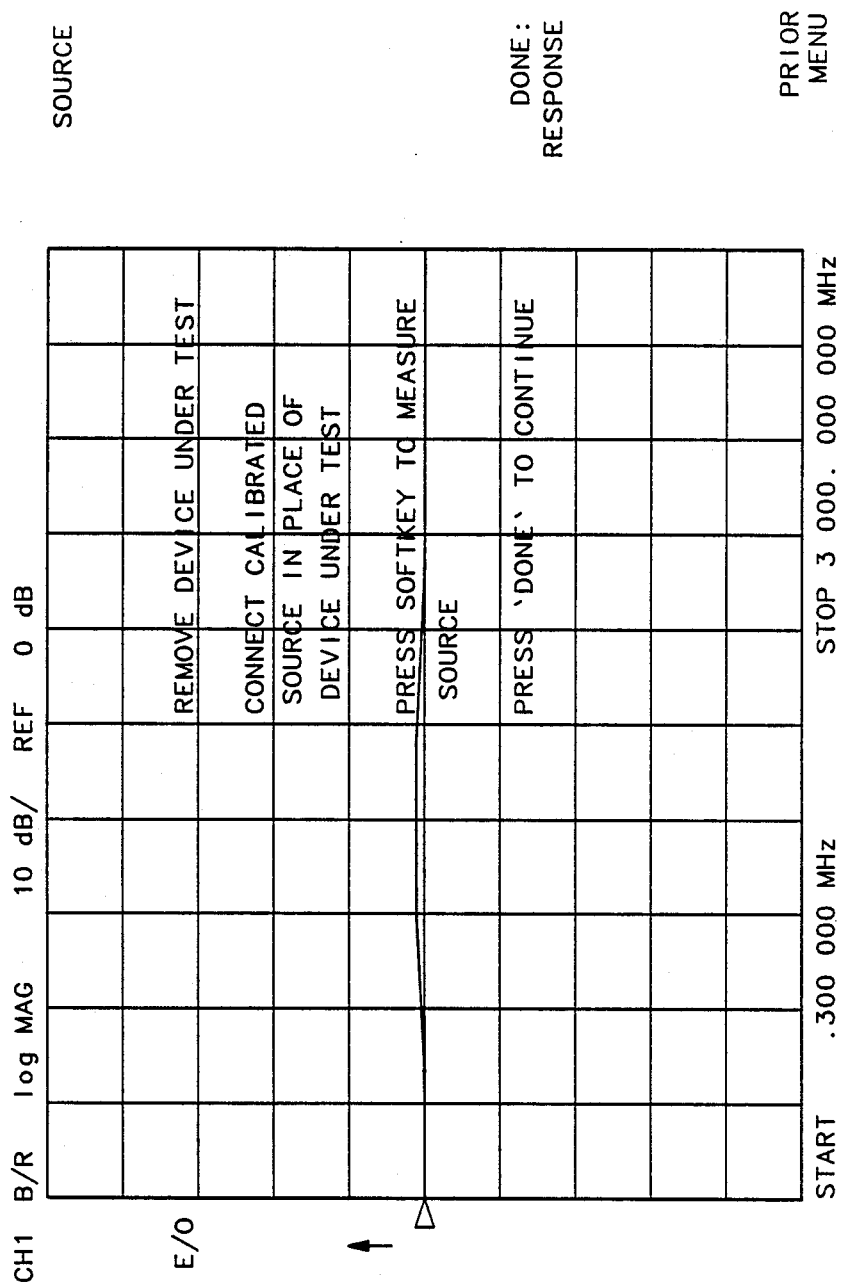
Figure 2N:
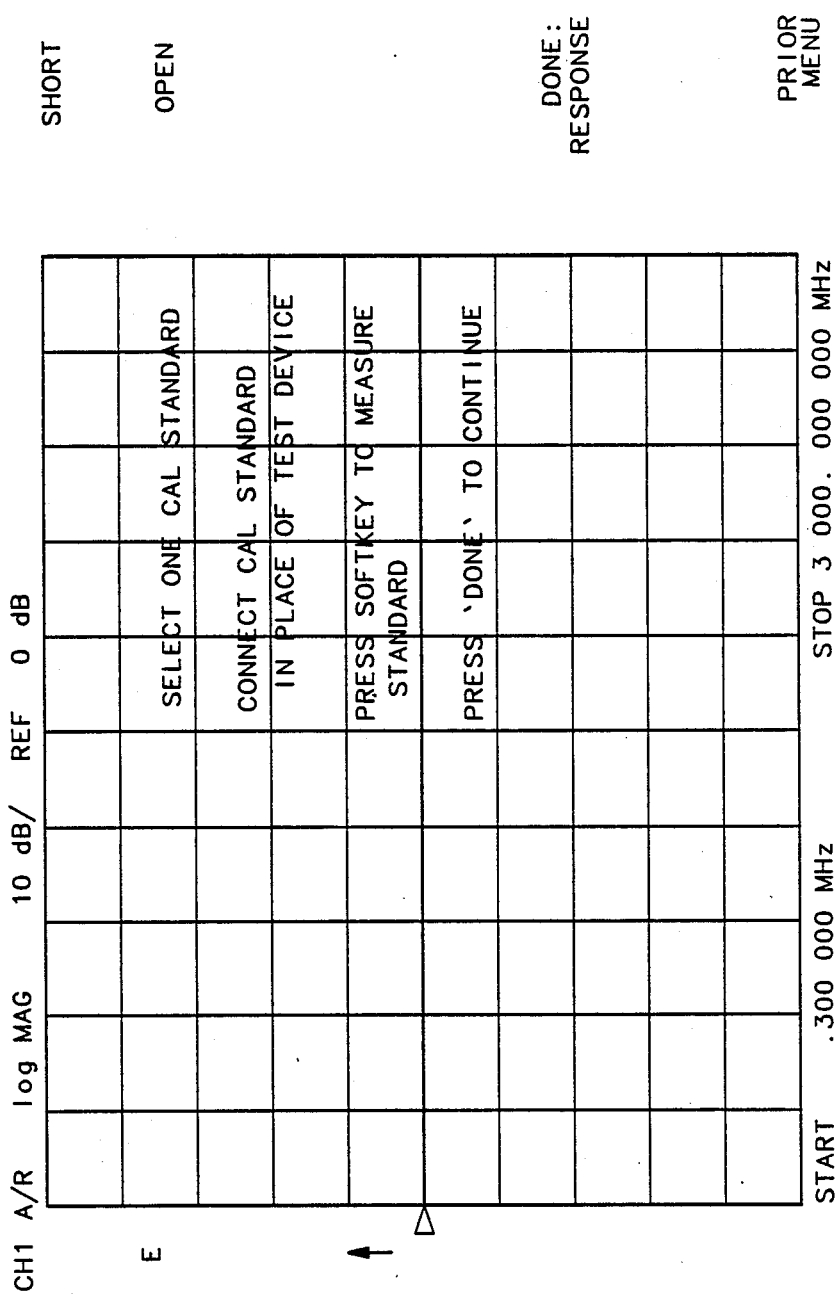
Figure 200:
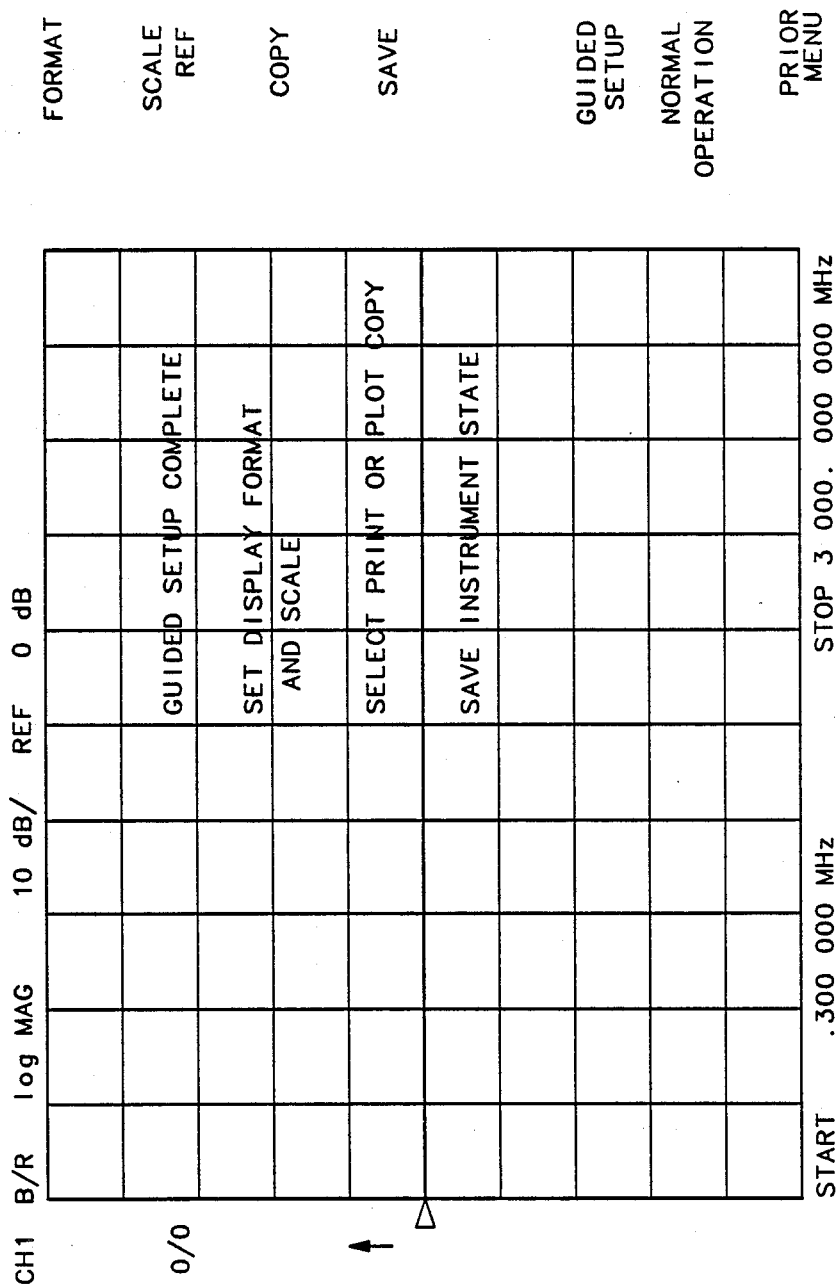
Figure 2R:
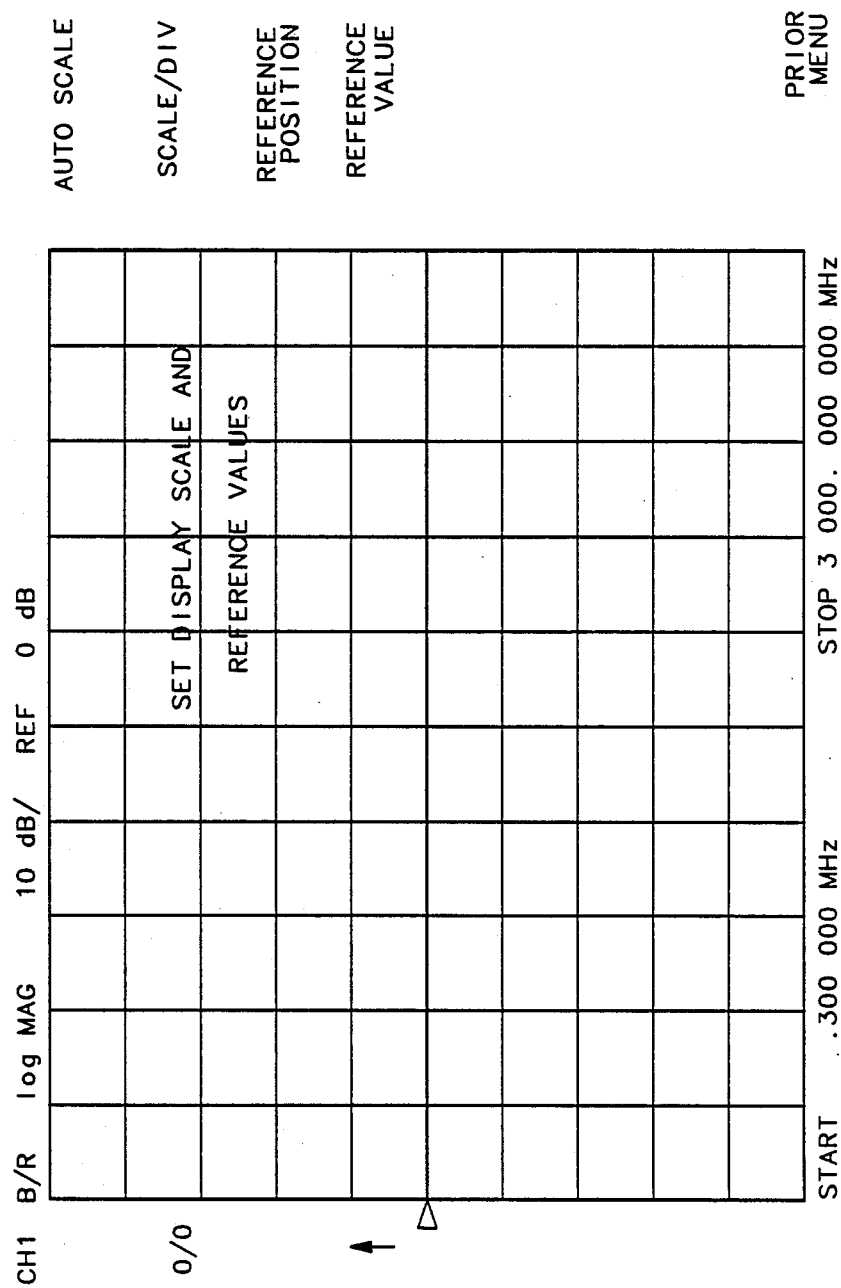
Figure 25S:
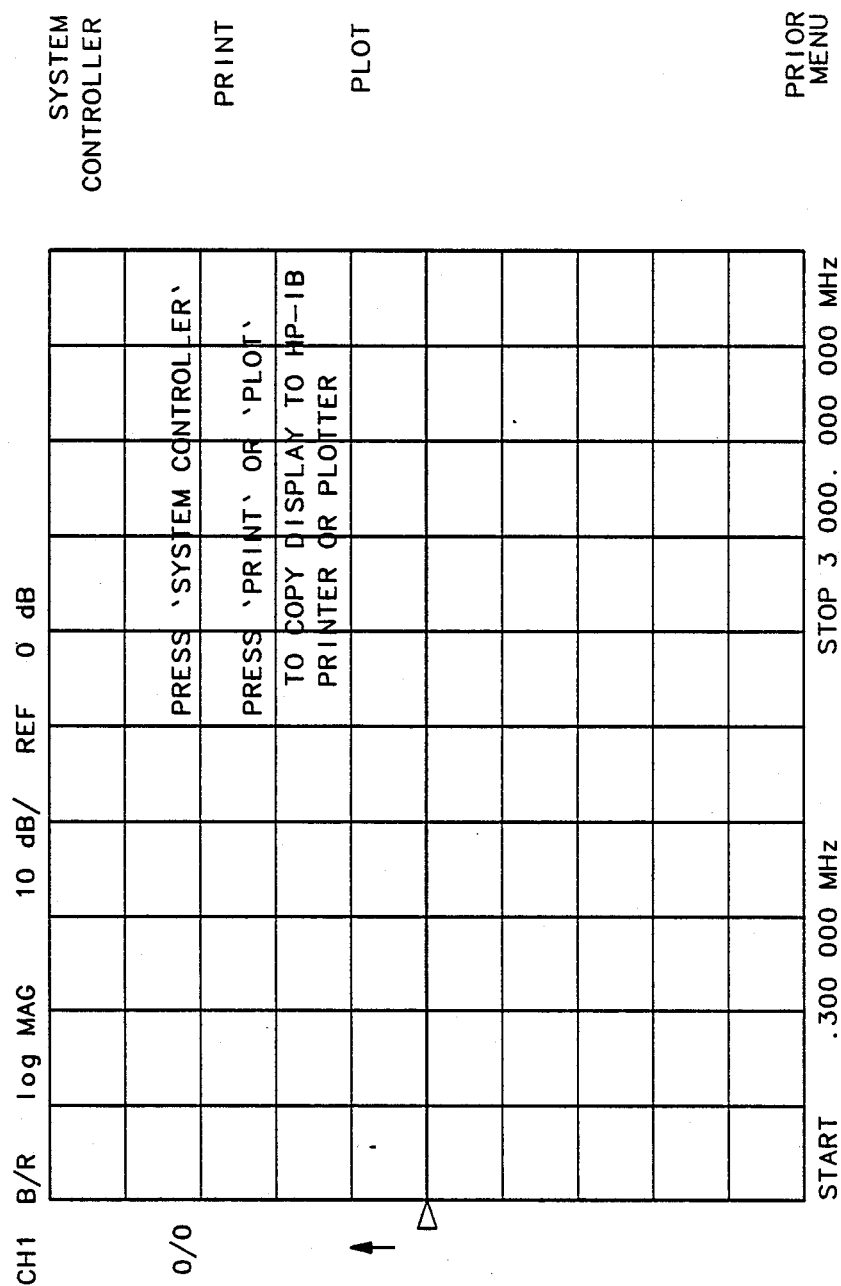
Figure 2T:
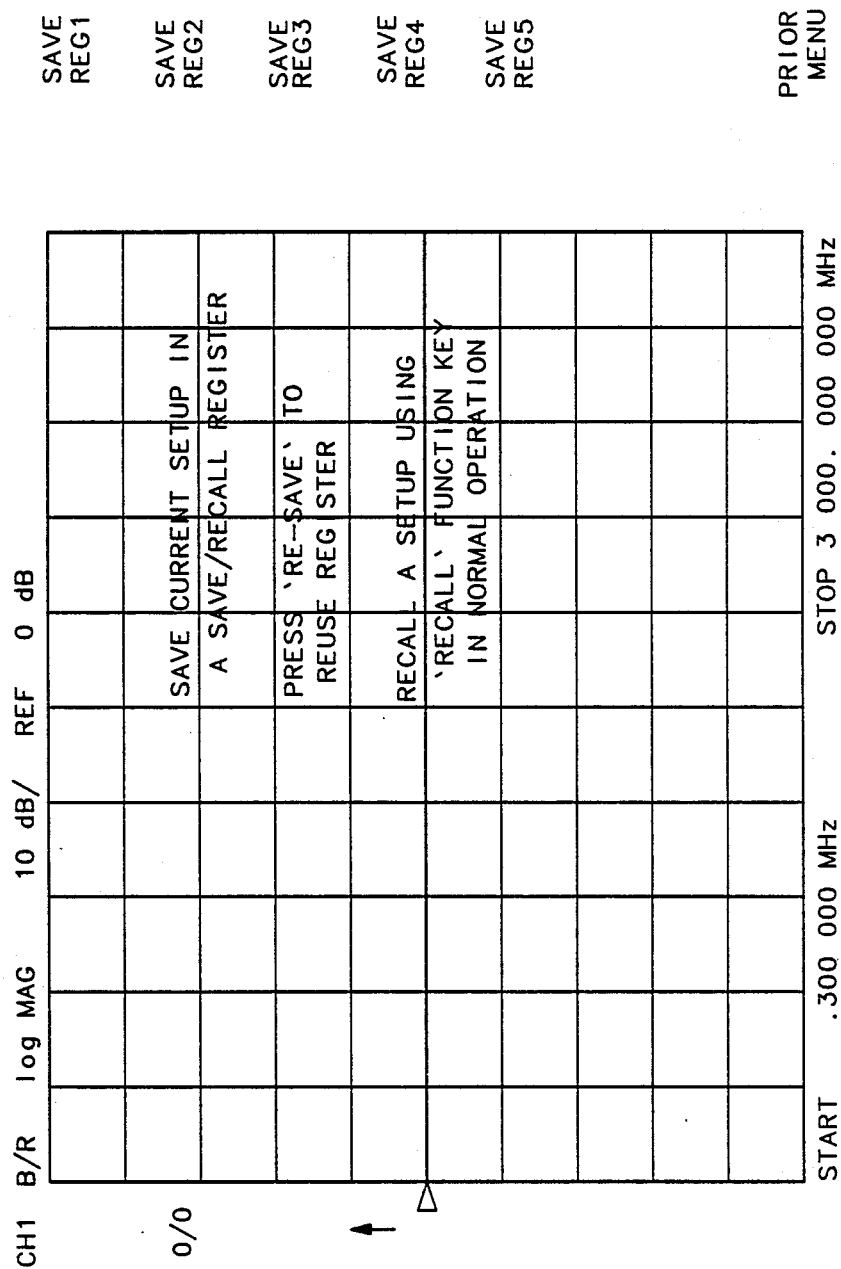

Representative screens displayed at the beginning of the select calibration type and define standards subroutine appear in FIGS. 2W–2II. The analyzer 12 then sweeps and takes data using no calibration, as indicated by the numeral 604 shown in FIG. 9, and displays the data trace and graticule, as indicated by the numeral 606.

Figure 9:
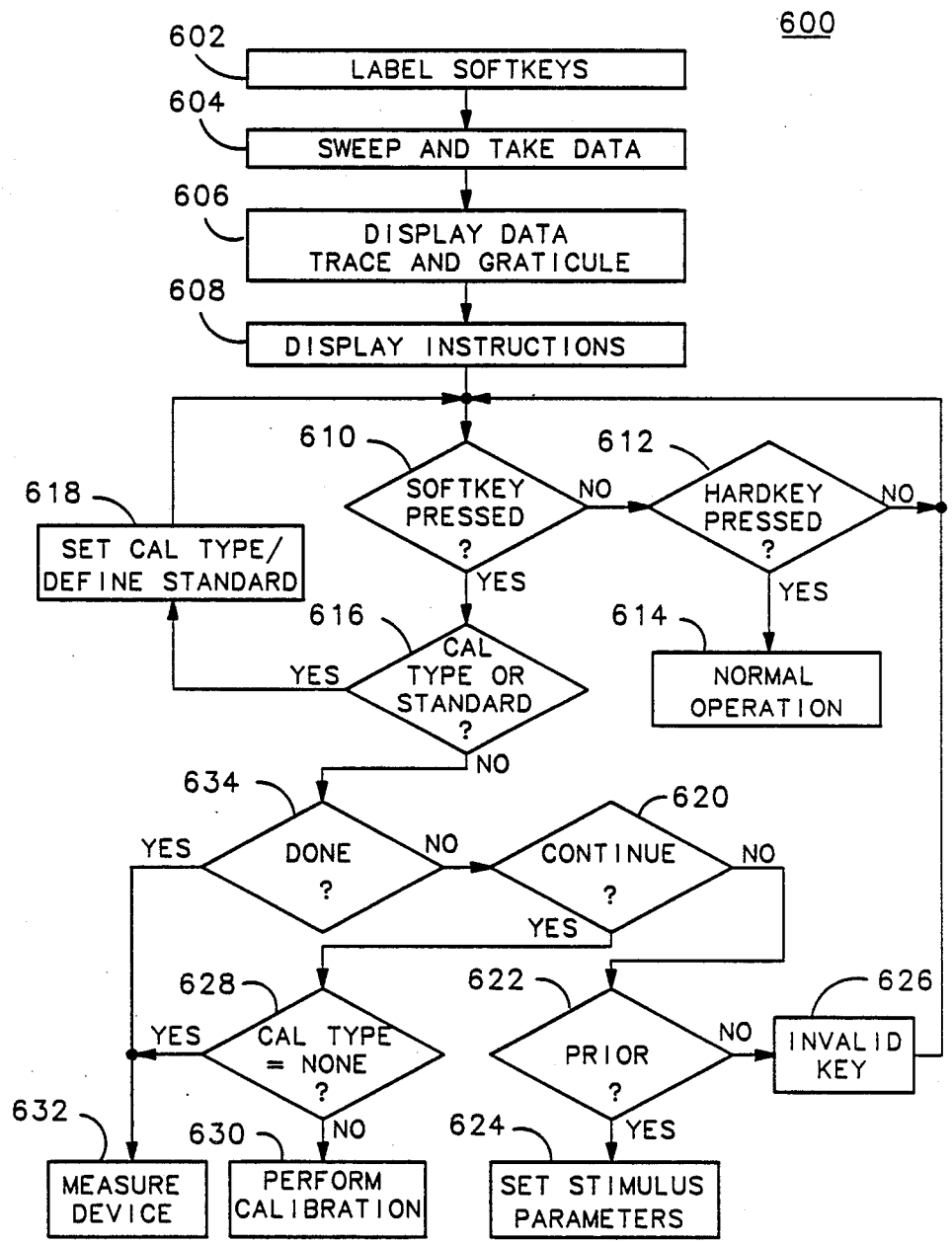
FIG. 9 is a detailed flowchart for selecting a calibration type and defining standards in accordance with the flow diagram shown in FIG. 3.

The analyzer 12 additionally displays textual instructions to the user, as indicated by the numeral 608 shown in FIG. 9. For example, the instructions in connection with selecting the calibration type and defining standards can include "SELECT CALIBRATION TYPE," as shown in FIGS. 2W and 2X. Other instructions displayed in connection with directing the user to select and define calibration standards appear in Figs. 2W–2II.

The analyzer 12 determines whether or not a softkey is depressed, as indicated by the numeral 610, or, alternatively, whether or not a hardkey is depressed, as indicated by the numeral 612. On the one hand, if the user has depressed a hardkey, the analyzer 12 exits the guided setup mode and proceeds to normal operation, as indicated by the numeral 614.

On the other hand, if the user has depressed a softkey, as indicated by the step 610, the analyzer 12 determines whether or not the user has depressed one of the calibration selection or definition softkeys, as indicated by the numeral 616. If so, the analyzer 12 sets the calibration type or standard definition, as indicated by the numeral 618.

If the user has depressed a softkey other than one of the calibration selection or definition softkeys, the analyzer 12 determines whether or not to continue with the guided setup mode, as indicated by the numeral 620. On the one hand, if the user depresses the "DONE: RESPONSE" softkey, as indicated by the numeral 634, the analyzer 12 calls a measure device subroutine and proceeds directly to test the DUT, as indicated by the numeral 632. On the other hand, if the user depresses the "CONTINUE" softkey, as indicated by the step 620, the analyzer 12 determines whether or not the user has depressed the "CAL TYPE: NONE" softkey, as indicated by the numeral 628. On the one hand, if a specified calibration has been requested, as indicated by the numeral 616, the analyzer 12 calls a perform calibration subroutine, as indicated by the numeral 630. On the other hand, if no calibration has been requested, the analyzer 12 calls the measure device subroutine and proceeds directly to test the DUT, as indicated by the numeral 632.

If, however, the user has depressed the "PRIOR MENU" softkey, as indicated by the numeral 622, the analyzer 12 recalls the set stimulus parameters subroutine 500, as indicated by the numeral 624. Any softkey actuation other than a specifically mentioned one causes the analyzer 12 to inform the user that an invalid key has been depressed, as indicated by the numeral 626, and await depression of an allowed softkey.

If the user has requested that a calibration be performed, when the user depresses the "CONTINUE" softkey, as indicated by the step 620 shown in FIG. 9, the analyzer 12 calls the perform calibration subroutine 700, as indicated by the numeral 700 shown in FIG. 3. The perform calibration subroutine 700 is shown in more detail in FIG. 10.

The perform calibration subroutine 700 causes the analyzer 12 to display a new softkey menu and labels the softkeys, as indicated by the numeral 702. In the case of a transmission type measurement, these softkey labels can be "THRU" plus "DONE: RESPONSE," as shown in FIG. 2JJ; "RECEIVER" plus "DONE: RESPONSE," as shown in FIG. 2KK; or "SOURCE" plus "DONE: RESPONSE," as shown in FIG. 2LL. In the case of a reflection type measurement, the softkey labels can be "REFLECTOR" and "FRESNEL" plus "DONE: RESPONSE," as shown in FIG. 2MM; or "SHORT" and "OPEN" plus "DONE: RESPONSE," as shown in FIG. 2NN. The softkey menu for an E/E device is similar to the one for the O/O device shown in FIG. 2JJ. The particular softkey menu that is displayed is automatically determined by the analyzer 12 based on the selected type of measurement, as well as the type of DUT. The softkey menus for a transmission type measurement and a reflection type measurement for each type of device, except an E/E device, are shown in FIGS. 2JJ-2NN, the softkey menu for an E/E device being similar to the one for an O/O device. A "PRIOR MENU" softkey is also preferably displayed in order to enable the user to return to the previous menu for the select calibration type and define standards subroutine 600.

Representative screens displayed at the beginning of the perform calibration subroutine appear in FIGS. 2JJ-2NN. The analyzer 12 then sweeps and takes data using calibration values, if any, as indicated by the numeral 704 shown in FIG. 10, and displays the data trace and graticule, as indicated by the numeral 706.

Figure 10:
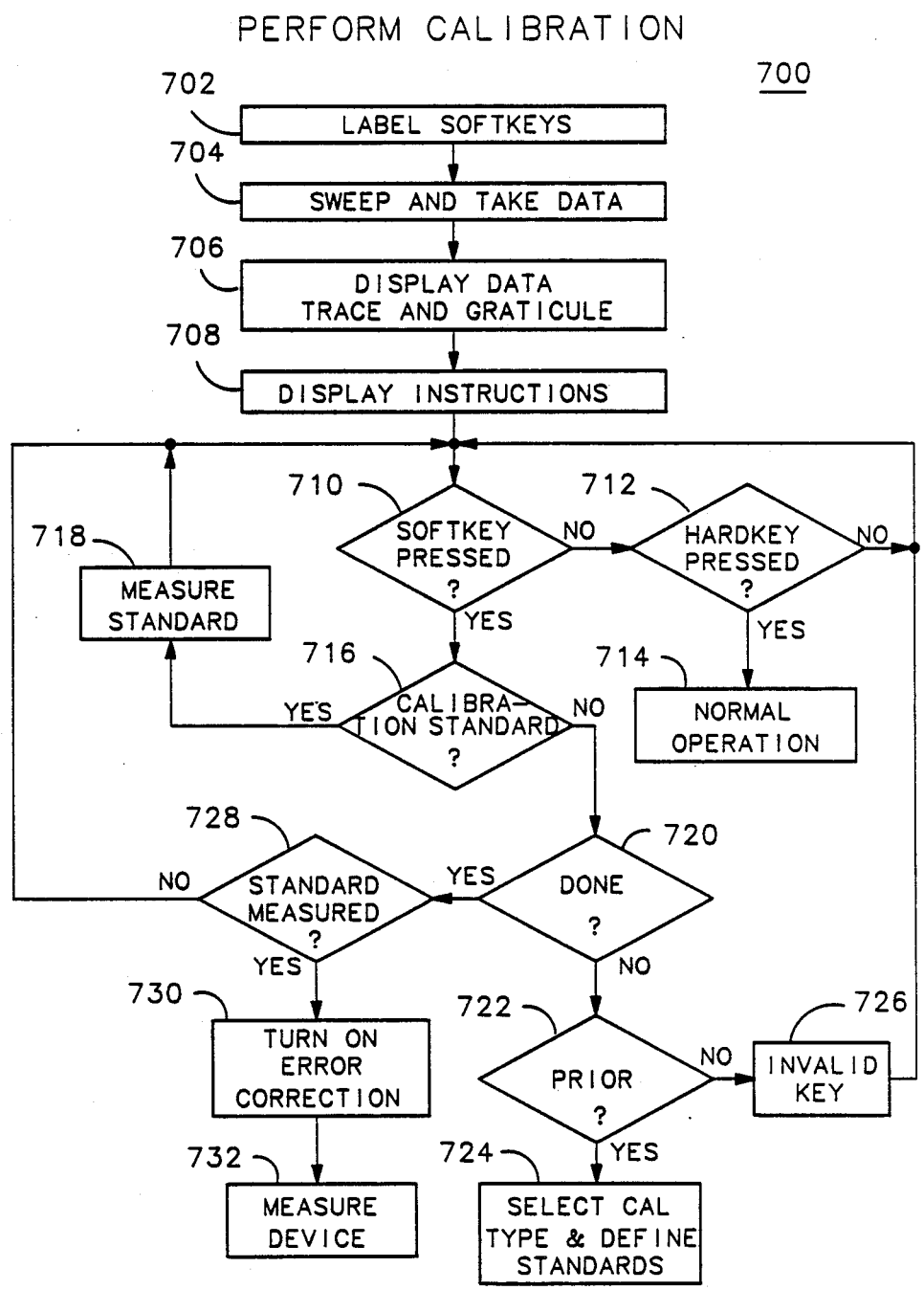
FIG. 10 is a detailed flowchart for performing a calibration in accordance with the flow diagram shown in FIG. 3.

The analyzer 12 additionally displays textual instructions to the user, as indicated by the numeral 708 shown in FIG. 10. The various instructions in connection with performing a calibration include "REMOVE DEVICE UNDER TEST," as shown in FIGS. 2JJ-2LL. Other instructions displayed in connection with directing the user to perform a calibration appear in FIGS. 2JJ-2NN.

The analyzer 12 determines whether or not a softkey is depressed, as indicated by the numeral 710, or, alternatively, whether or not a hardkey is depressed, as indicated by the numeral 712. On the one hand, if the user has depressed a hardkey, the analyzer 12 exits the guided setup mode and proceeds to normal operation, as indicated by the numeral 714.

On the other hand, if the user has selected a calibration standard, as indicated by the numeral 716, the analyzer 12 measures the standard, as indicated by the numeral 718. If the user has not selected a calibration standard, as indicated by the step 716, the analyzer 12 determines whether or not the user has depressed the "DONE: RESPONSE" softkey, as indicated by the numeral 720.

If the user has depressed the "DONE: RESPONSE" softkey, as indicated by the step 720, the analyzer 12 determines whether or not the calibration standard has been measured, as indicated by the numeral 728. If not, the analyzer 12 awaits measurement of the calibration standard, as indicated by the step 718. If the calibration standard has been measured, as indicated by the step 728, the analyzer accesses error correction values based on the measured calibration standard, as indicated by the numeral 730, and calls a measure device subroutine, as indicated by the numeral 732.

On the other hand, if the user has depressed the "PRIOR MENU" softkey, as indicated by the numeral 722, the analyzer 12 recalls the select calibration type and define standards subroutine 600, as indicated by the numeral 724. Any softkey actuation other than a specifically mentioned one causes the analyzer 12 to inform the user that an invalid key has been depressed, as indicated by the numeral 726, and await depression of an allowed softkey.

If the user has decided to directly measure the DUT, as indicated by the step 632 shown in FIG. 9, or after a calibration has been performed, as indicated by the step 718 shown in FIG. 10, the analyzer 12 calls the measure device subroutine 800, as indicated by the numeral 800 shown in FIG. 3. The measure device subroutine 800 is shown in more detail in FIG. 11.

The measure device subroutine 800 causes the analyzer 12 to display softkey menu and labels the softkeys, as indicated by the numeral 802. These softkey labels can be "FORMAT," "SCALE REF," "COPY," and "SAVE," as shown in FIGS. 2OO and 2PP. Depression of the "FORMAT," "SCALE REF," "COPY," or "SAVE" softkey shown in FIGS. 2OO and 2PP provides an additional softkey menu, as shown in FIGS. 2QQ-2TT. The particular softkey menu that is displayed is automatically determined by the analyzer Depression of the "FORMAT" softkey shown in FIGS. 2OO and 2PP provides an additional softkey menu, as shown in FIG. 2QQ, which enables the user to tailor the data display based on selection of a desired format. Depression of the "SCALE REF" softkey shown in Figs. 2OO and 2PP. provides an additional softkey menu, as shown in FIG. 2RR, which enables the user to tailor the data display based on selection of a scale setting. Depression of the "COPY" softkey shown in FIGS. 2OO and 2PP provides an additional softkey menu, as shown in FIG. 2SS, which enables the user to print and plot data. Finally, depression of the "SAVE" softkey shown in Figs. 2OO and 2PP provides an additional softkey menu, as shown in FIG. 2TT, which enables the user to save setup parameters in a file resident in the memory of the analyzer 12. "GUIDED SETUP," "NORMAL OPERATION," and "PRIOR MENU" softkeys are also preferably displayed in order to enable the user to recall the select measurement type subroutine 100, exit the guided setup mode and return to normal operation, or return to the previous menu for the select calibration type and define standards subroutine 600, respectively.

Representative screens displayed at the beginning of the measure device subroutine appear in FIGS. 2OO and 2PP. The analyzer 12 then sweeps and takes data using calibration values, if any, as indicated by the numeral 804 shown in FIG. 11, and displays the data trace and graticule, indicated by the numeral 806

Figure 11:
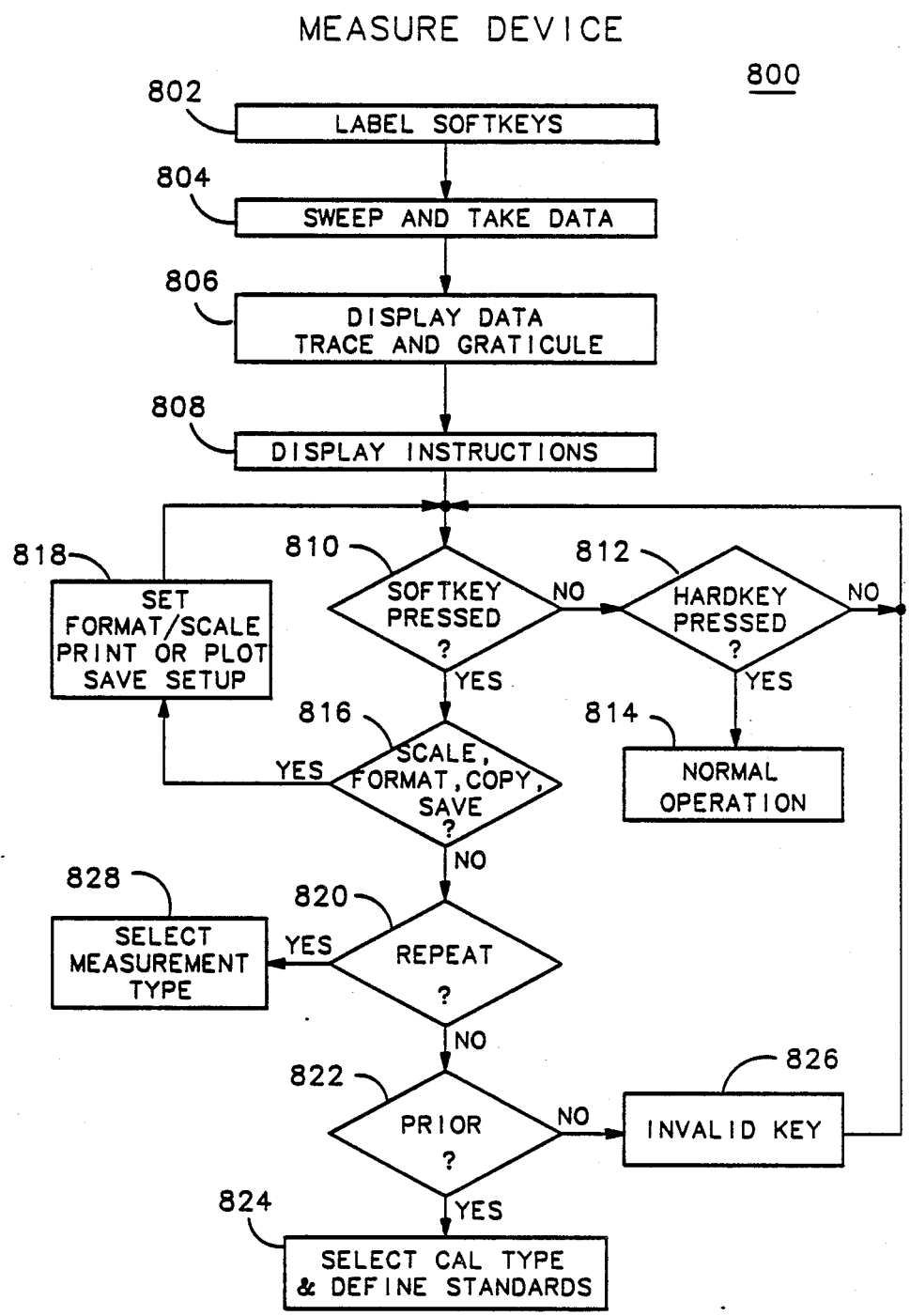
FIG. 11 is a detailed flowchart for measuring a device under test (DUT) in accordance with the flow diagram shown in FIG. 3.

The analyzer 12 additionally displays textual instructions to the user, as indicated by the numeral 808 shown in FIG. 11. For example, the instructions in connection with measuring the DUT can be "RECONNECT TEST DEVICE," as shown in FIG. 2PP. Other instructions displayed in connection with directing the user to perform a measurement of the characteristics of the DUT appear in FIGS. 2OO and 2PP.

The analyzer 12 determines whether or not a softkey is depressed, as indicated by the numeral 810, or, alternatively, whether or not a hardkey is depressed, as indicated by the numeral 812. On the one hand, if the user has depressed a hardkey, the analyzer 12 exits the guided setup mode and proceeds to normal operation, as indicated by the numeral 814.

On the other hand, if the user has depressed a formatting, scaling, copying, or saving softkey, as indicated by the step 816, the analyzer 12 sets the appropriate data display factors or data handling and output functions, as indicated by the numeral 818. The analyzer 12 next determines whether or not the user has depressed the "GUIDED SETUP" softkey, as indicated by the numeral 820.

If the user depresses the "GUIDED SETUP" softkey, as indicated by the step 820, the analyzer 12 calls the select measurement type subroutine 100, as indicated by the numeral 828. On the other hand, if the user depresses the "PRIOR MENU" softkey, as indicated by the numeral 822, the analyzer 12 recalls the select calibration type and define standards subroutine 600, as indicated by the numeral 824. Any softkey actuation other than a specifically mentioned one causes the analyzer 12 to inform the user that an invalid key has been depressed, as indicated by the numeral 826, and await depression of an allowed softkey.

The foregoing description is offered primarily for purposes of illustration. It will be readily apparent to those skilled in the art that numerous modifications and variations not mentioned above can still be made without departing from the spirit and scope of the invention as claimed below.

What is claimed is:

1. A method for guiding a user during initiation of a measurement on a device by a signal measurement system, comprising the steps of:
    providing a device physically connectable to the signal measurement system; and
    providing signal measurement system guided assistance to a user of the signal measurement system for at least one measurement, including instructions to the user for selecting the at least one measurement and instructing the user how to physically connect the device to the signal measurement system for performing the selected measurement.

2. The method of claim 1, further comprising the steps of providing a menu of selectable measurements, responding to a given menu selection by the user, and prompting the user with a set of displayed textural instructions and pictorial diagrams via a user interface to step the user through setup and measurement processes.

3. The method of claim 2, further comprising the step of displaying softkey menus, instructional text displays, and pictorial block diagram displays to guide the user on a cathode ray tube incorporated in signal processing means included in the signal measurement system.

4. The method of claim 1 wherein a signal processing means included in the signal measurement system incorporates firmware to guide and aid the user in physically connecting the device to the signal measurement system for the selected measurement, and leading the user through setup and measurement processes.

5. The method of claim 1, further comprising the step of providing the user of the signal measurement system with a menu for selecting calibration measurement for the device.

6. The method of claim 1, further comprising the step of providing the user of the signal measurement system with a menu for selecting a type of device to be measured.

7. The method of claim 1 wherein the signal measurement system is a lightwave component measurement system for characterizing performance of fiber optic systems and associated components.

8. The method of claim 1, further comprising the steps of:
    providing means actuable by the user for selecting normal operation of the signal measurement system and, alternatively, for selecting guided assistance to the user for performing a measurement; and
    activating the signal measurement system guided assistance in response to user selection of guided assistance.

9. The method of claim 1, further comprising the step of providing signal measurement system guided assistance for setting stimulus parameters for the measurement dependent upon the selected measurement to be performed.

10. The method of claim 1, further comprising the steps of:
    providing a menu of a plurality of selectable measurements;
    responding to selection by the user of a measurement for displaying how to physically connect the device only for the selected measurement;
    displaying available calibration standards applicable only to the selected measurement;
    responding to selection by the user of a calibration standard and physical connection of a calibration device for preforming a calibration to provide error correction factors; and
    performing a measurement on a device substituted for the calibration device, the measurement incorporating the error correction factors.

11. In a method of operation of a signal measurement system, the improvement comprising the additional steps of:
    providing at least one device physically connectable to the signal measurement system; and
    displaying sequential user instructions and diagrams to facilitate proper configuration of physical connections for calibration of the signal measurement system, as well as physical connections for measurements of the characteristics of the device.

12. A signal measurement system incorporating guidance of a user during initiation of a measurement on a device physically connectable to the signal measurement system, comprising:
    means for providing signal measurement system guided assistance to the user of the signal measurement system for at least one measurement, including instructions to the user for selecting the at least one measurement and instructing the user how to physically connect the device to the signal measurement system for performing the selected measurement.

13. The signal measurement system of claim 12, further comprising means for selecting a measurement type.

14. The signal measurement system of claim 12, further comprising means for selecting a device type.

15. The signal measurement system of claim 12, further comprising means for displaying a measurement configuration.

16. The signal measurement system of claim 12, further comprising means for setting sweep start and stop values.

17. The signal measurement system of claim 12, further comprising means for setting stimulus parameters.

18. The signal measurement system of claim 12, further comprising means for selecting a calibration type and defining standards.

19. The signal measurement system of claim 12, further comprising means for performing a calibration.

20. The signal measurement system of claim 12, further comprising means for measurement a device under test.

* * * * *

UNITED STATES PATENT AND TRADEMARK OFFICE
CERTIFICATE OF CORRECTION

PATENT NO.  : 4,875,859
DATED       : October 24, 1989
INVENTOR(S) : Roger W. Wong; et al.

It is certified that error appears in the above-identified patent and that said Letters Patent is hereby corrected as shown below:

Column 1, Line 12, "is i the" should read--is in the--;

Column 1, Line 19, "than ha been" should read--than has been--;

Column 100, Line 7, "measurement" should read--measuring--.

Signed and Sealed this

Twenty-eighth Day of January, 1992

Attest:

HARRY F. MANBECK, JR.

*Attesting Officer*  *Commissioner of Patents and Trademarks*